US011101804B2

(12) United States Patent
Weber et al.

(10) Patent No.: US 11,101,804 B2
(45) Date of Patent: Aug. 24, 2021

(54) FAST MEMORY FOR PROGRAMMABLE DEVICES

(71) Applicant: Intel Corporation, Santa Clara, CA (US)

(72) Inventors: Scott Jeremy Weber, Piedmont, CA (US); Aravind Raghavendra Dasu, Milpitas, CA (US); Mahesh A. Iyer, Fremont, CA (US); Patrick Koeberl, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/711,330

(22) Filed: Dec. 11, 2019

(65) Prior Publication Data

US 2020/0119736 A1 Apr. 16, 2020

Related U.S. Application Data

(60) Provisional application No. 62/795,470, filed on Jan. 22, 2019.

(51) Int. Cl.
*H03K 19/17756* (2020.01)
*H01L 25/065* (2006.01)
*H01L 25/00* (2006.01)

(52) U.S. Cl.
CPC ... *H03K 19/17756* (2013.01); *H01L 25/0652* (2013.01); *H01L 25/50* (2013.01); *H01L 2225/06513* (2013.01); *H01L 2225/06527* (2013.01)

(58) Field of Classification Search
None
See application file for complete search history.

(56) References Cited

U.S. PATENT DOCUMENTS

| 7,957,208 | B1 * | 6/2011 | Tang | G11C 29/028 365/189.2 |
| 8,719,750 | B1 * | 5/2014 | Balzli, Jr. | G06F 30/394 716/113 |
| 9,576,095 | B1 * | 2/2017 | Hew | G06F 30/34 |
| 9,584,129 | B1 * | 2/2017 | Walstrom | H03K 19/17756 |
| 9,825,635 | B2 * | 11/2017 | Munday | G06F 8/656 |
| 2019/0042127 | A1 | 2/2019 | Weber et al. | |
| 2019/0044515 | A1 | 2/2019 | Gutala et al. | |

OTHER PUBLICATIONS

Extended European Search Report for EP 20151606.5 dated Aug. 4, 2020, 8 pages.

* cited by examiner

*Primary Examiner* — Amy Cohen Johnson
*Assistant Examiner* — James H Cho
(74) *Attorney, Agent, or Firm* — Fletcher Yoder P.C.

(57) ABSTRACT

An integrated circuit device may include a programmable fabric die having programmable logic fabric and configuration memory that may configure the programmable logic fabric. The integrated circuit device may also include a base die that may provide fabric support circuitry, including memory and/or communication interfaces as well as compute elements that may also be application-specific. The memory in the base die may be directly accessed by the programmable fabric die using a low-latency, high capacity, and high bandwidth interface.

20 Claims, 69 Drawing Sheets

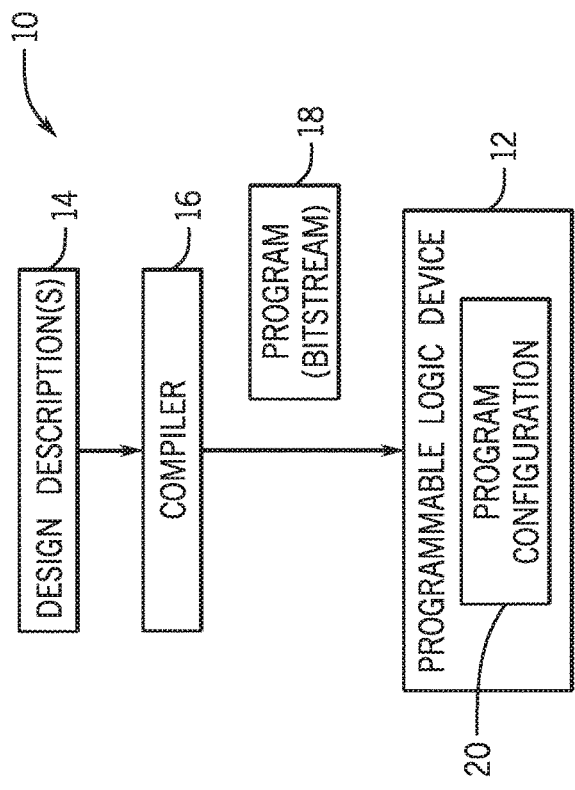
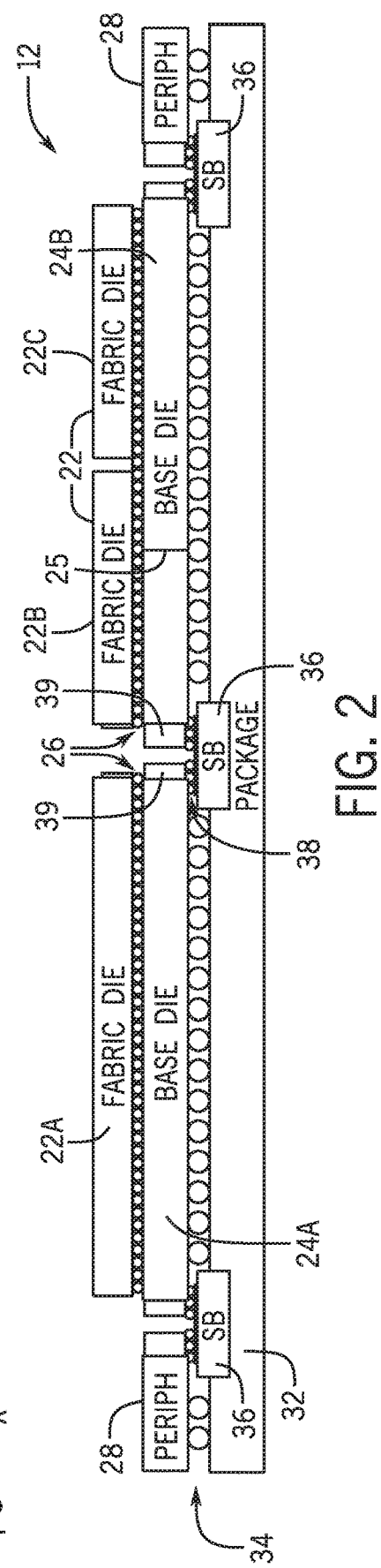
FIG. 1
FIG. 2

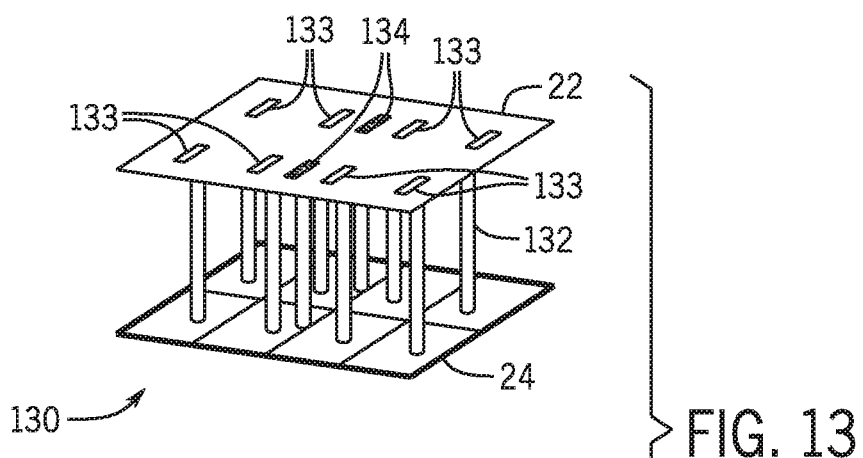
FIG. 13
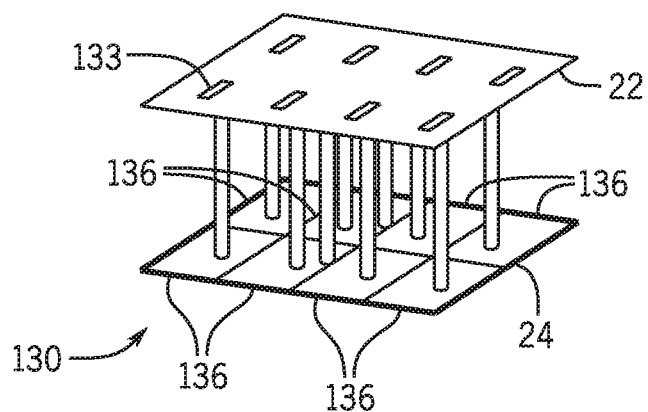
FIG. 14
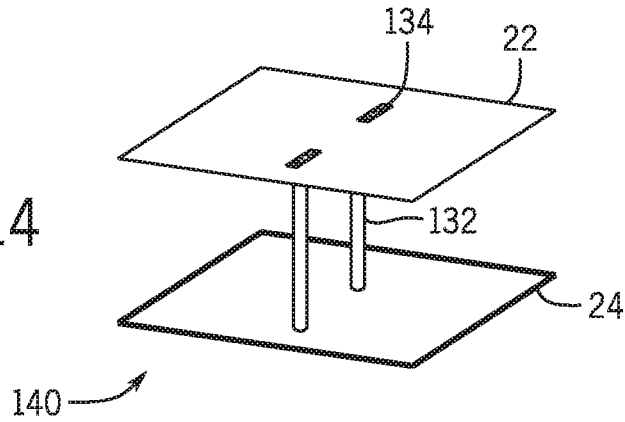
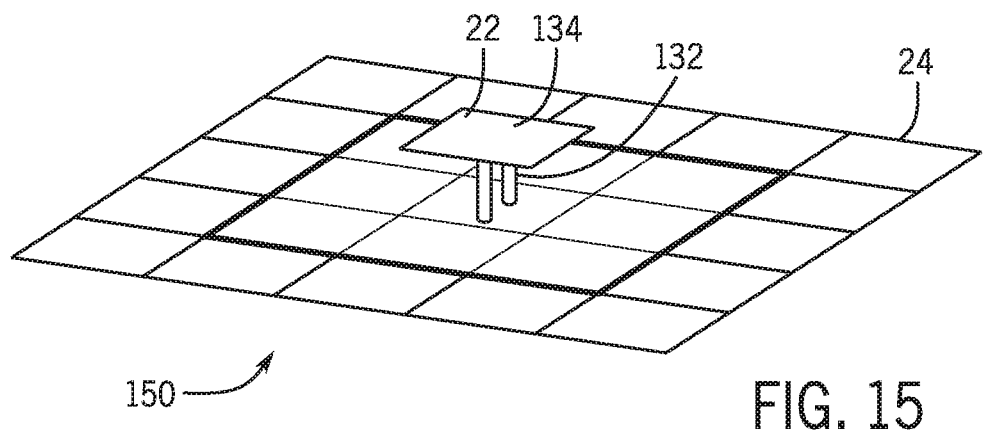
FIG. 15

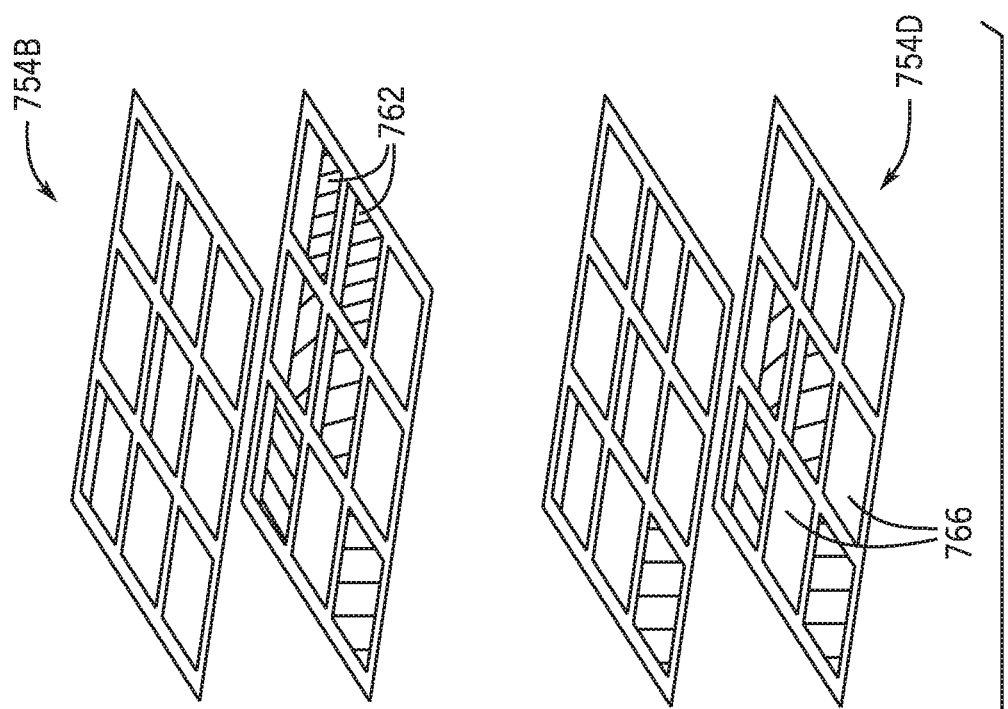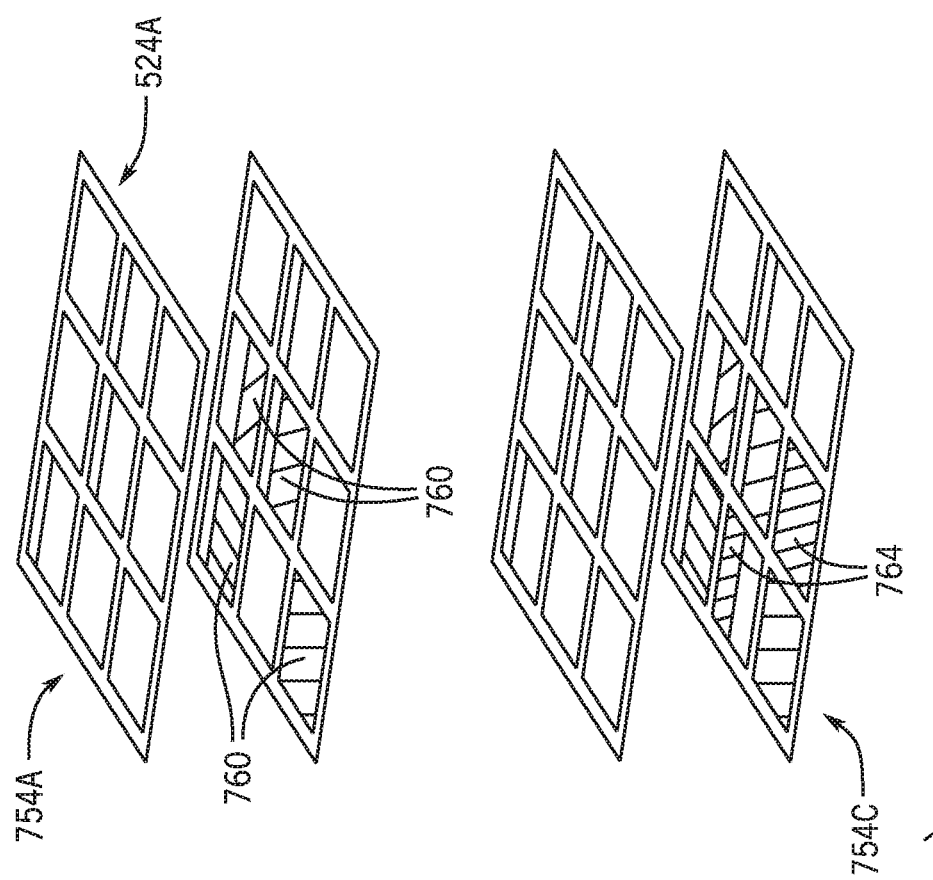
FIG. 59

US 11,101,804 B2

FAST MEMORY FOR PROGRAMMABLE DEVICES

CROSS REFERENCE TO RELATED APPLICATIONS

This application claims priority from and the benefit of U.S. Provisional Application Ser. No. 62/795,470, entitled "FAST MEMORY FOR PROGRAMMABLE DEVICES", filed Jan. 22, 2019, which is hereby incorporated by reference in its entirety for all purposes.

BACKGROUND

This disclosure relates to interfaces for transfer of data in a multi-dimensional programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. To that end, programmable logic devices may include circuitry for sending and receiving data. For example, a programmable logic device may include programmable logic elements programmed by a form of memory known as configuration random access memory (CRAM). To program a circuit design into a programmable logic device, the circuit design, which may be compiled into a bitstream, is transmitted and loaded into CRAM cells. Once programmed (e.g., with the bitstream), the programmable logic device may perform operations associated with the circuit design. Operations may, among other things, include data transmission and/or data reception. As such, programmable logic devices may perform operations (e.g., configuration operations, logic operations) that may include data exchange.

The highly flexible nature of programmable logic devices makes them an excellent fit for accelerating many computing tasks. Thus, programmable logic devices are increasingly used as accelerators for networking, storage, data center systems, communications, mobile applications, machine learning, video processing, voice recognition, image recognition, and many other highly specialized tasks, particularly those that would be too slow or inefficient in software running on a processor. As the computing tasks performed by the programmable logic devices become more complex, more flexible and faster interfaces for data exchange processes may be of benefit.

BRIEF DESCRIPTION OF THE DRAWINGS

Various aspects of this disclosure may be better understood upon reading the following detailed description and upon reference to the drawings in which:

FIG. 1 is a block diagram of a programmable logic device that is programmed with a circuit design, in accordance with an embodiment;

FIG. 2 is a block diagram of a package including the programmable logic device where a fabric die is vertically stacked with a base die and coupled through a multi-purpose parallel configuration interface, in accordance with an embodiment;

FIG. 13 is a diagram illustrating memory using a columnar alignment with a single access port being used between the fabric die and the base die of FIG. 2 for a sector, in accordance with an embodiment;

FIG. 14 is a diagram illustrating memory using a columnar alignment with a multiple access ports per sector being used between the fabric die and the base die of FIG. 2, in accordance with an embodiment;

FIG. 15 is a diagram illustrating memory using a columnar alignment with a multiple access ports of a sector being used by other sectors to communicate between the fabric die and the base die of FIG. 2, in accordance with an embodiment;

Figure 16:
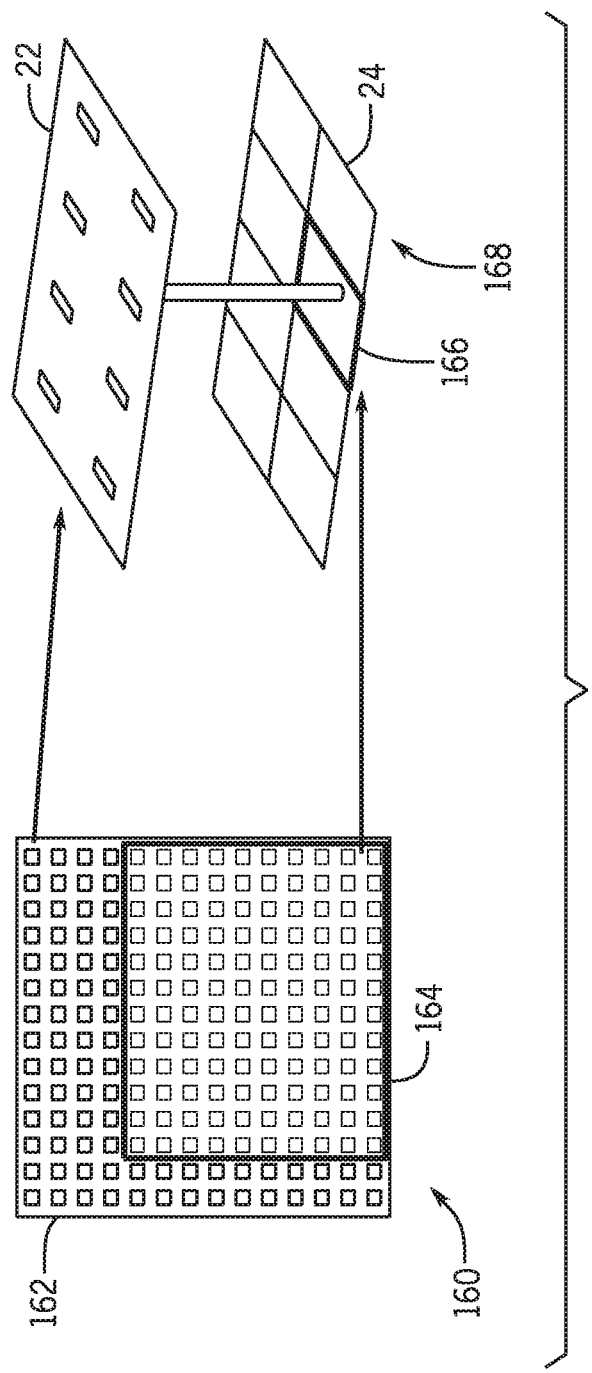
FIG. 16 is a diagram illustrating fine-grained aggregation of memory for high-capacity deterministic access latency storage for a single sector, in accordance with an embodiment.
Figure 17:
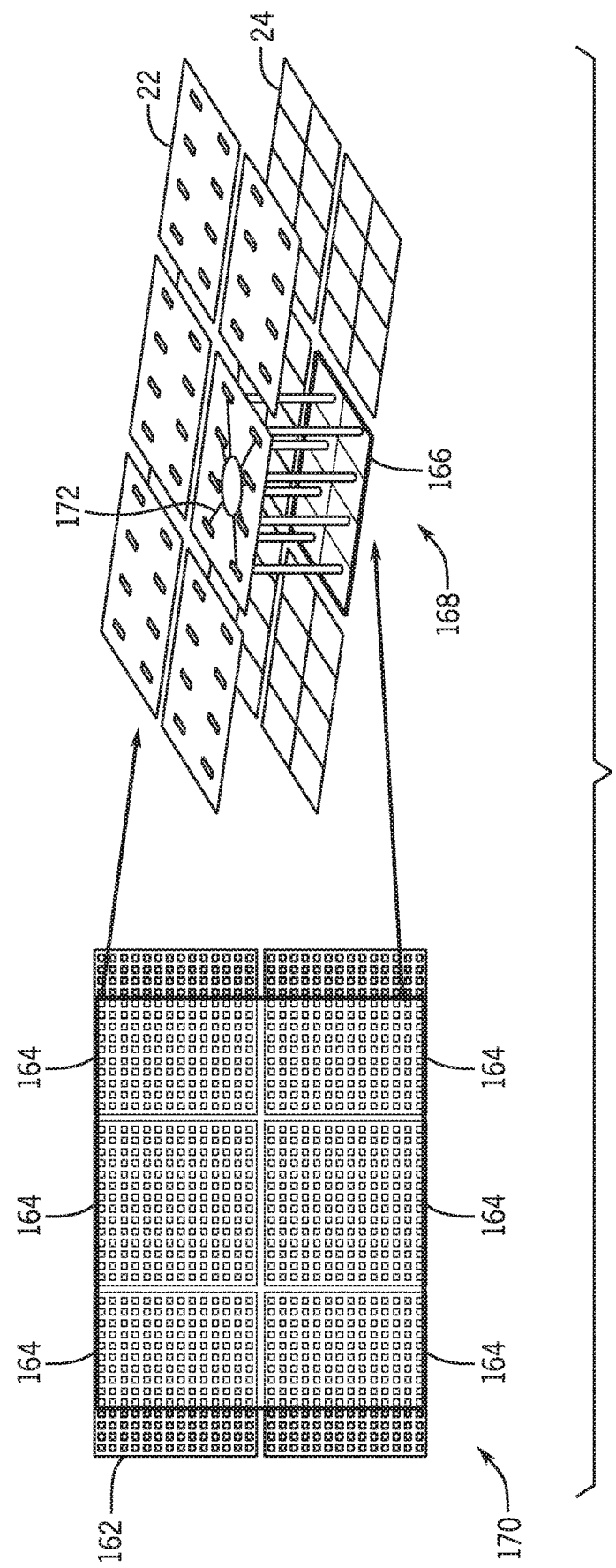
FIG. 17 is a diagram illustrating fine-grained aggregation of memory for high-capacity deterministic access latency storage for multiple sectors, in accordance with an embodiment.
Figure 20:
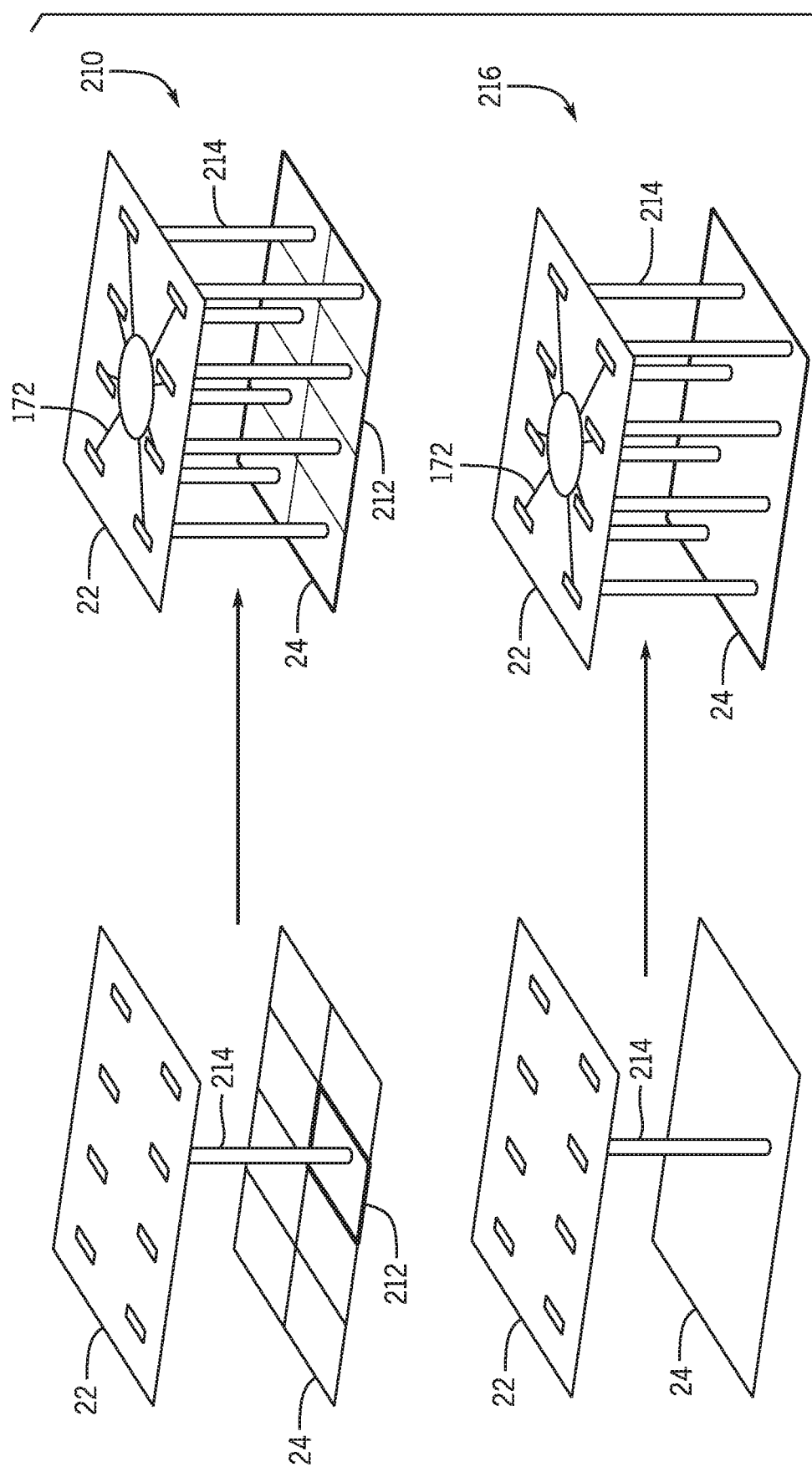
Figure 21:
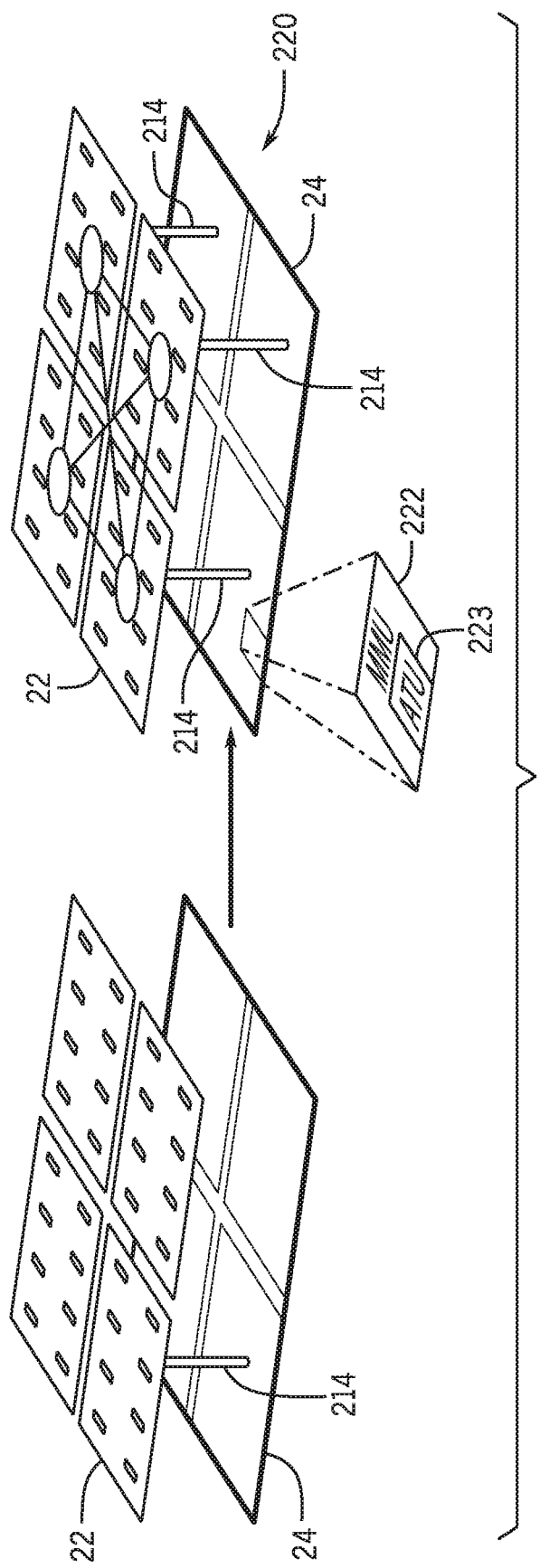
Figure 22:
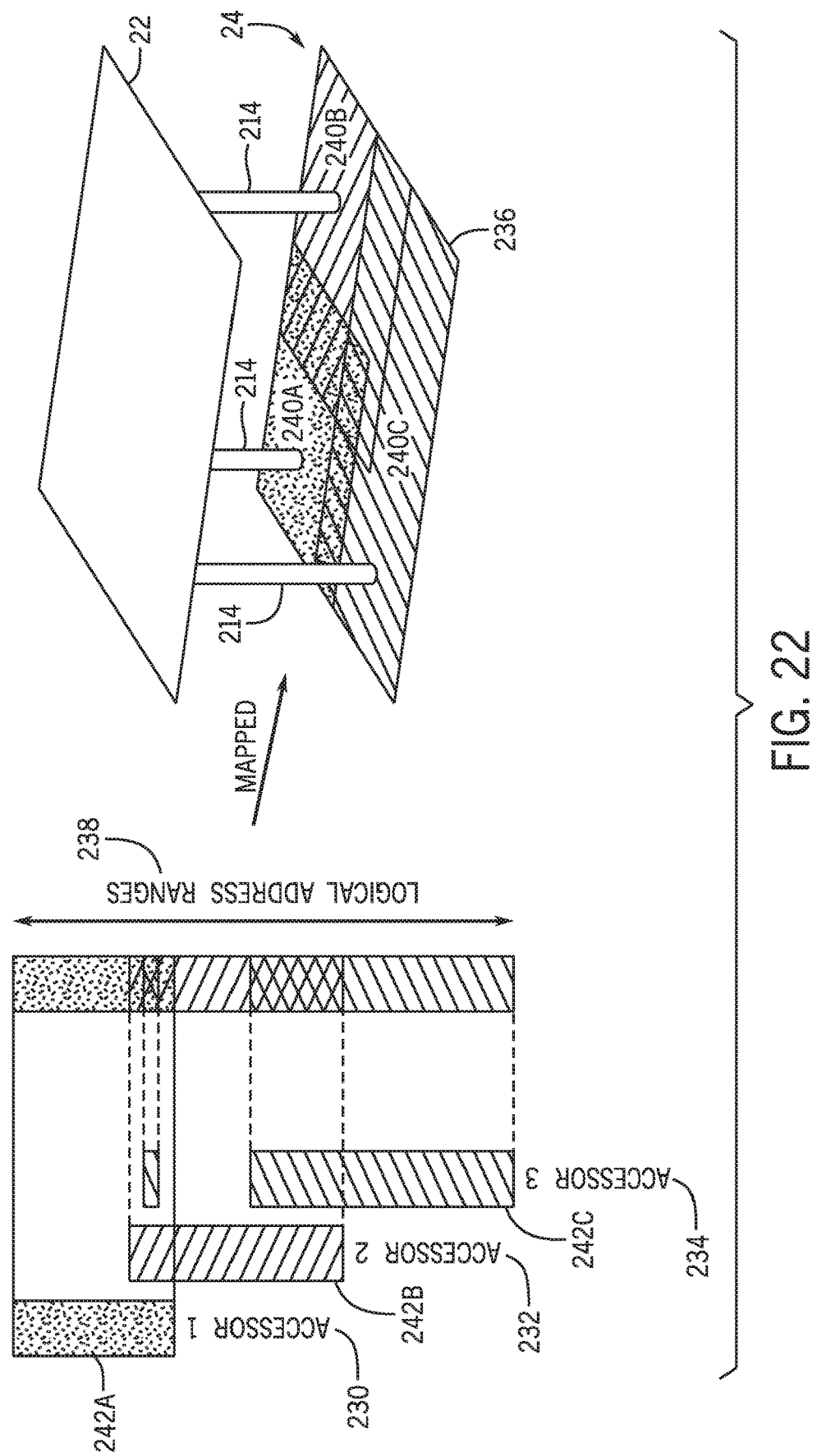
Figure 23:
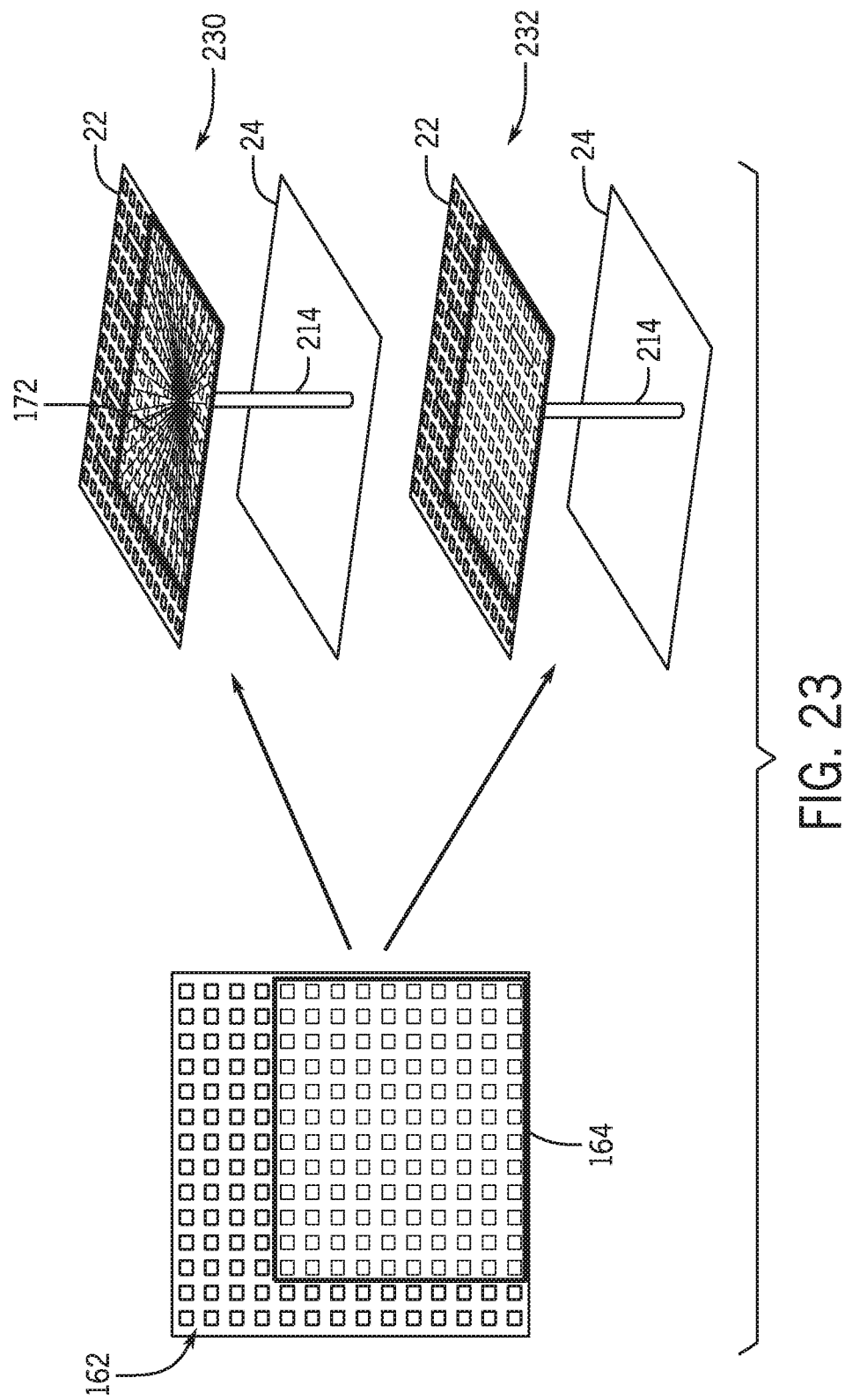
Figure 24:
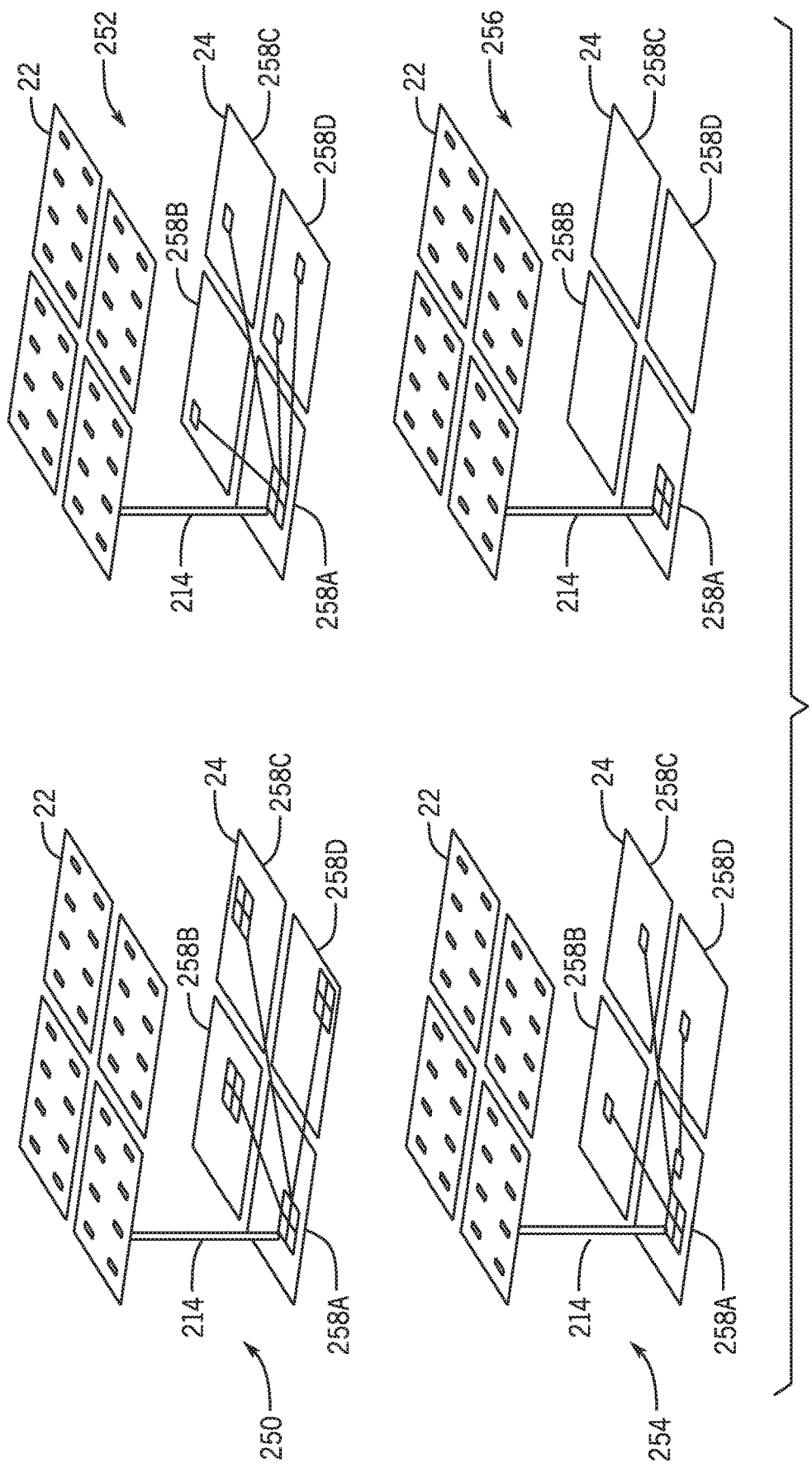
Figure 25:
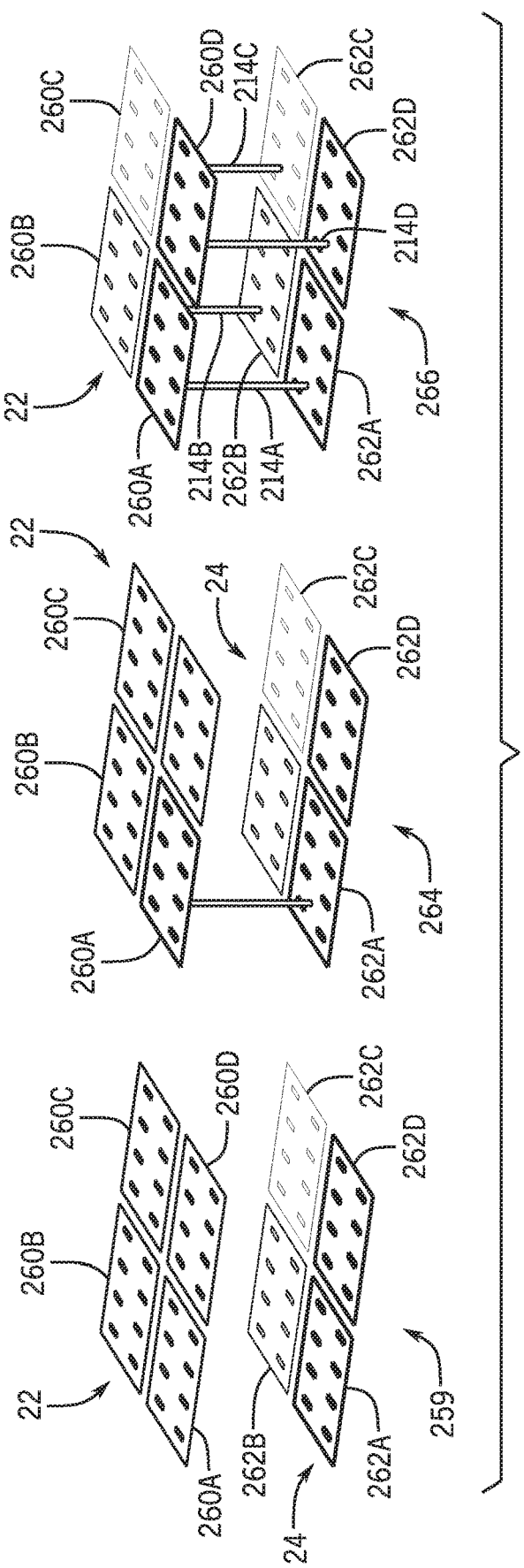
Figure 26:
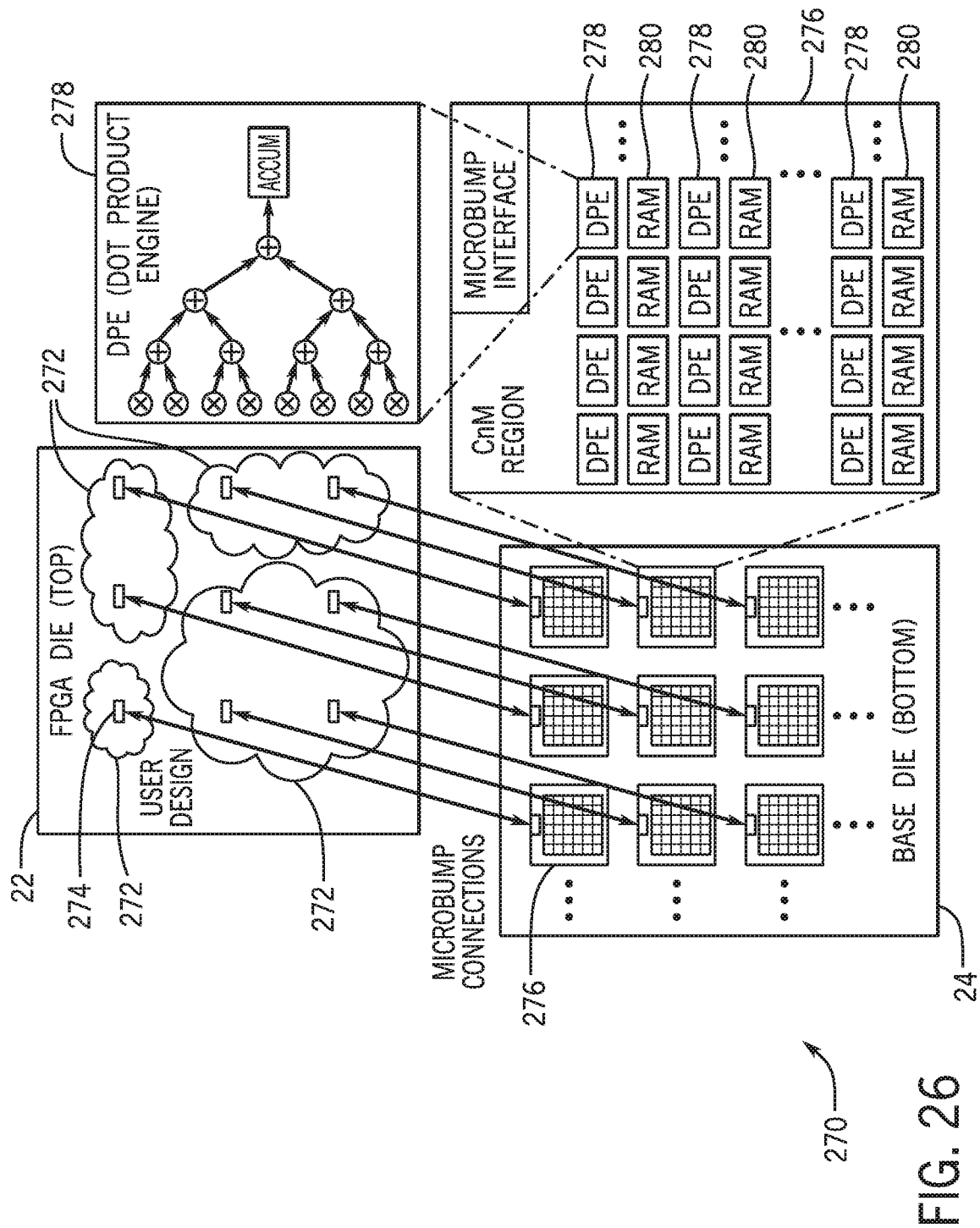
Figure 27:
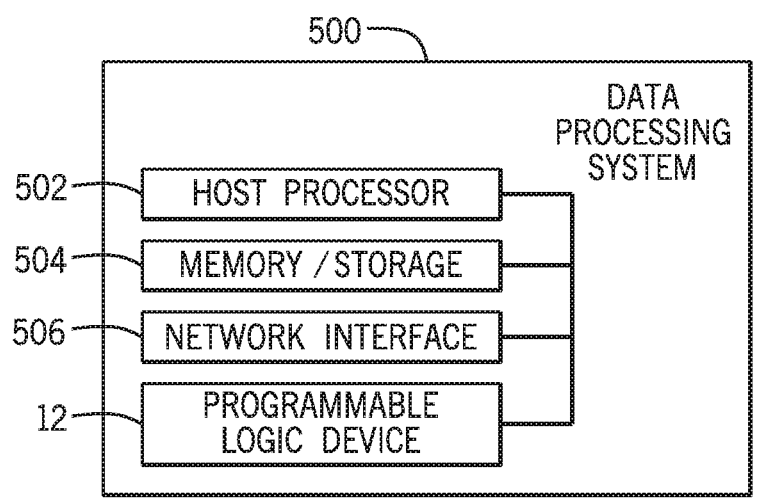
Figure 28:
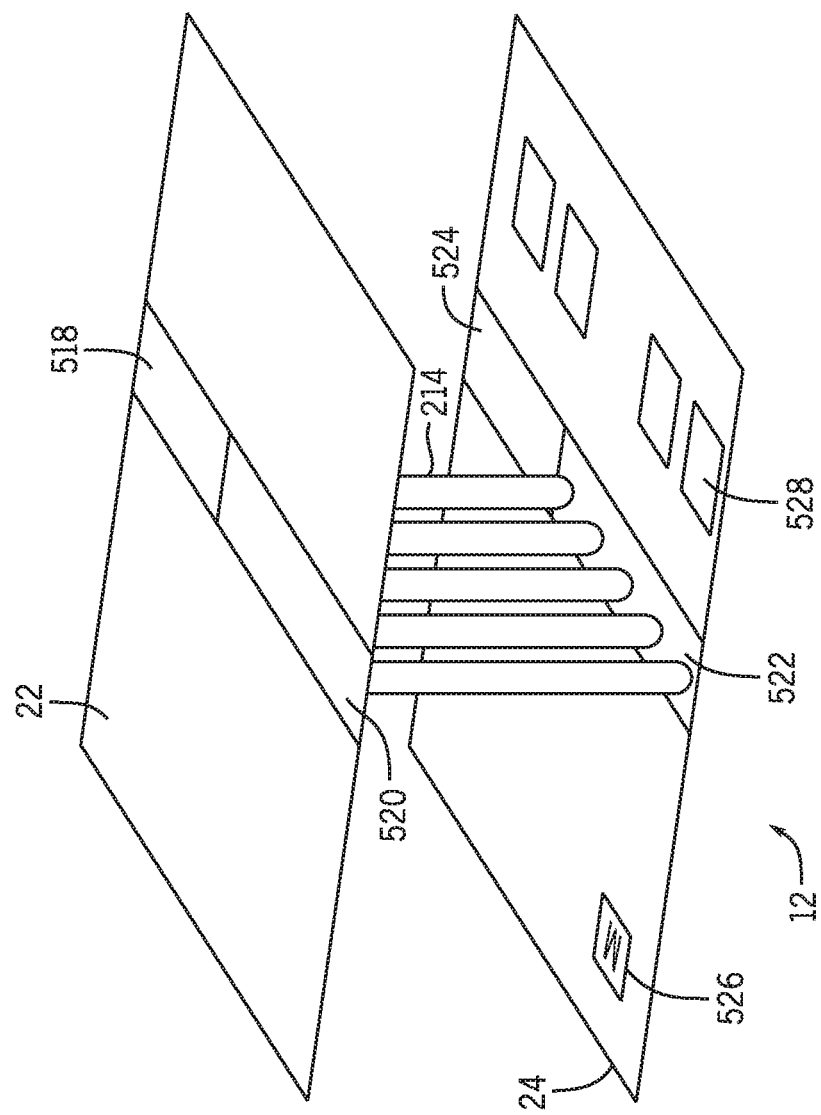
Figure 29:
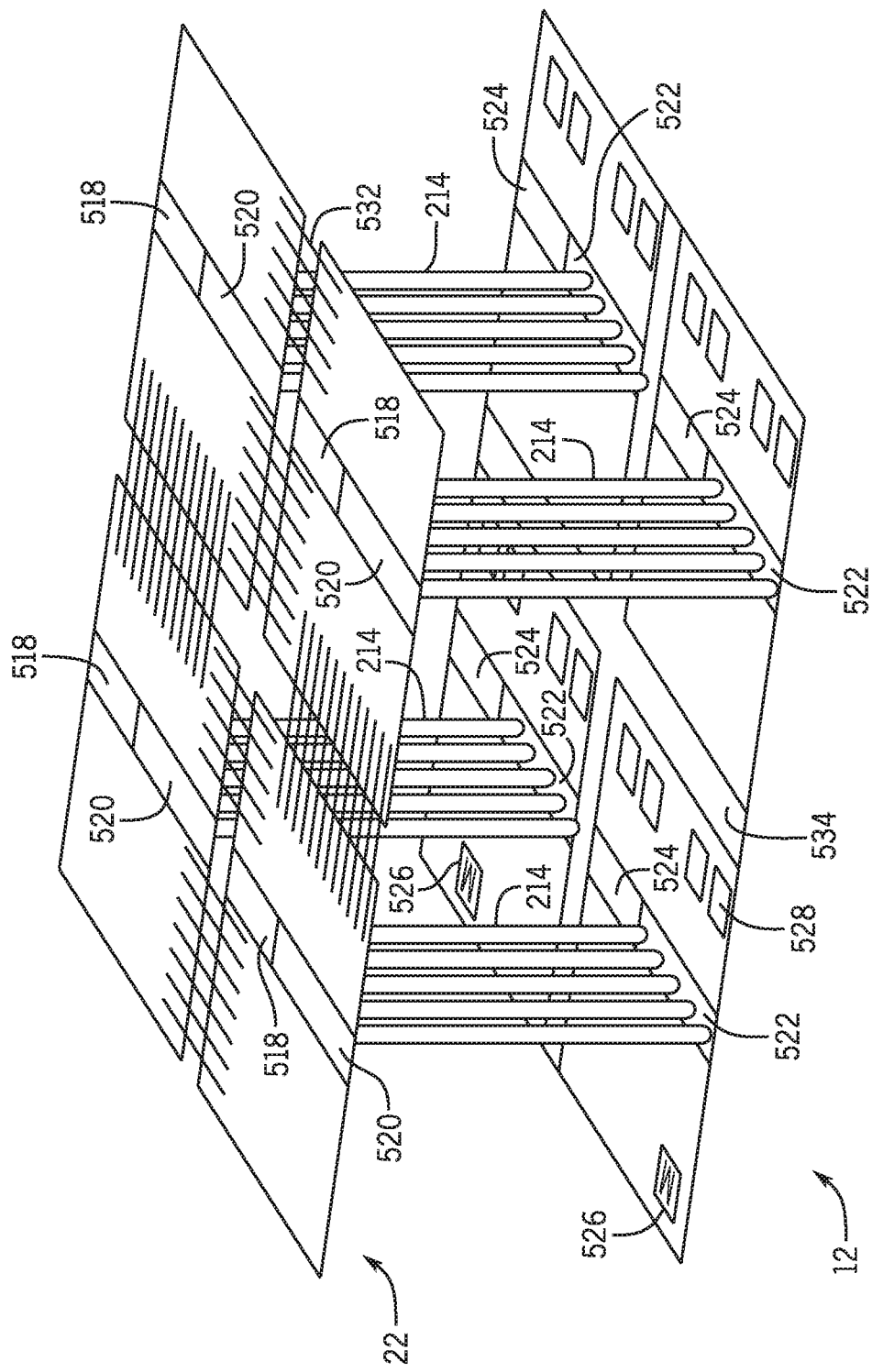
Figure 30:
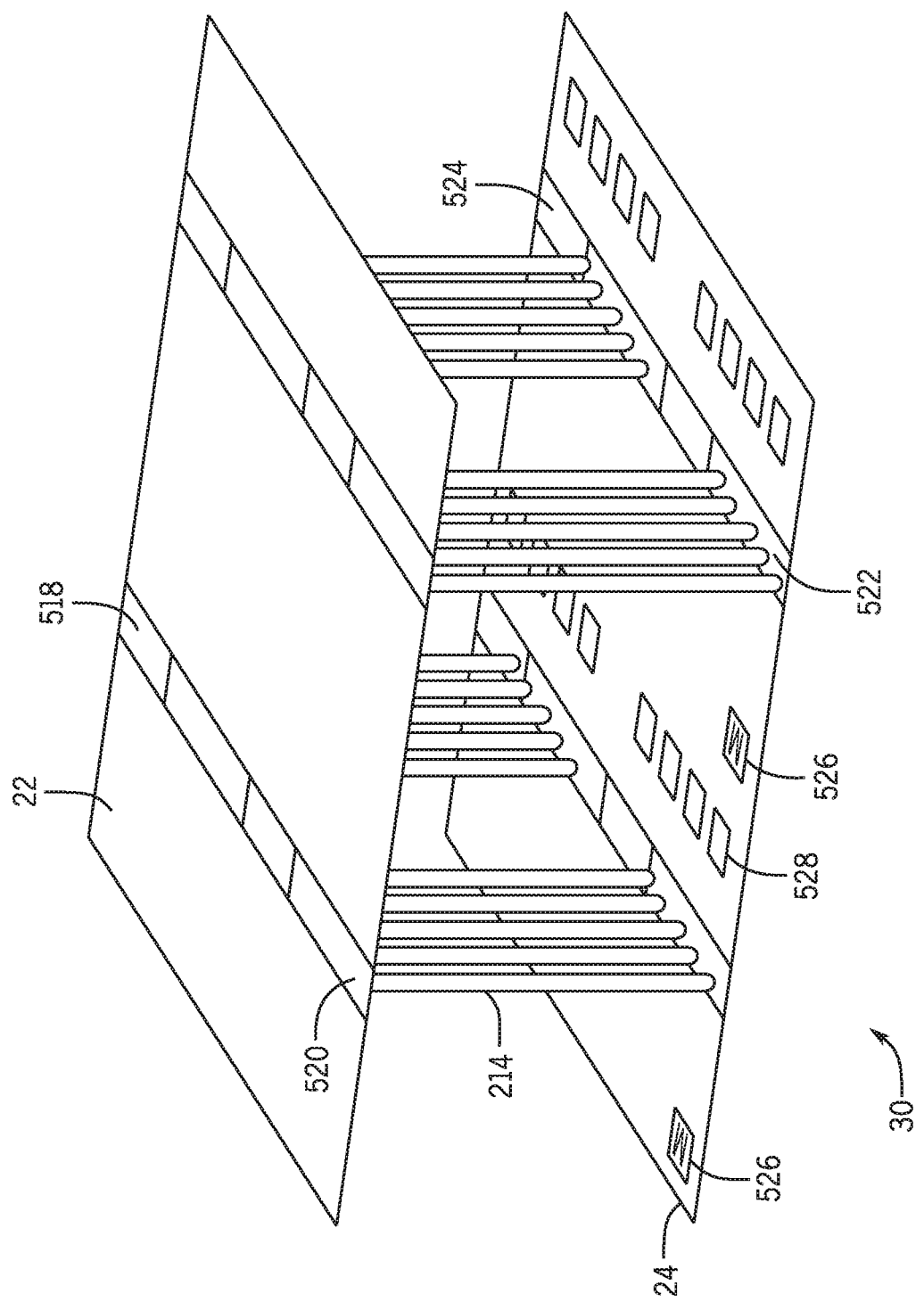
Figure 31:
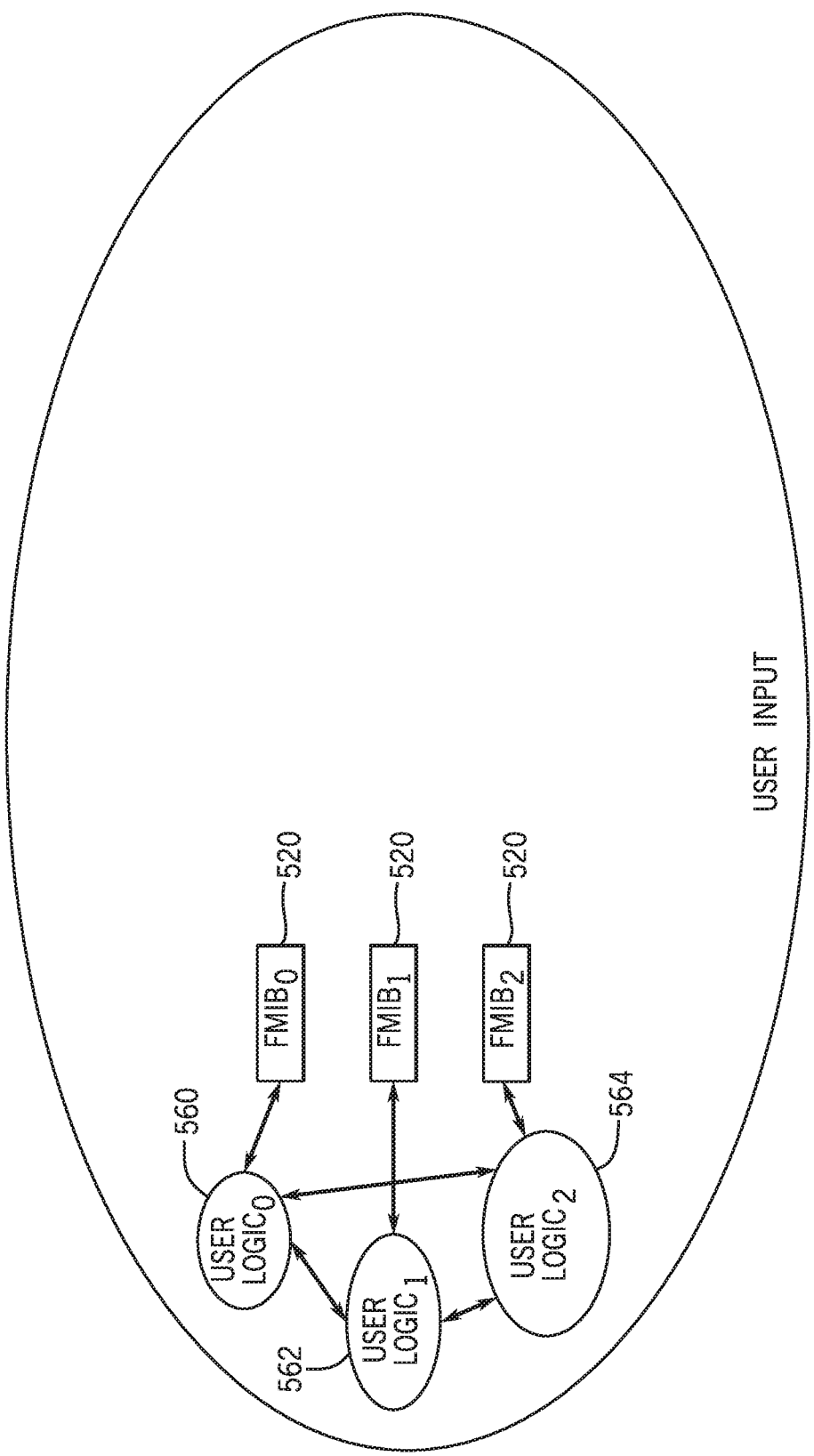
Figure 32:
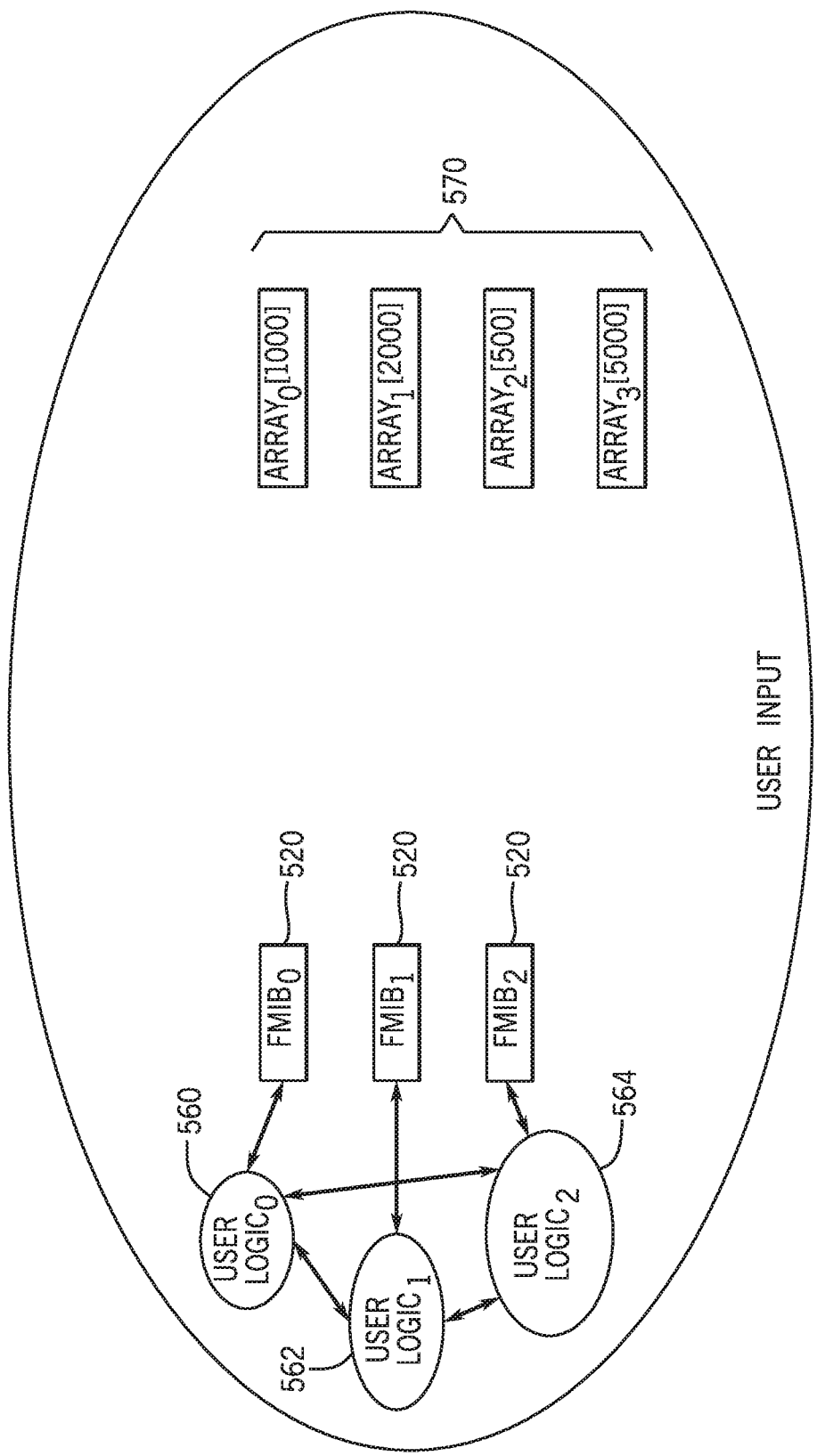
Figure 33:
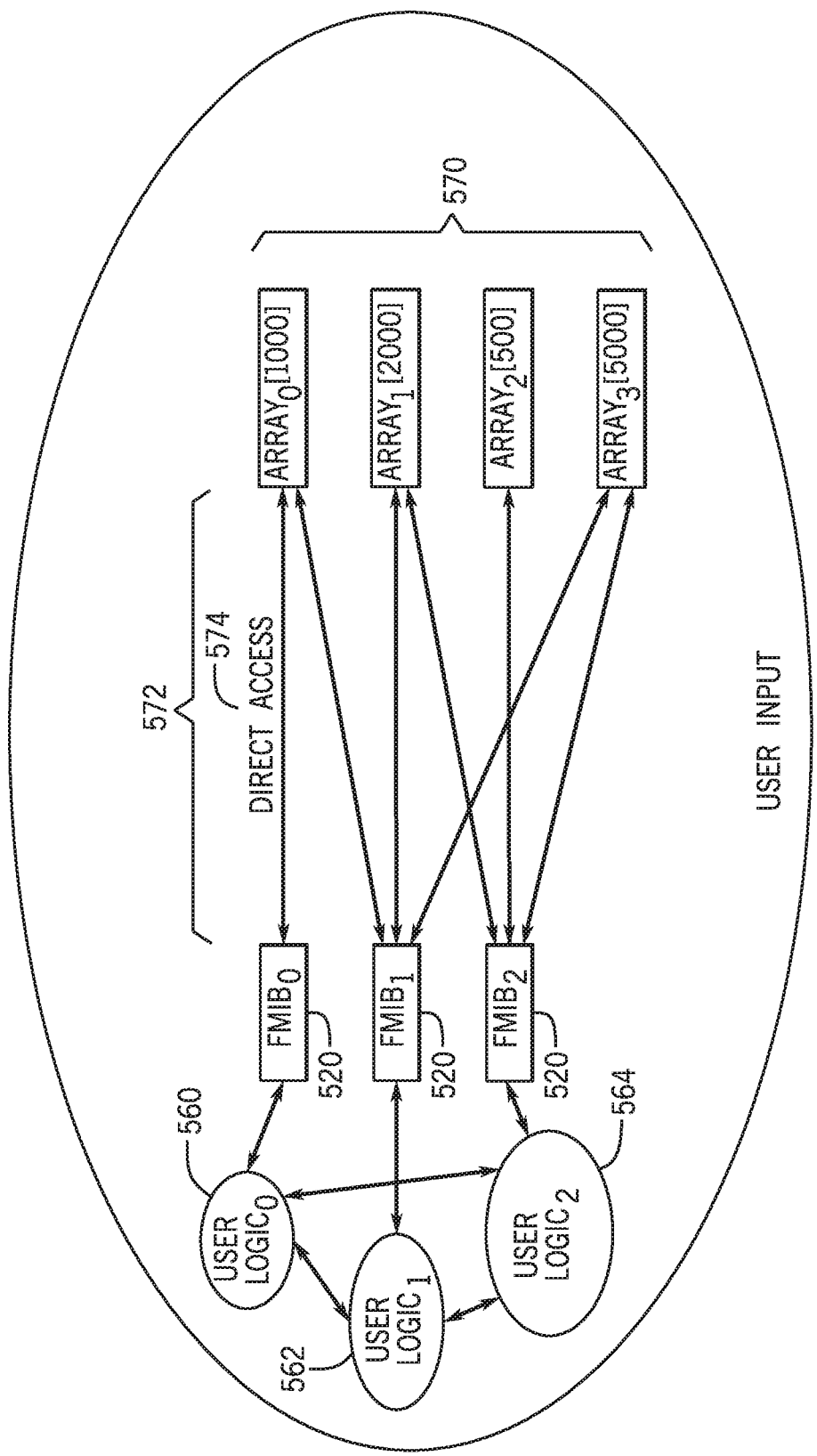
Figure 34:
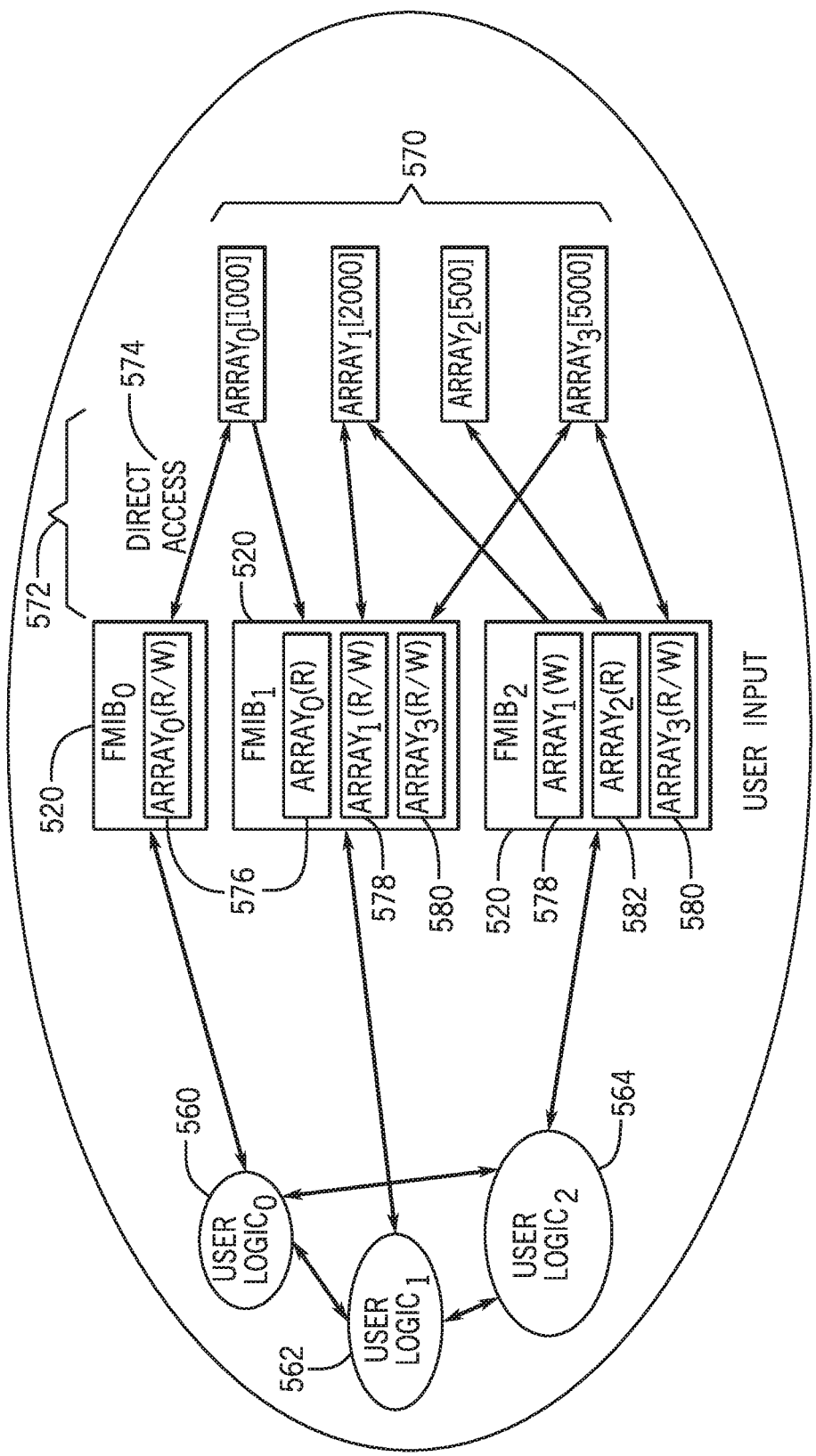
Figure 35:
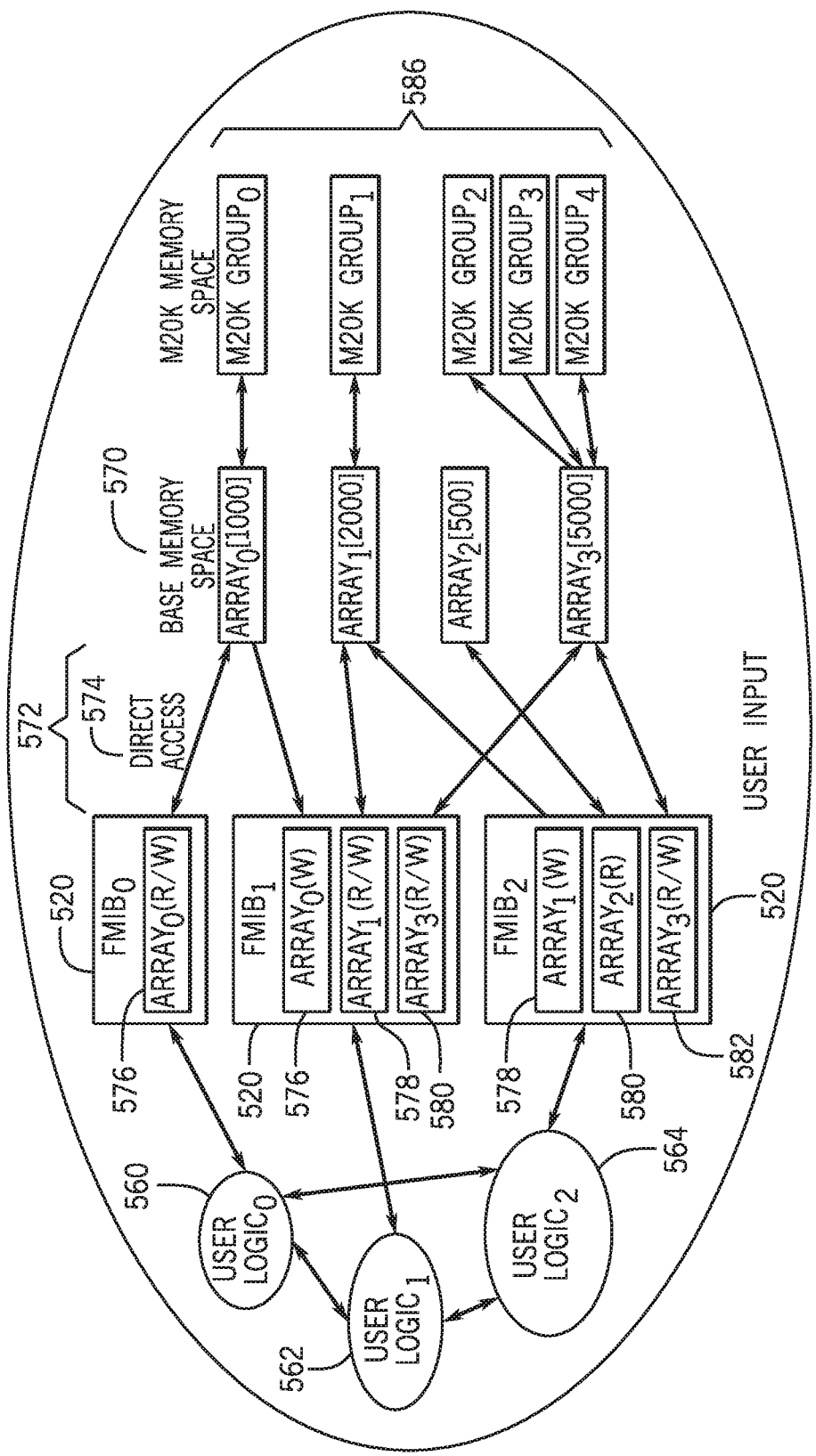
Figure 36:
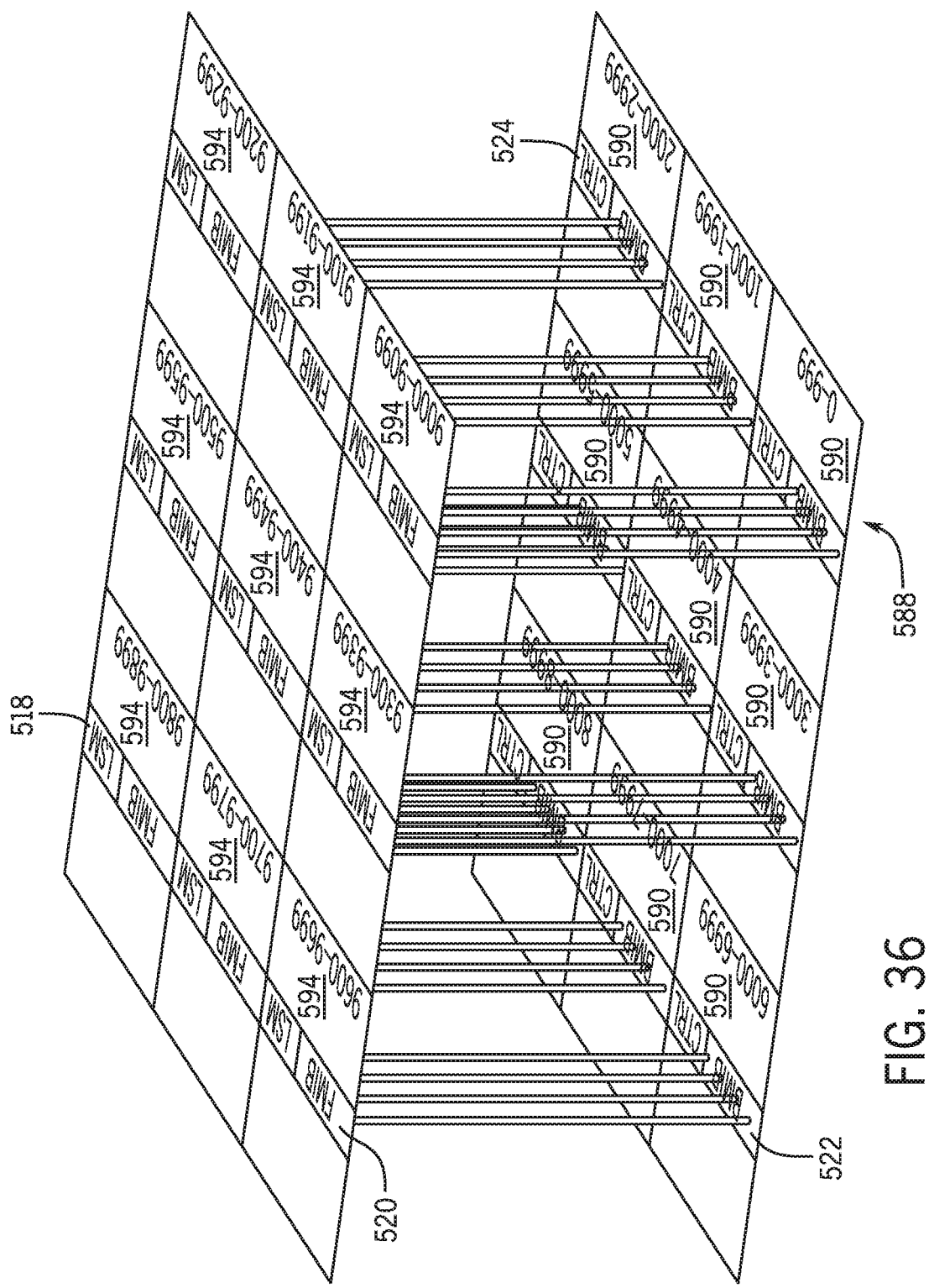
Figure 37:
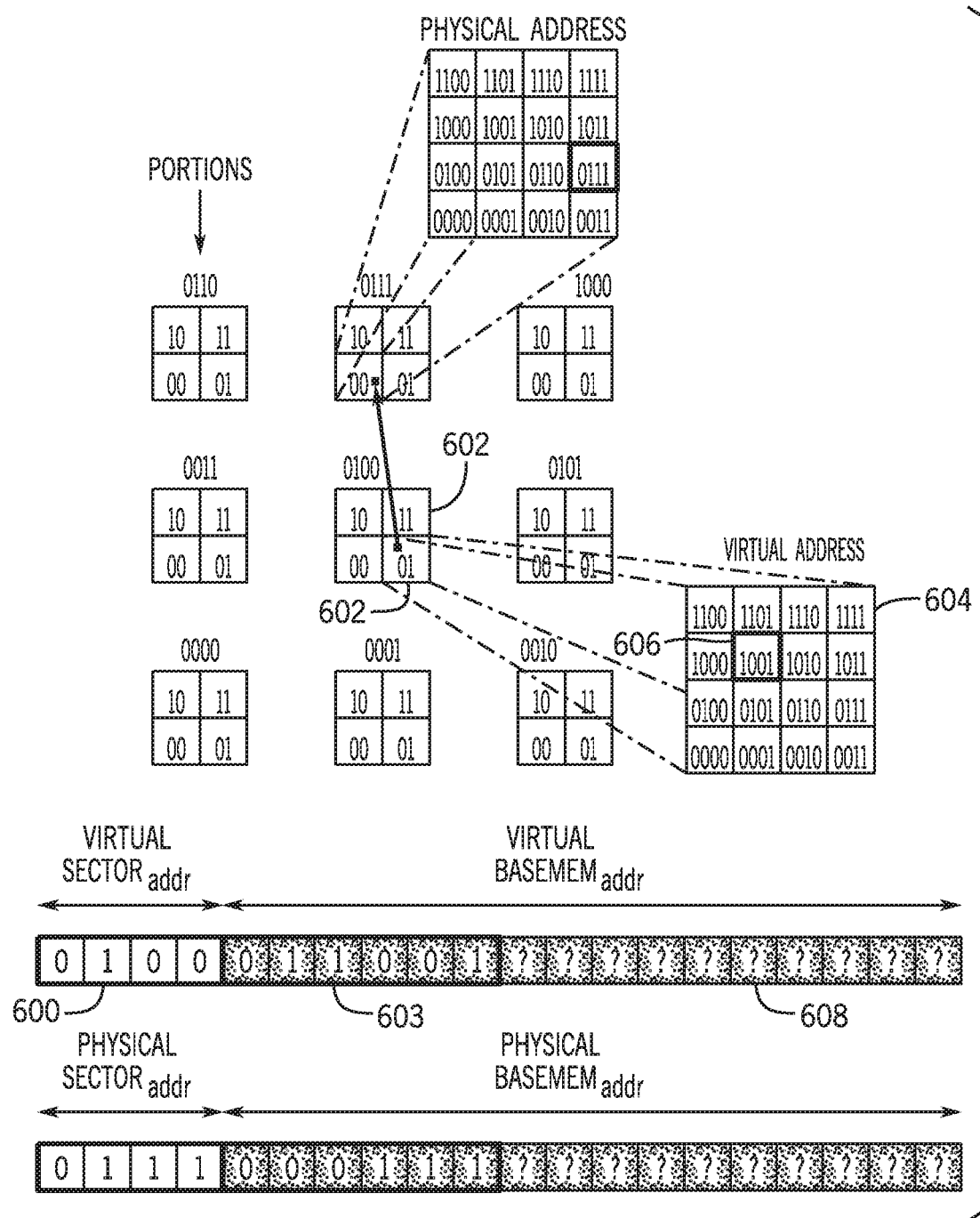
Figure 38:
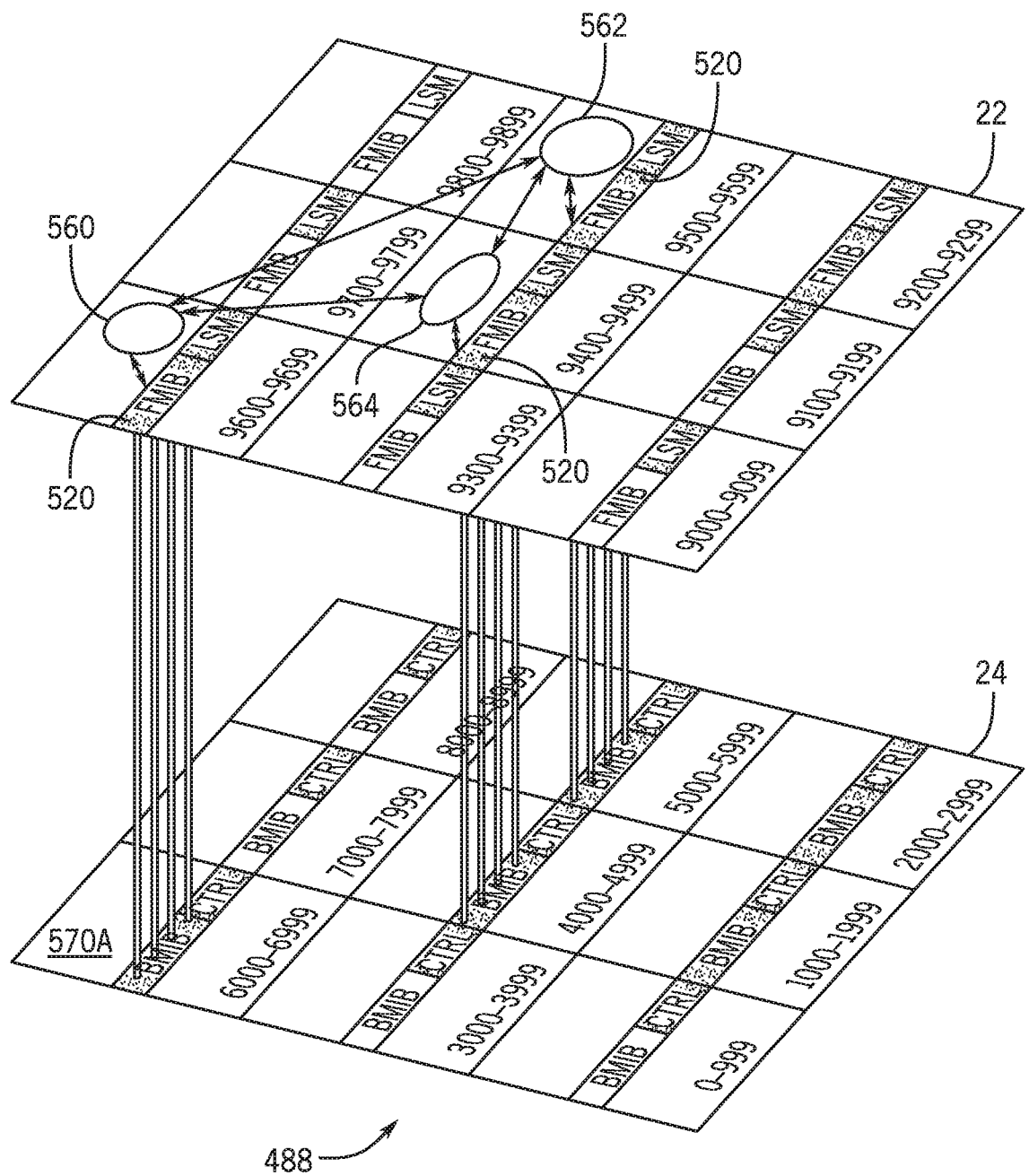
Figure 39:
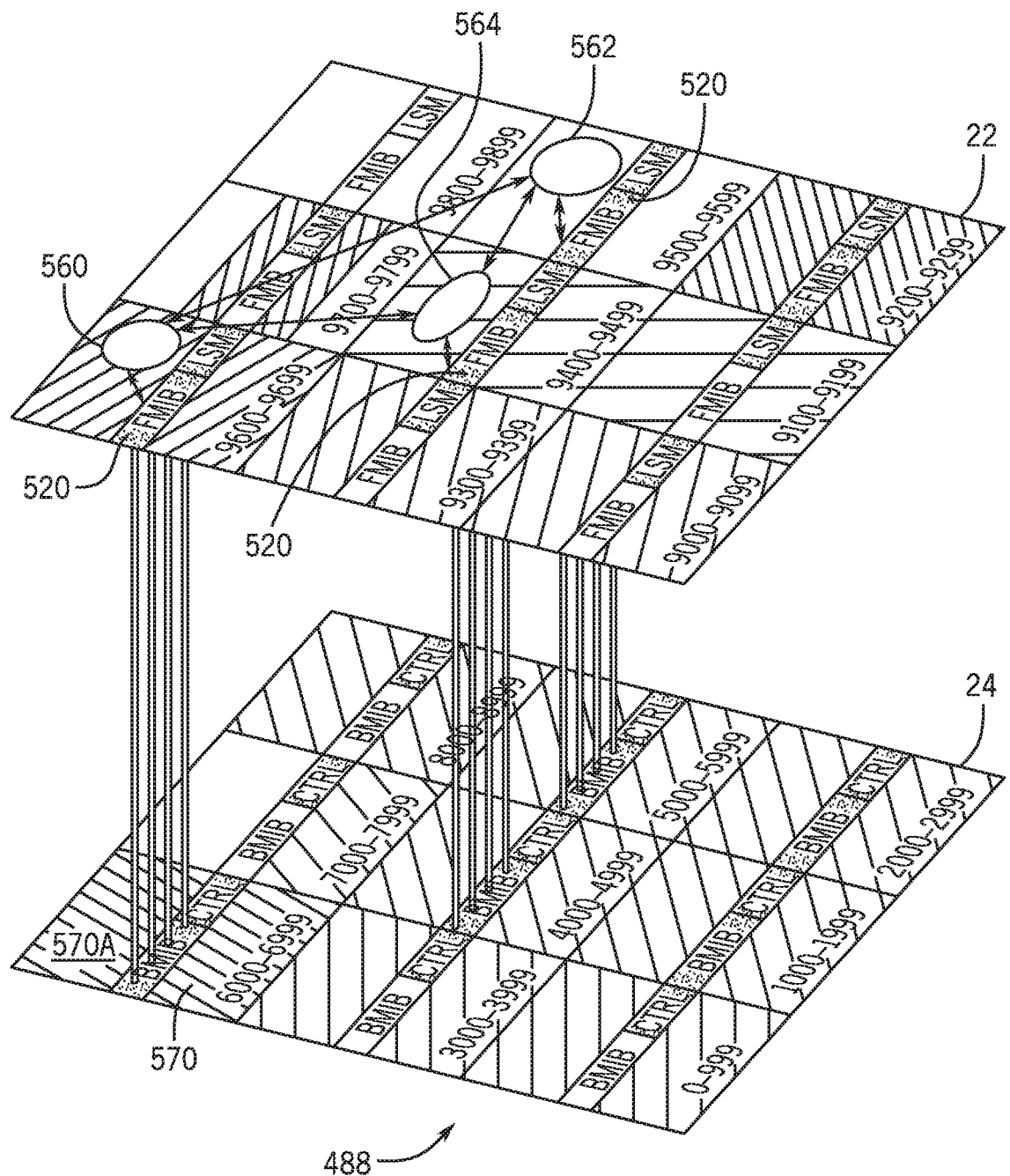
Figure 40:
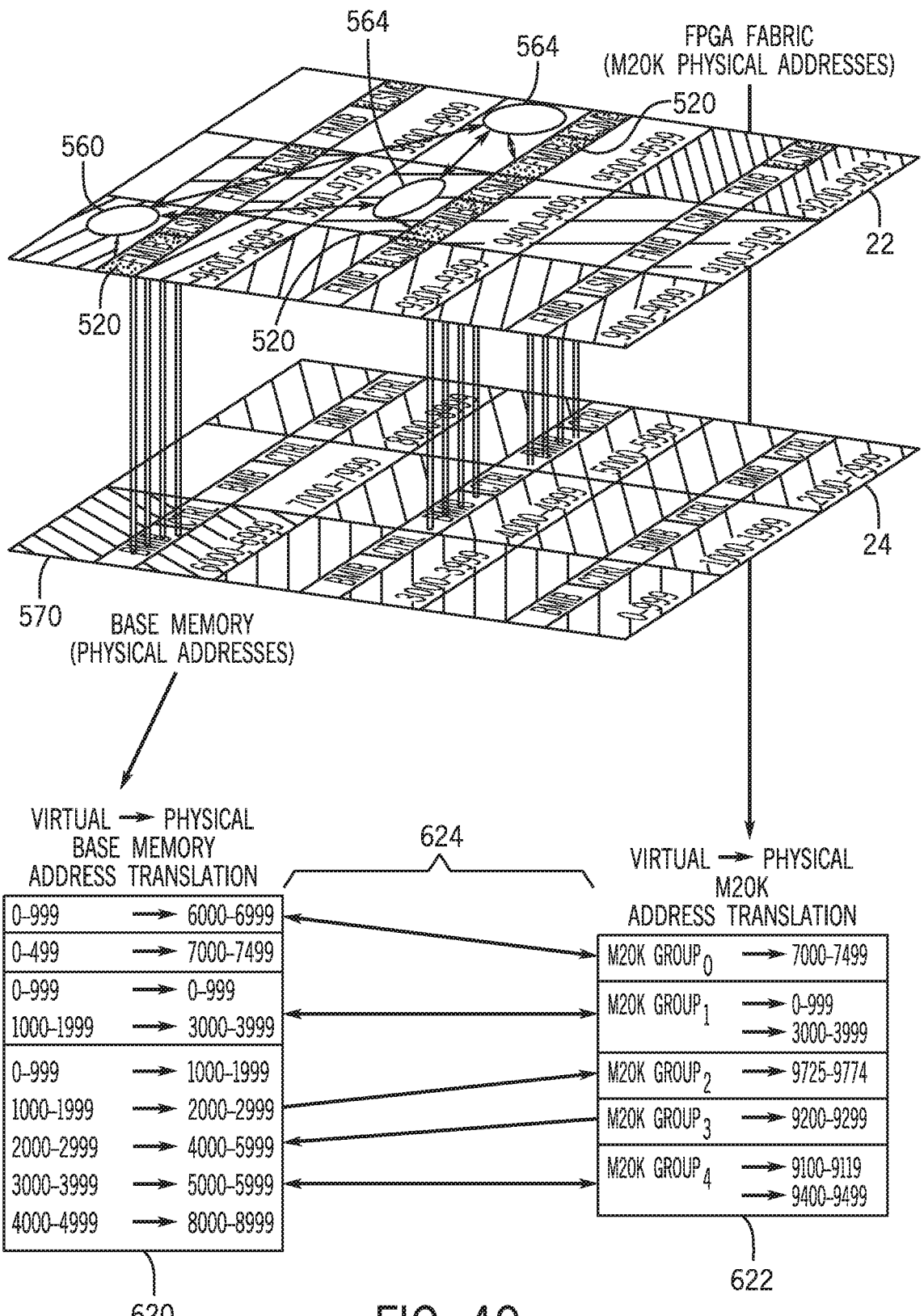
Figure 41:
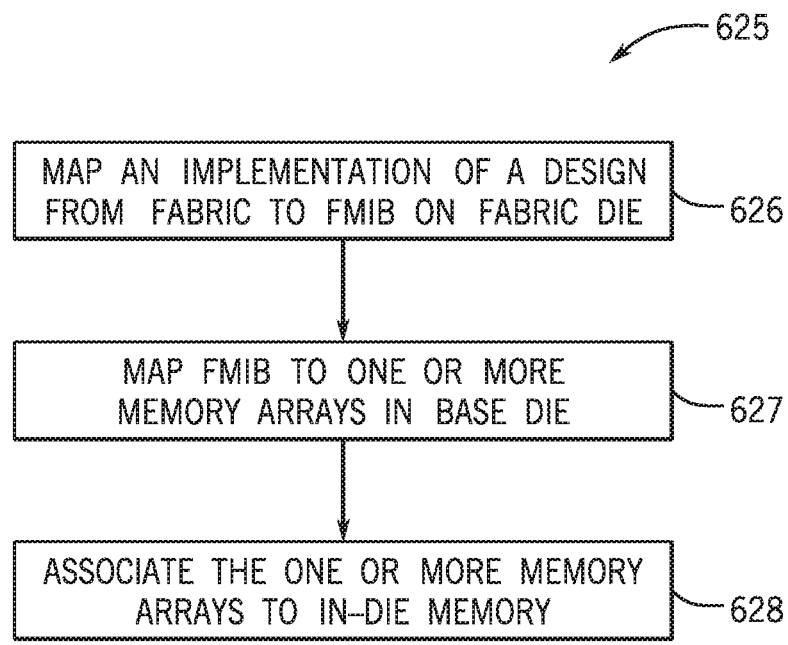
Figure 42:
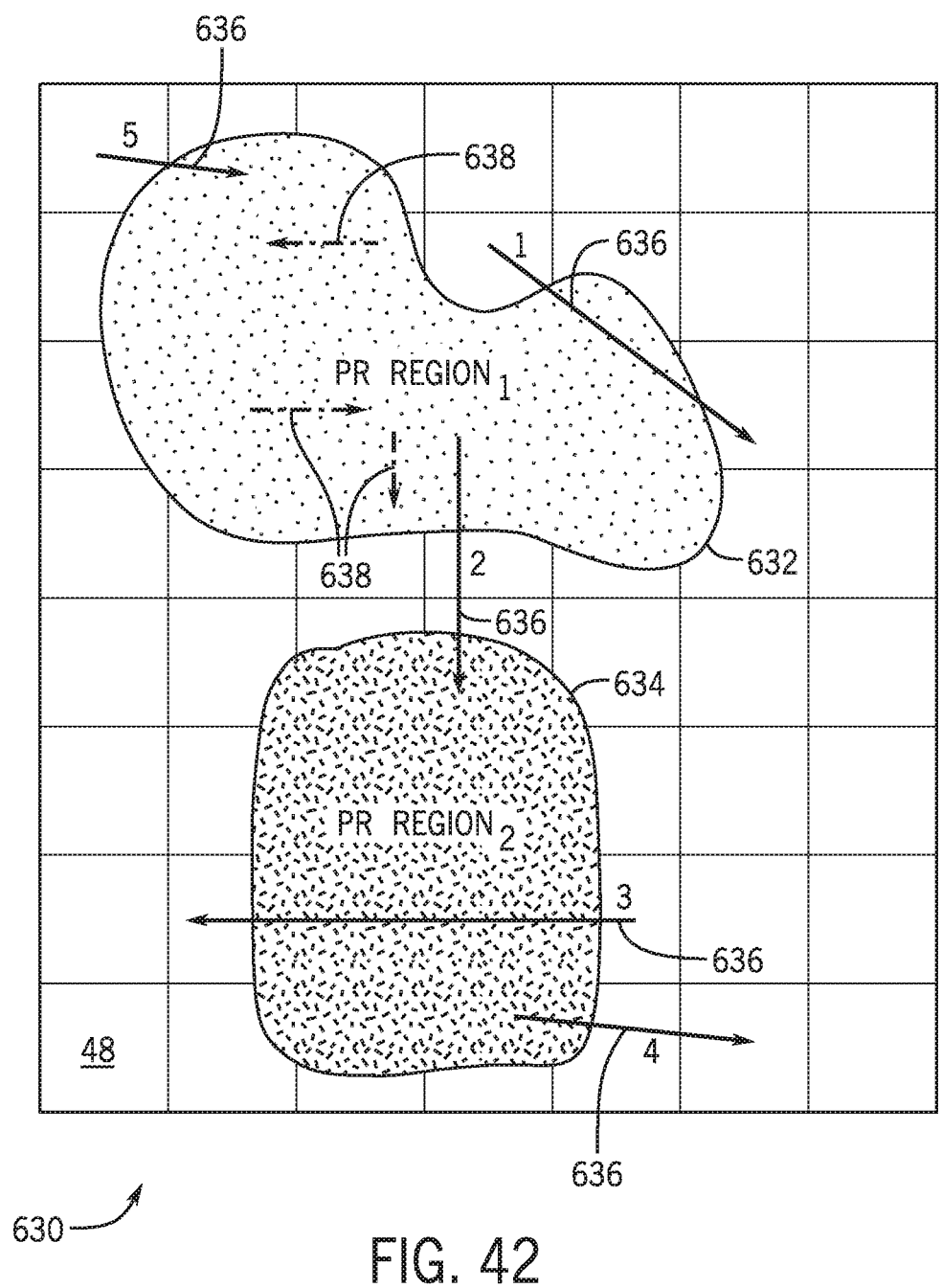
Figure 43:
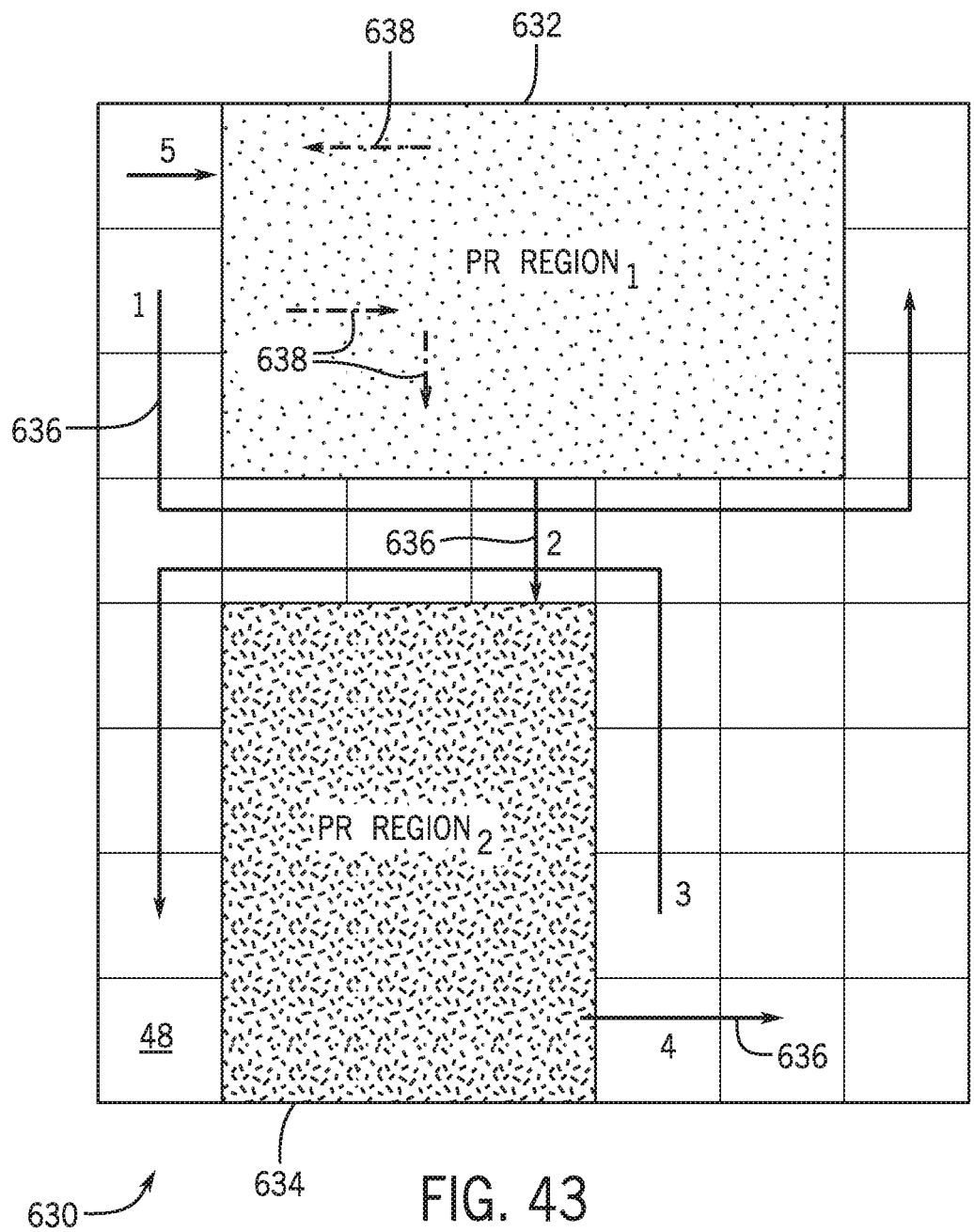
Figure 44:
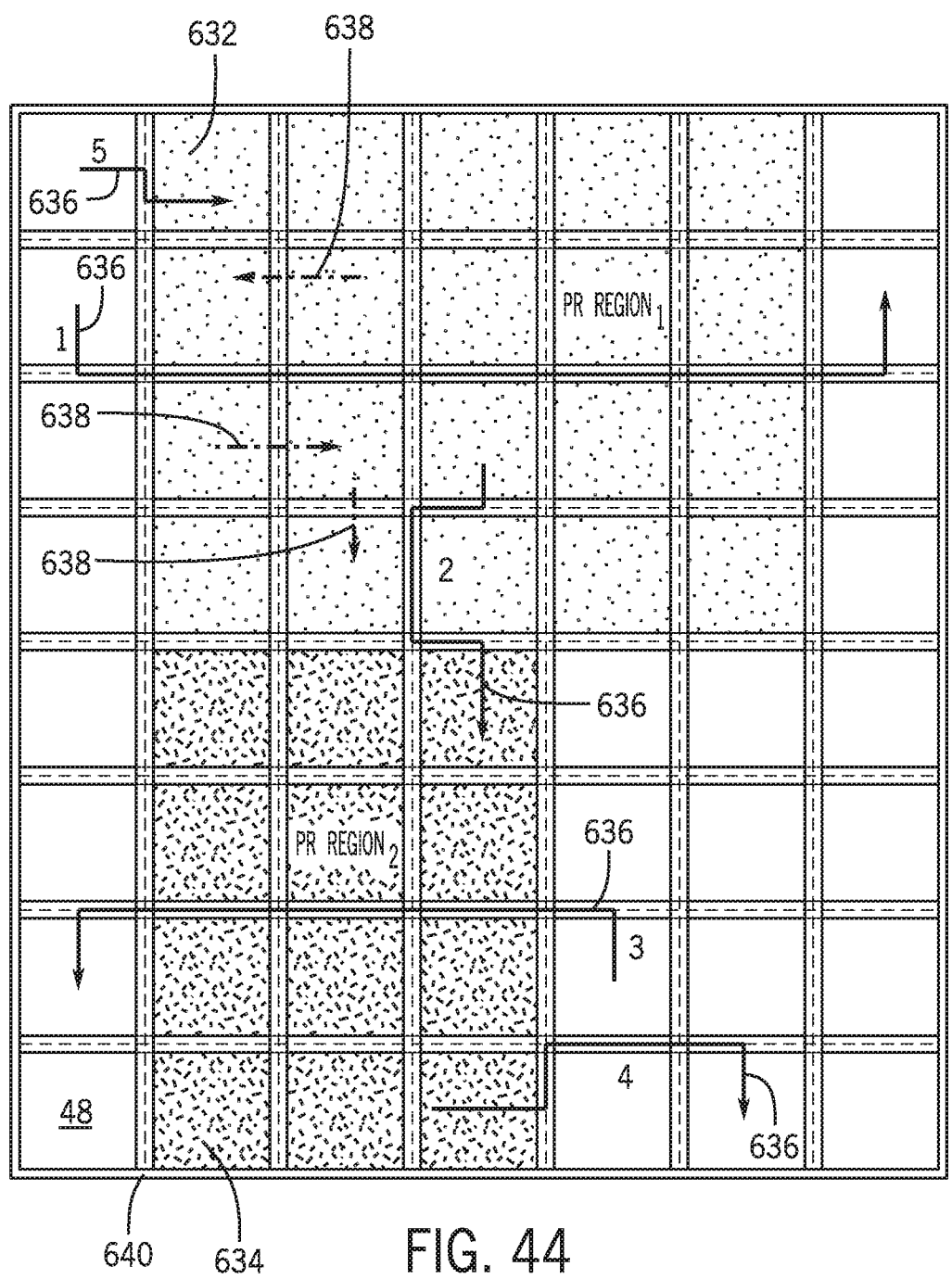
Figure 45:
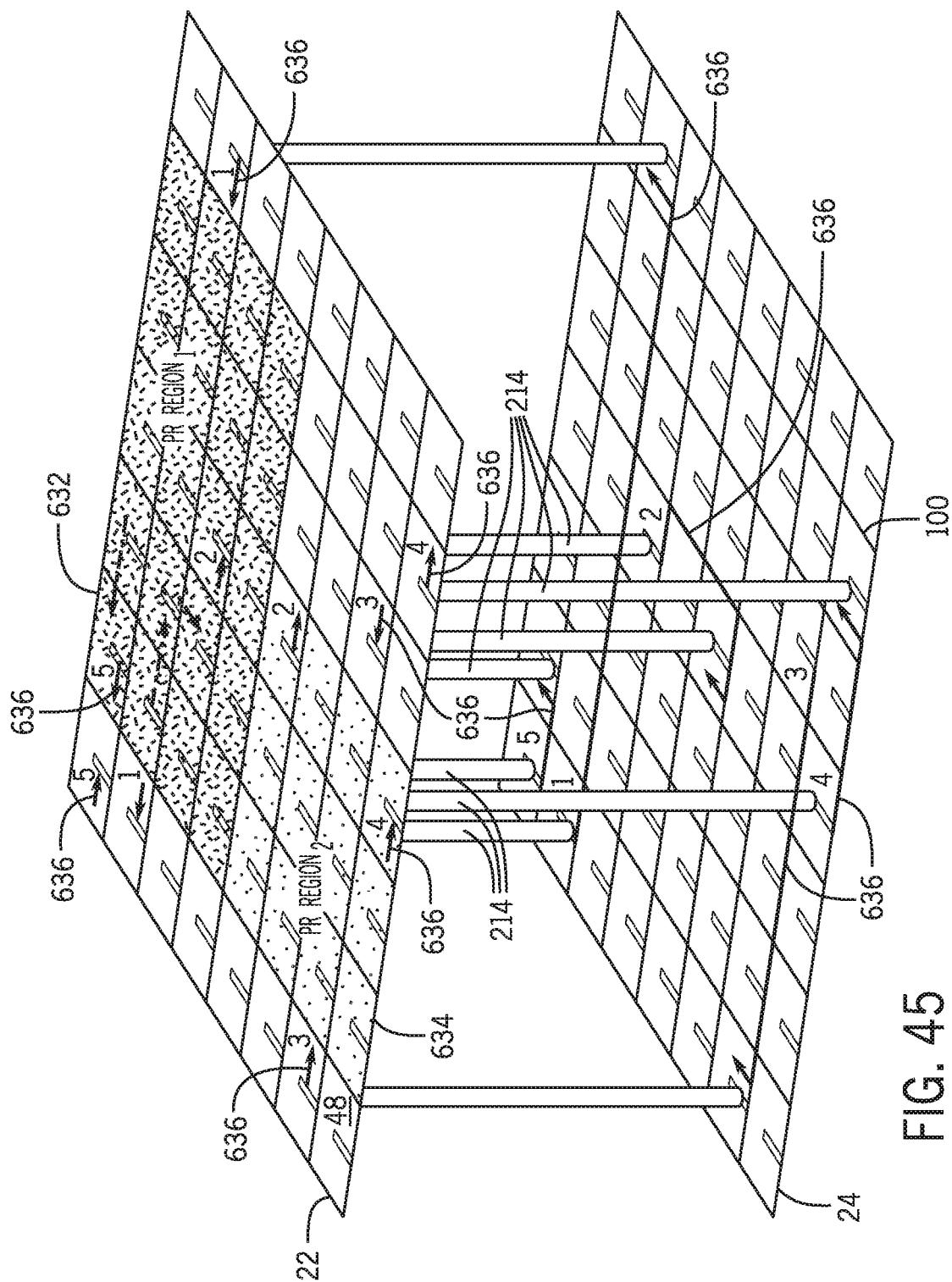
Figure 46:
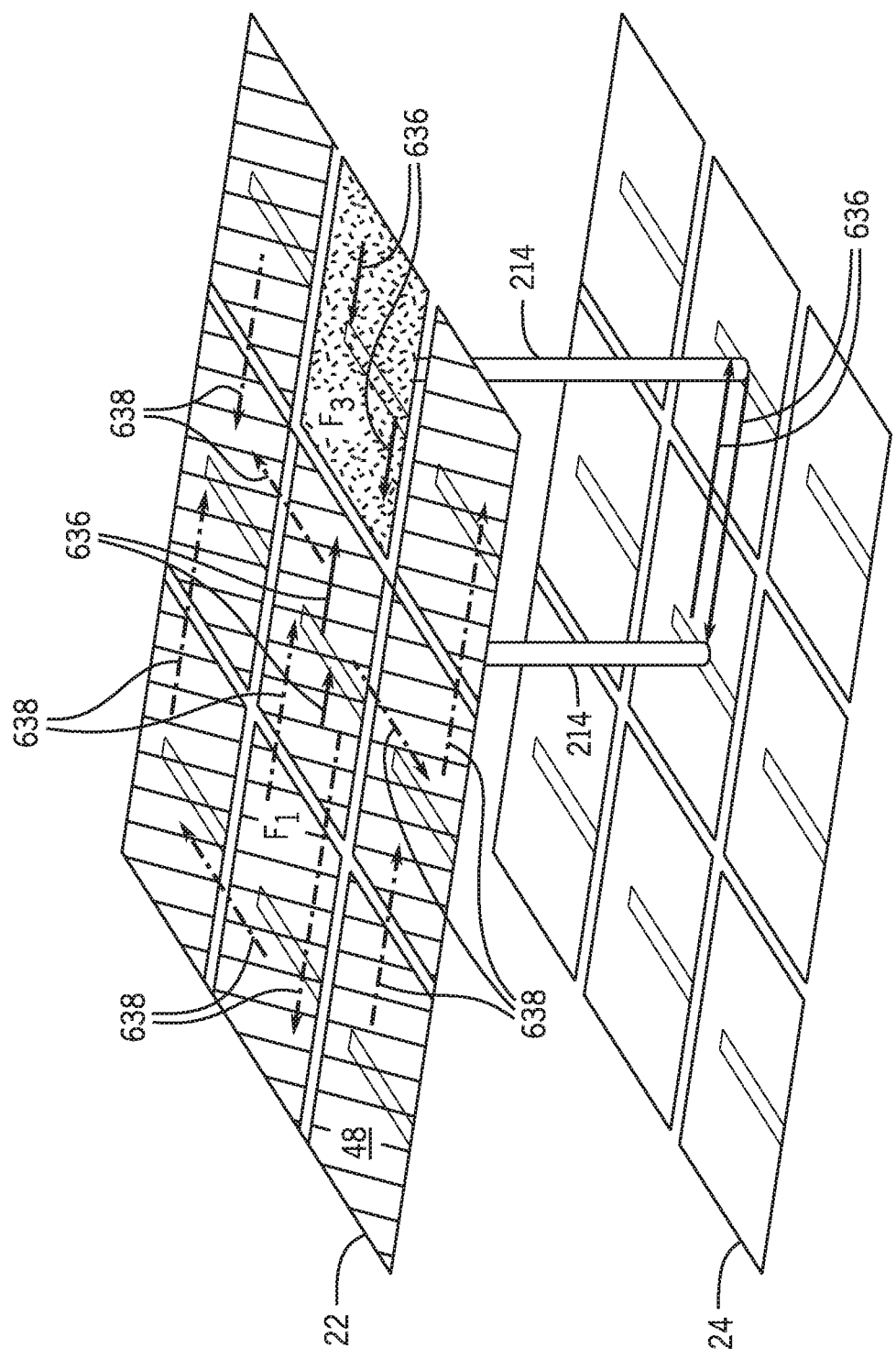
Figure 47:
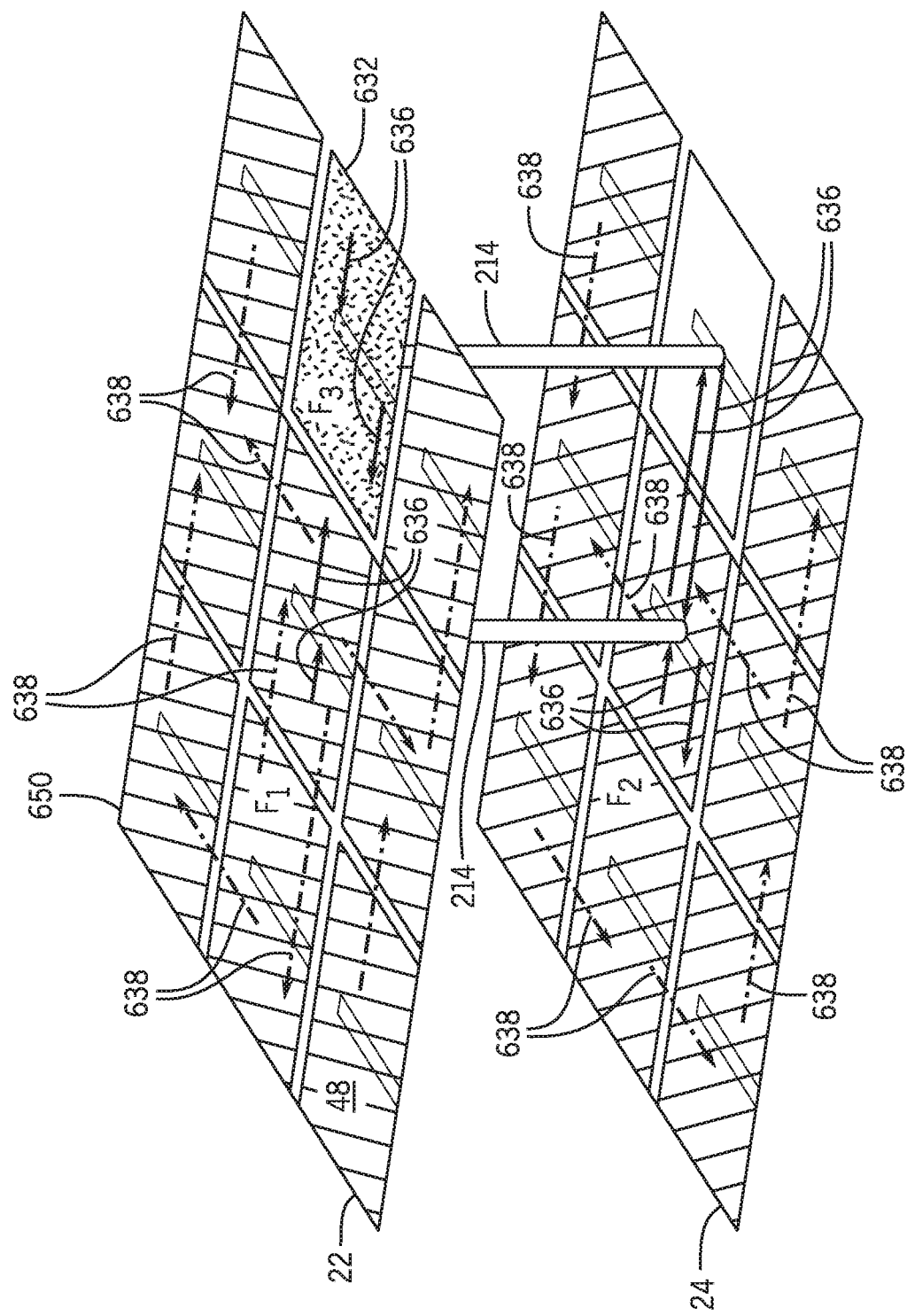
Figure 48:
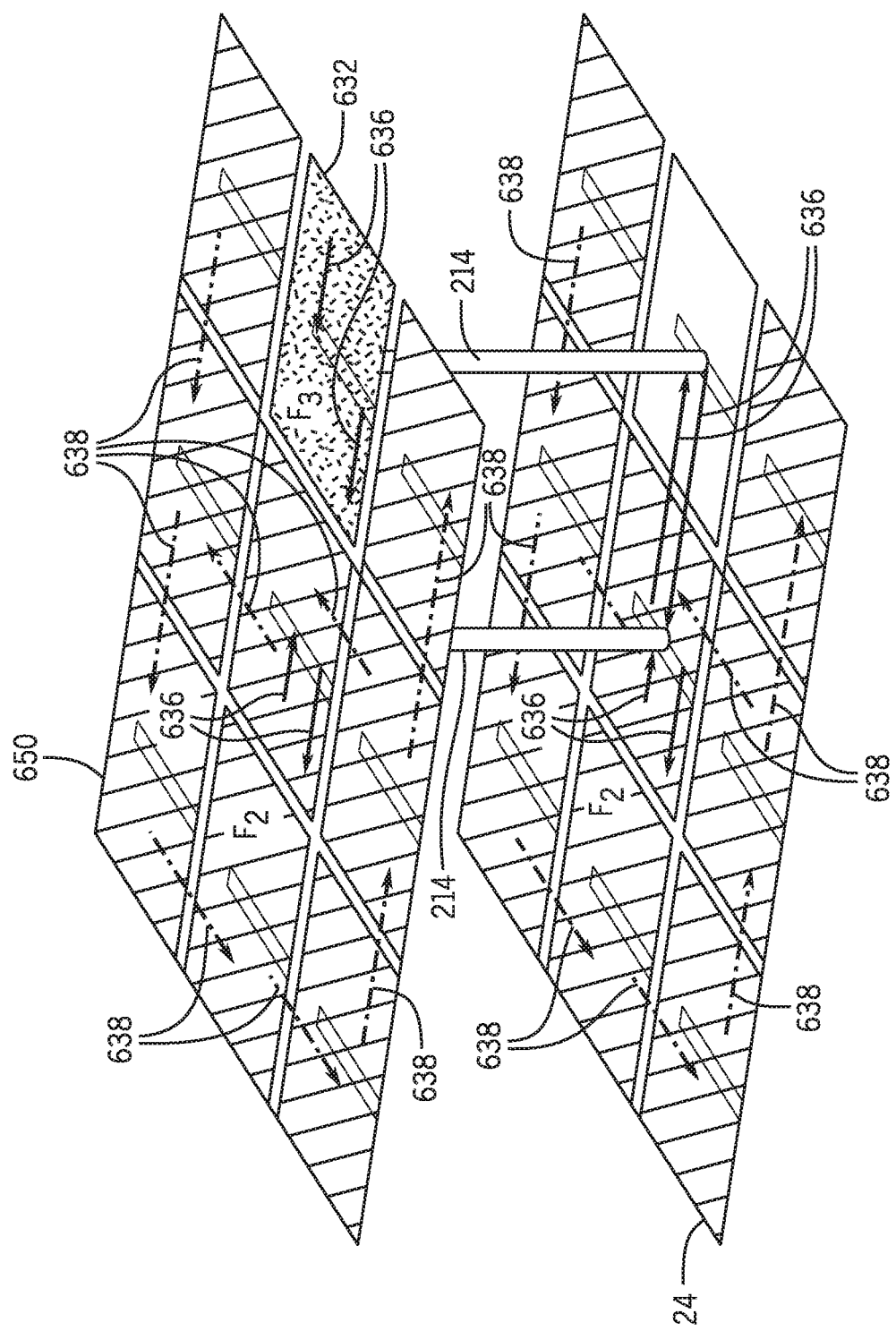
Figure 49:
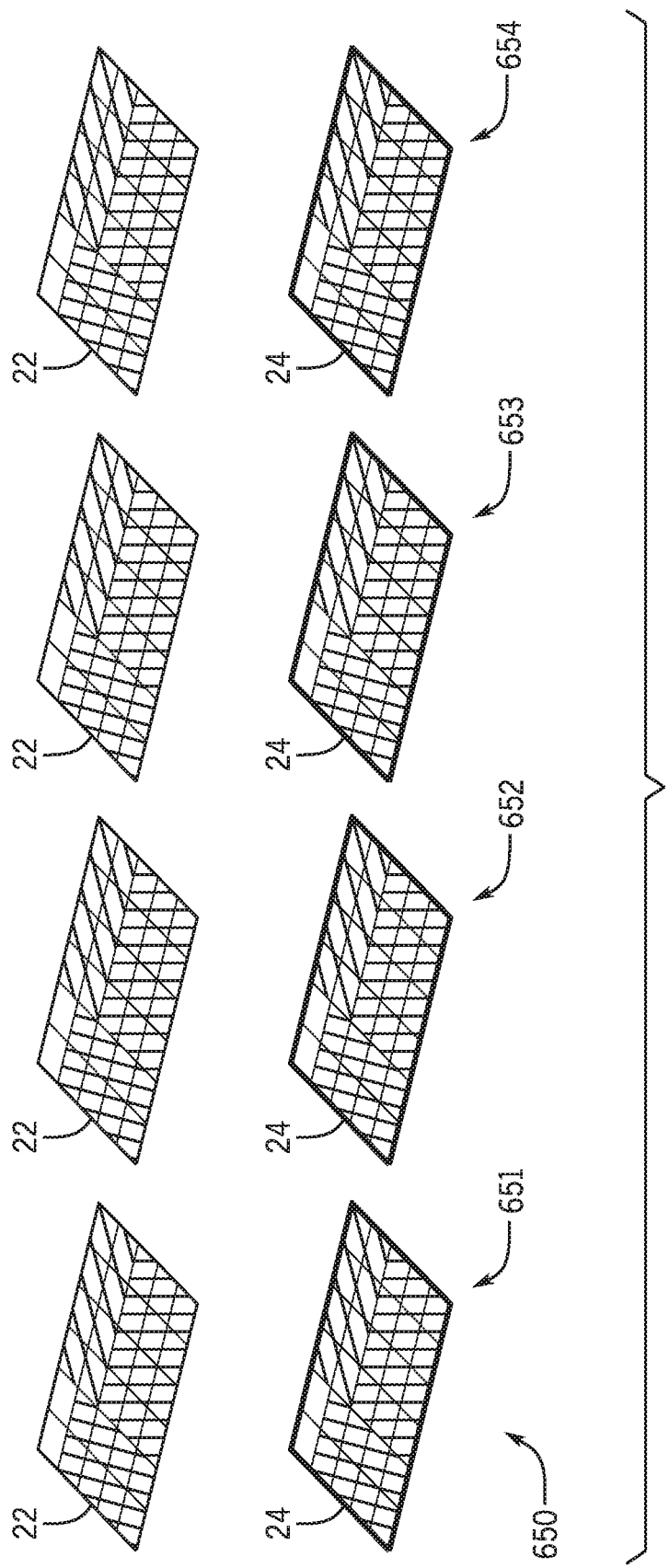
Figure 50:
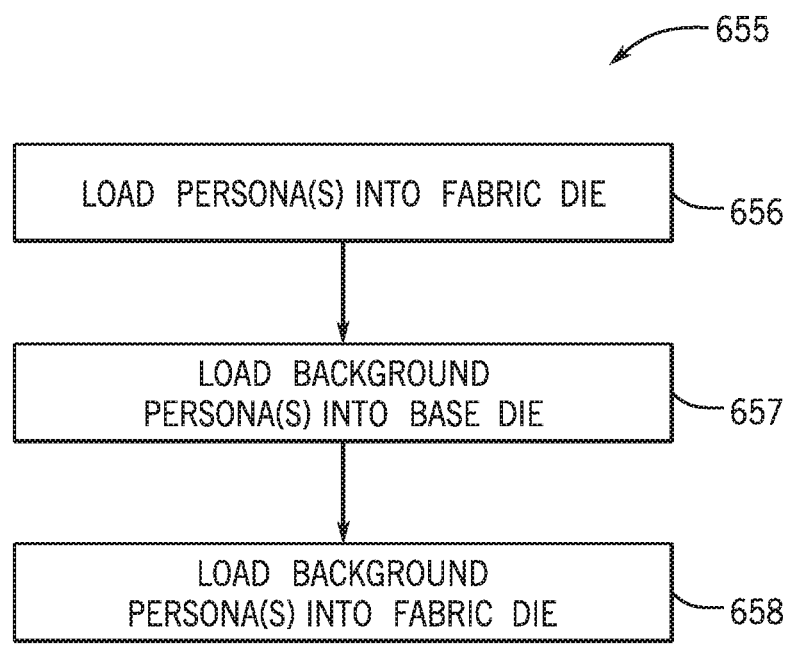
Figure 51:
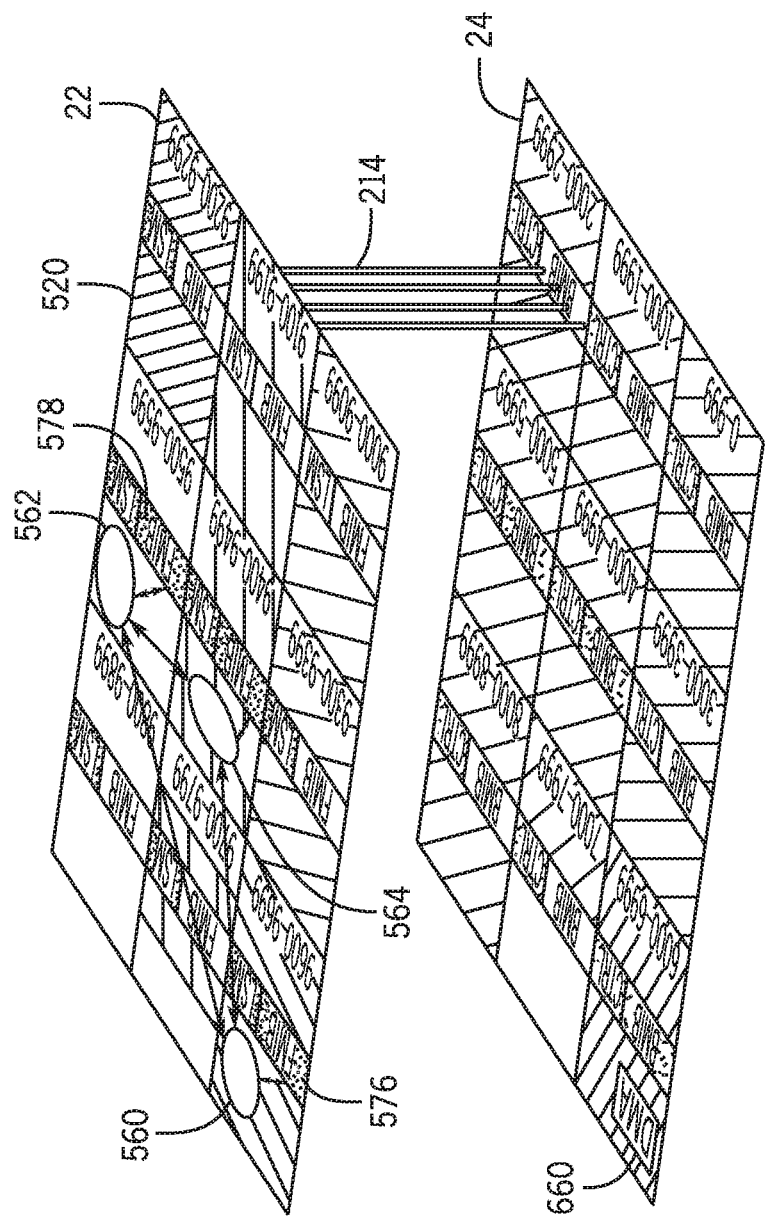
Figure 52:
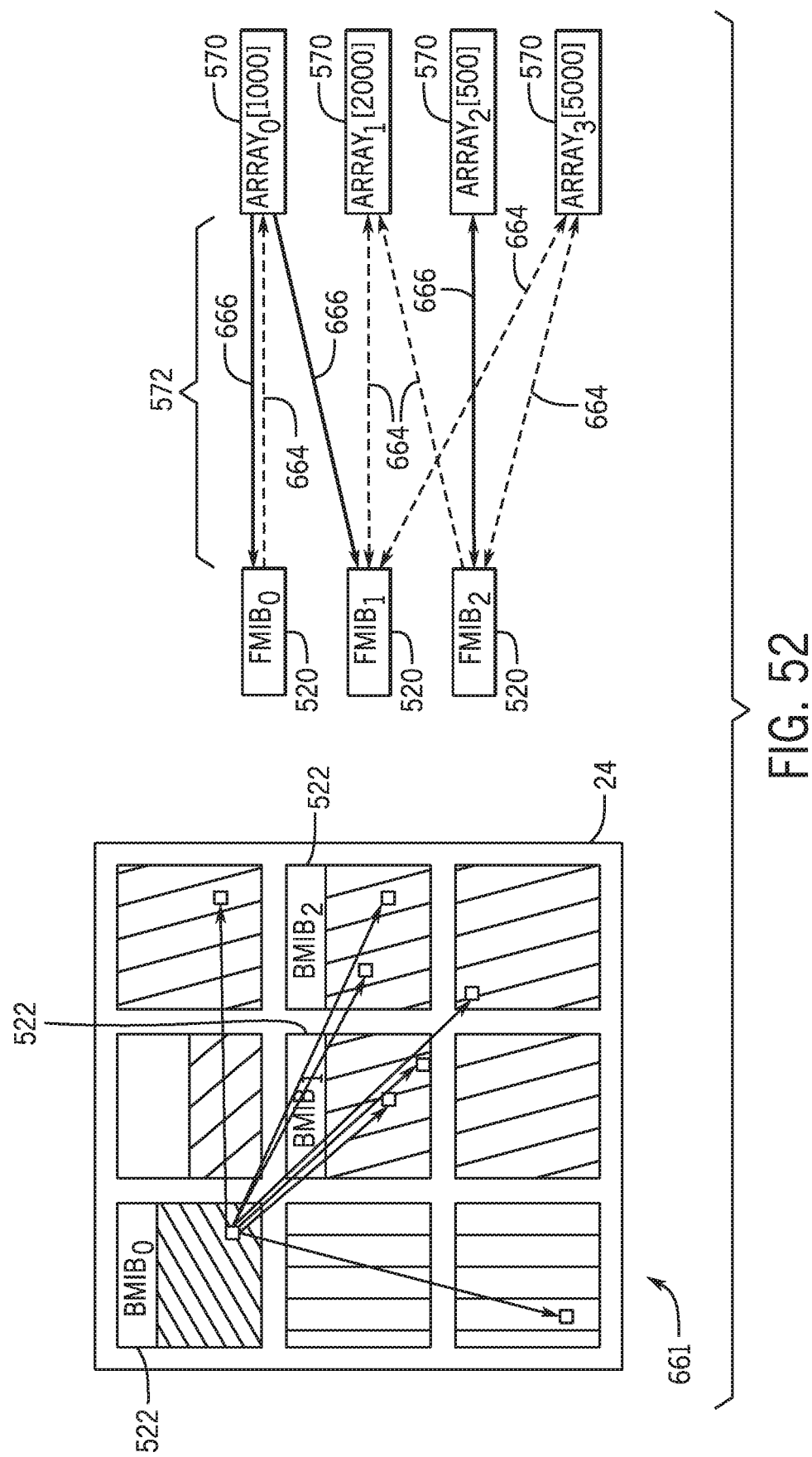
Figure 53:
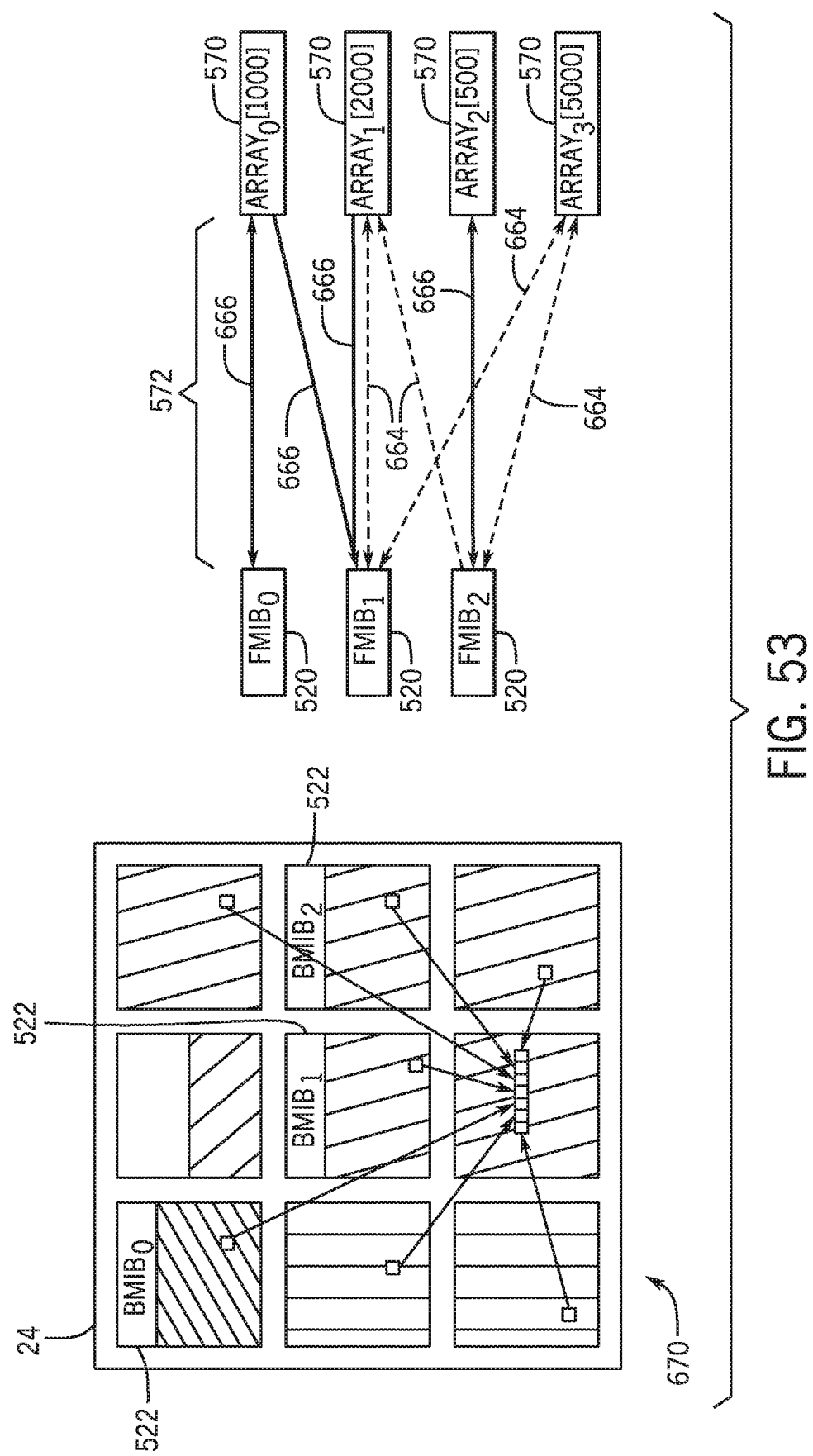
Figure 54:
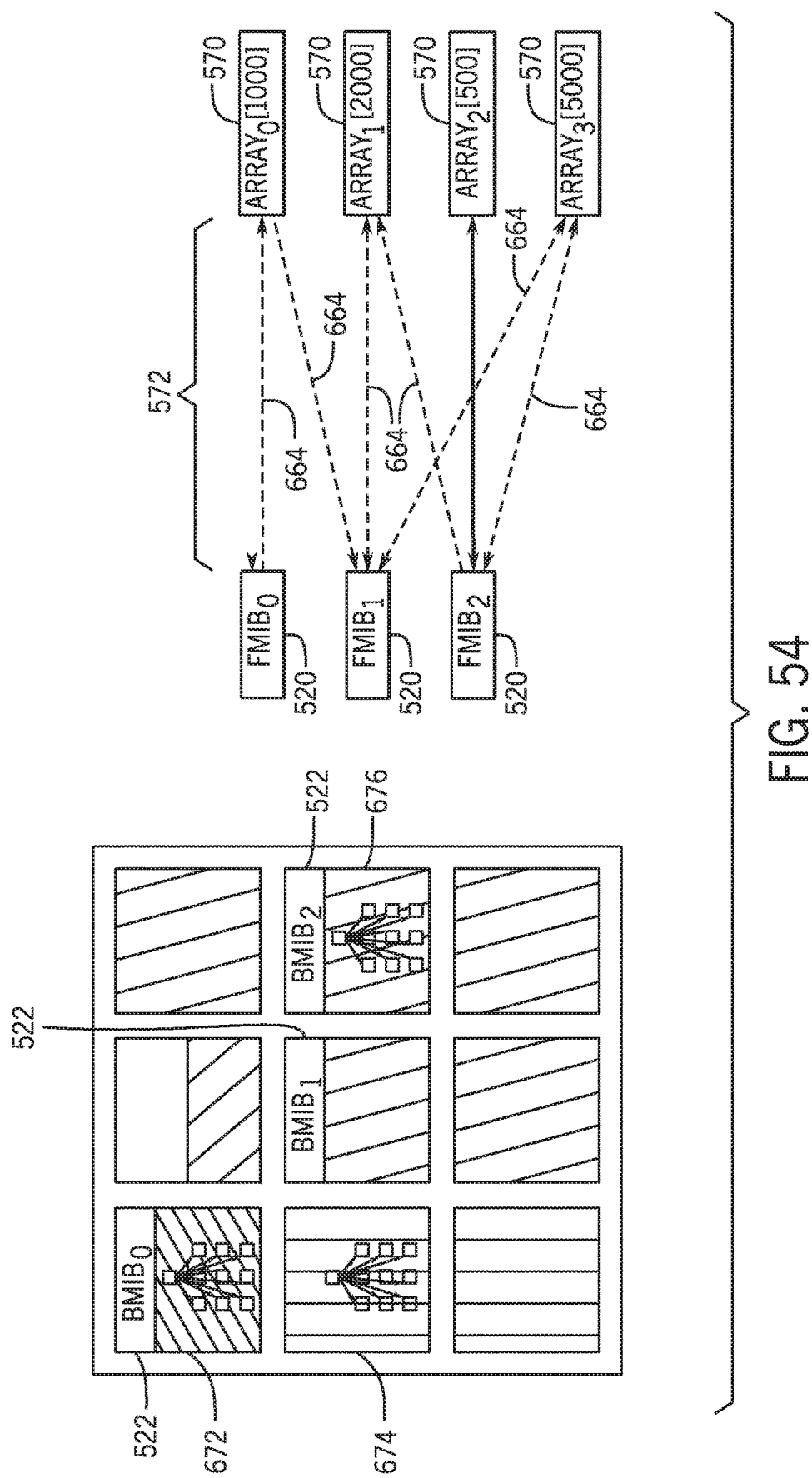
Figure 55:
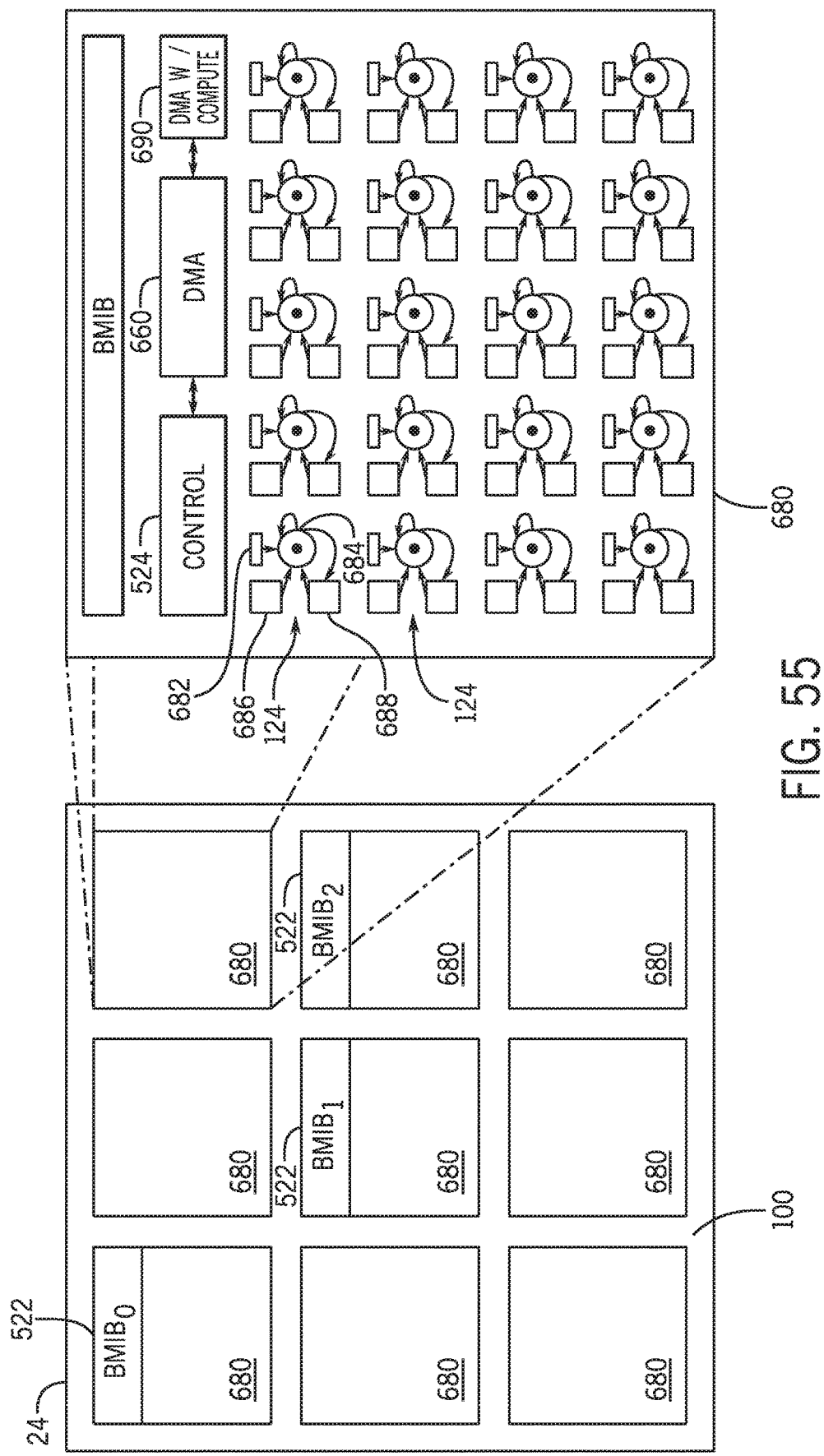
Figure 56:
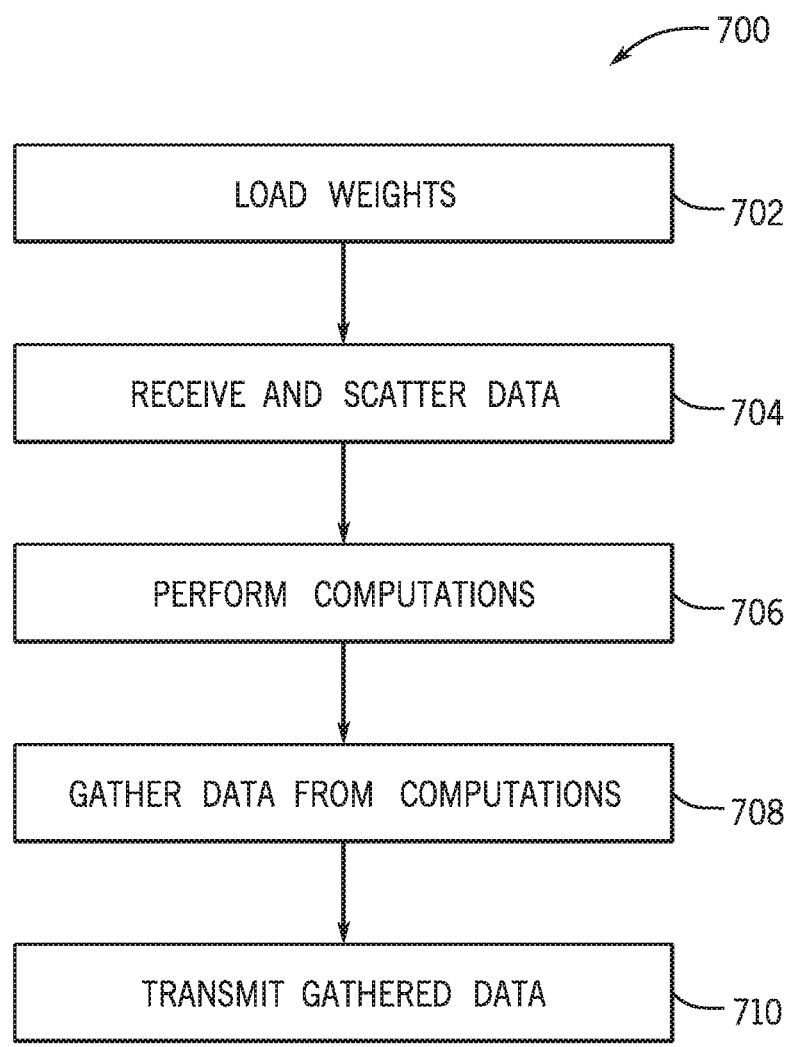
Figure 57:
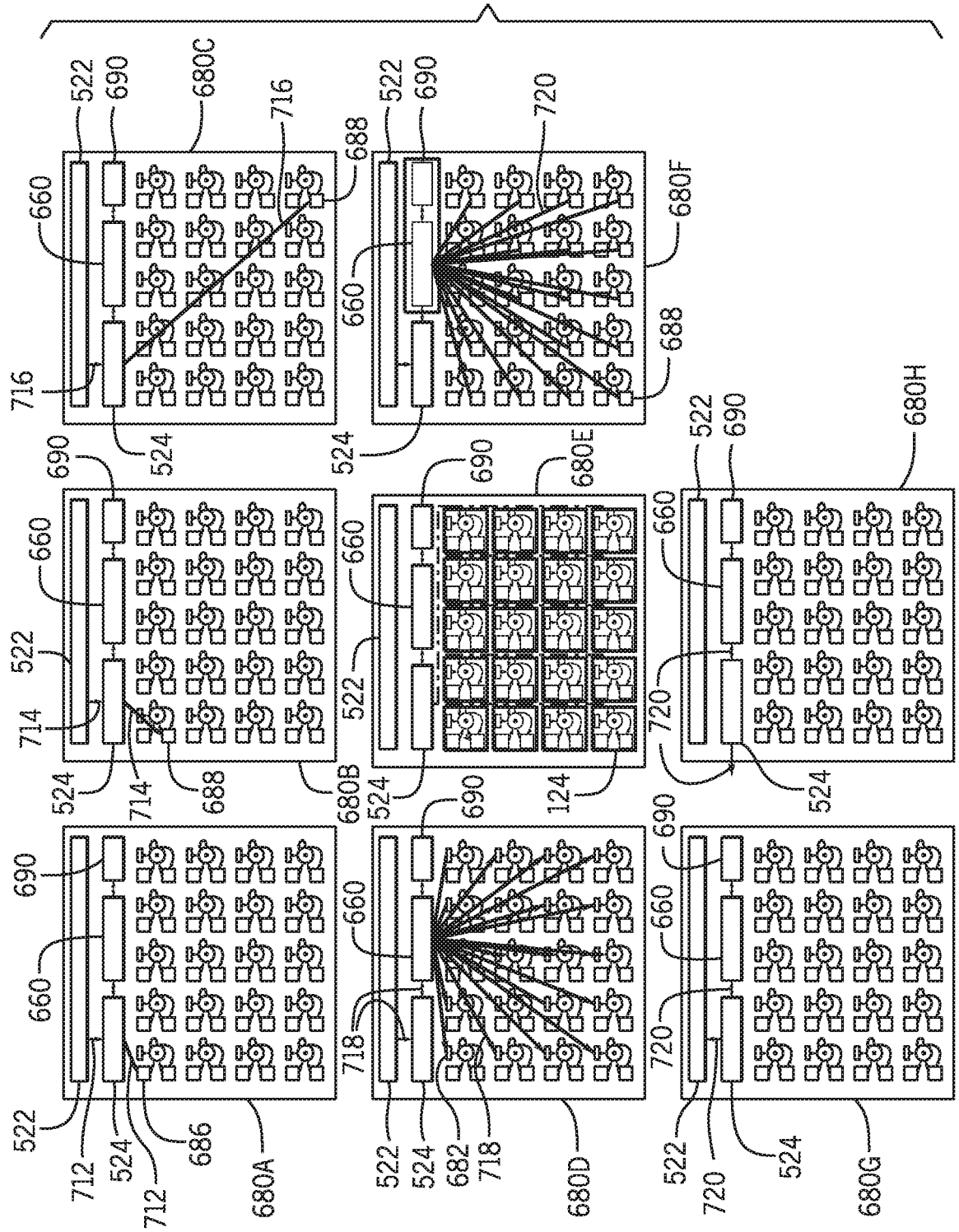
Figure 58:
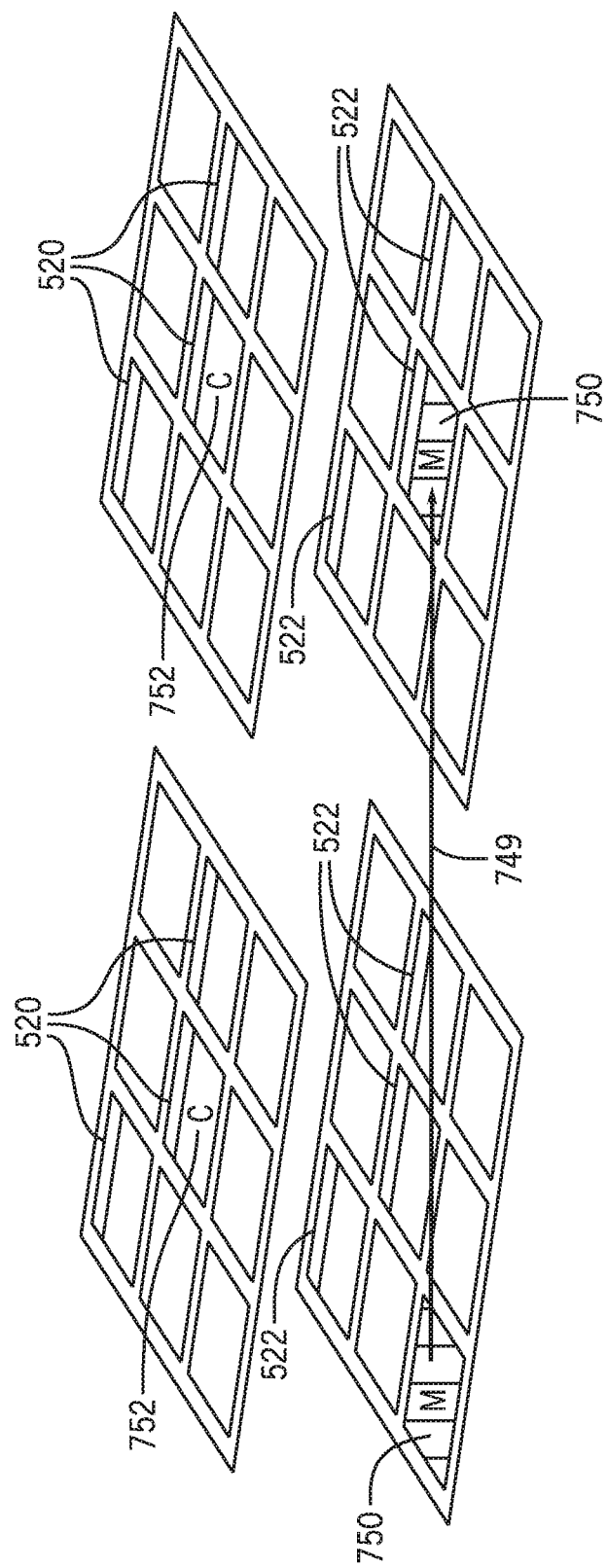
Figure 60:
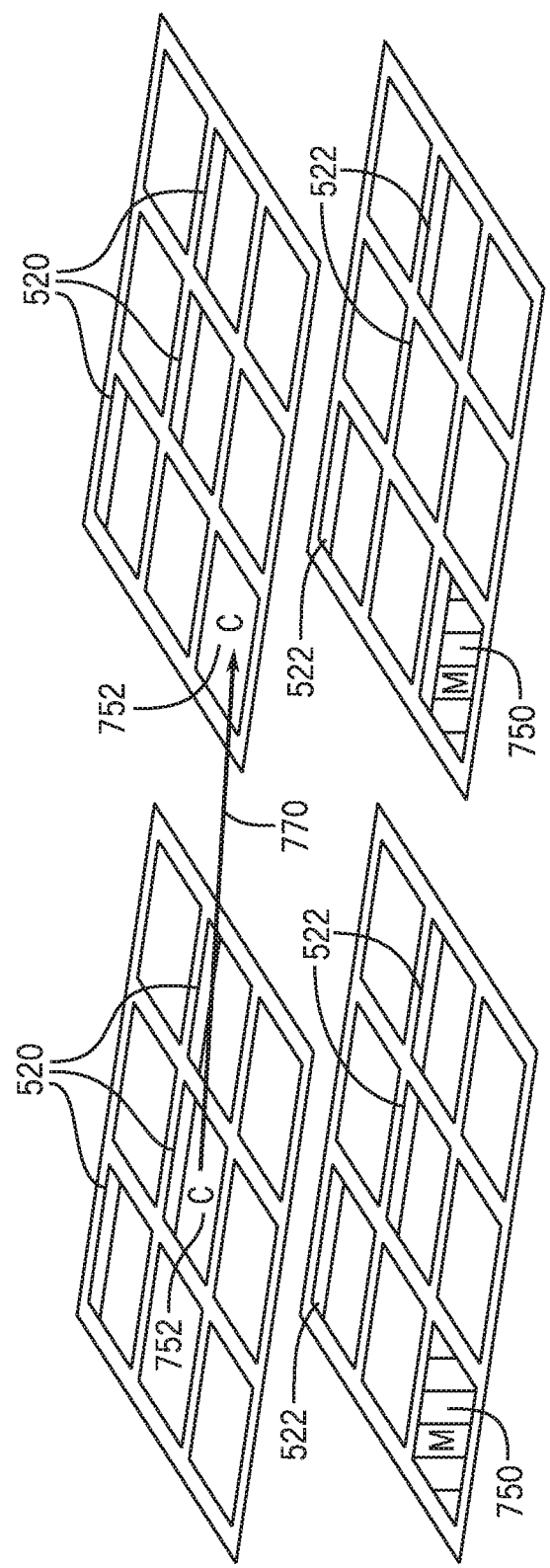
Figure 61:
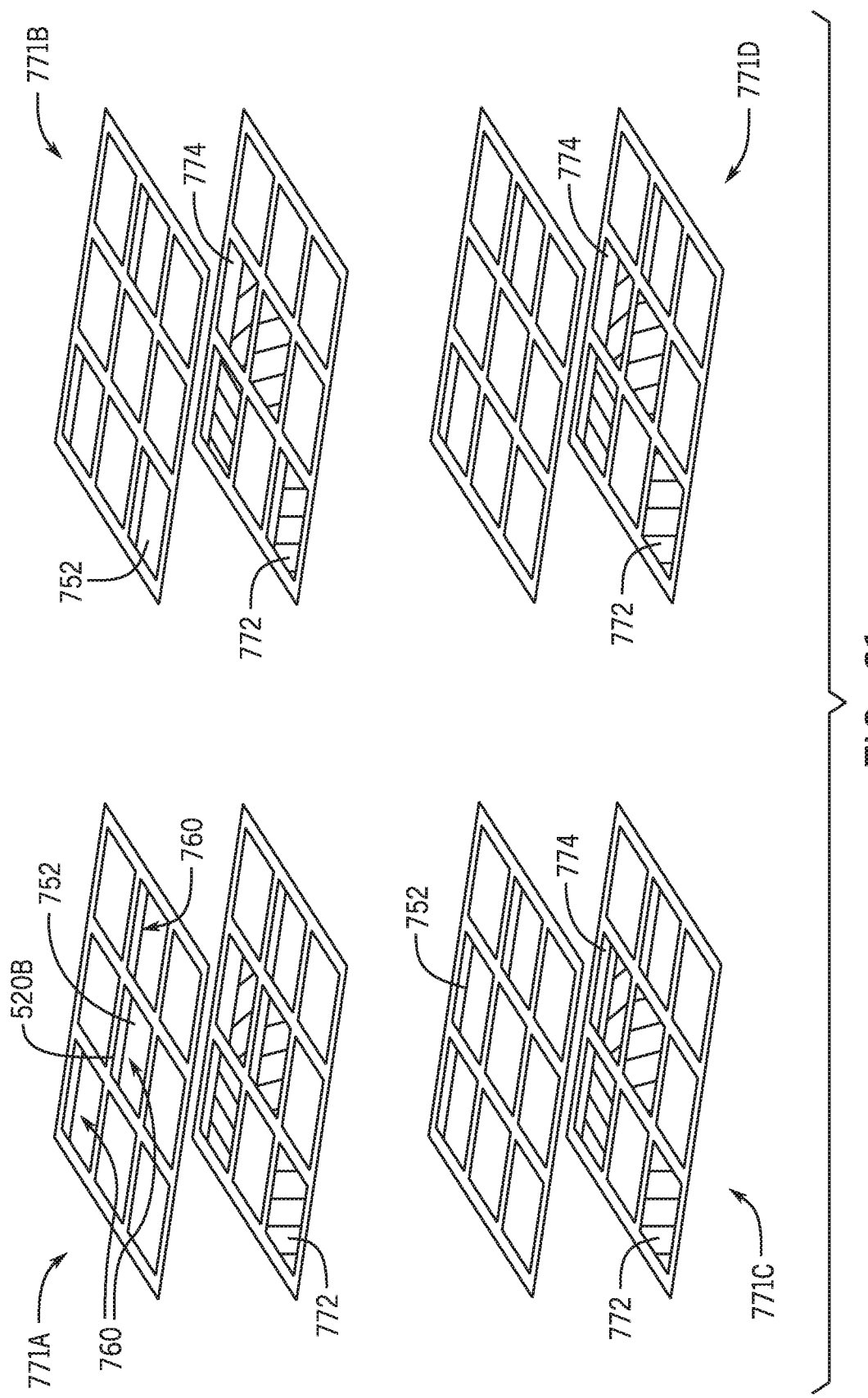
Figure 62:
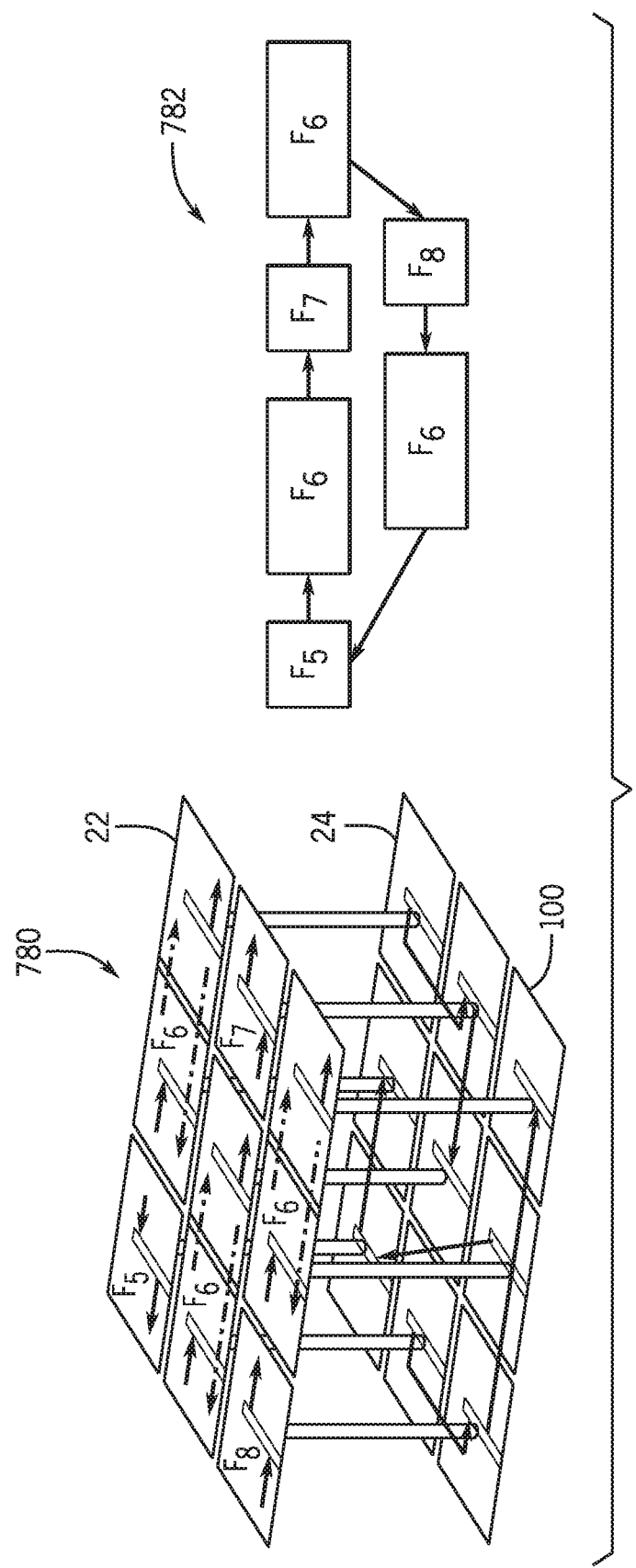
Figure 63:
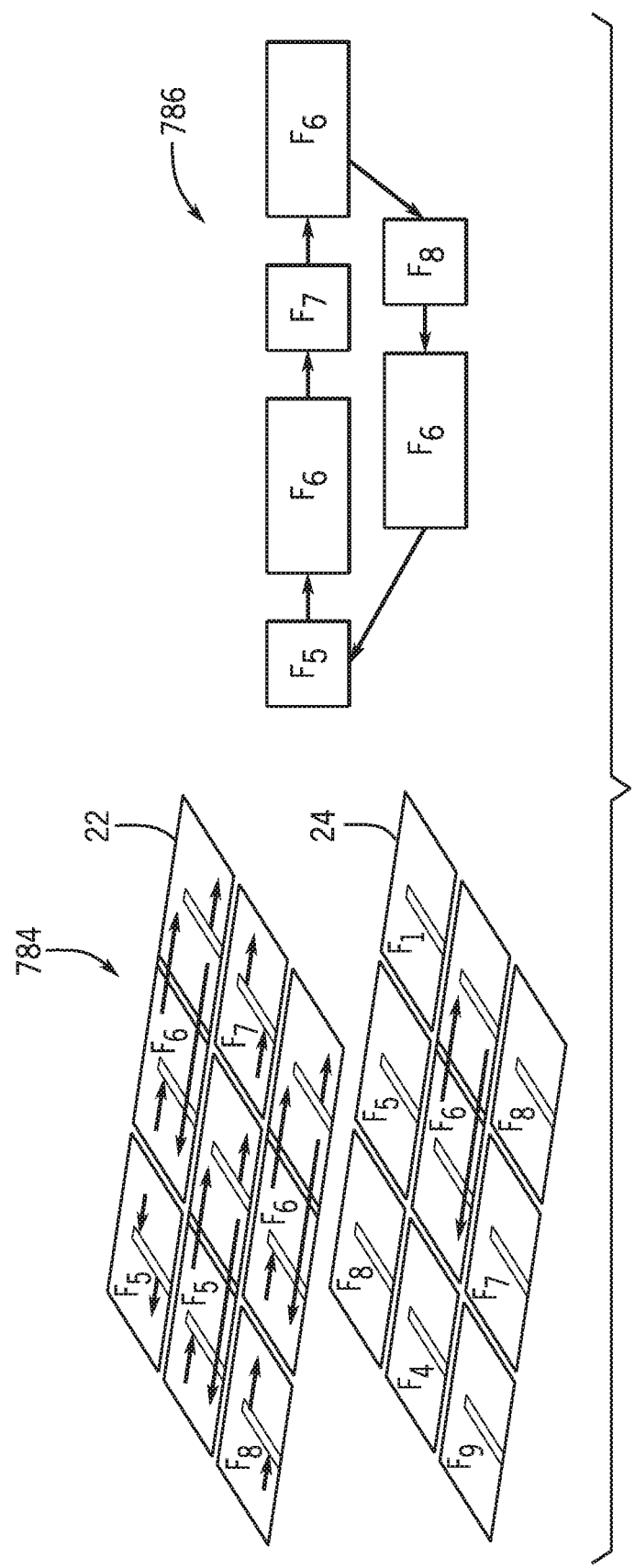
Figure 64:
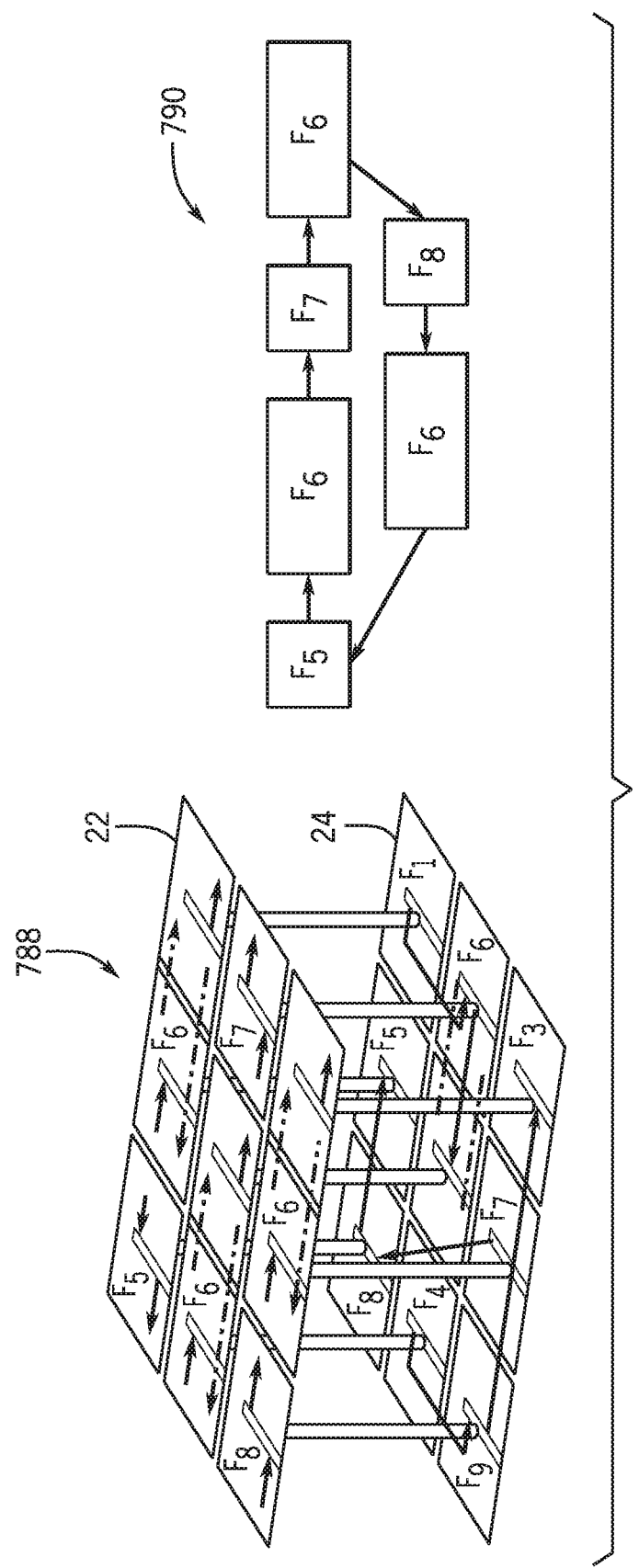
Figure 65:
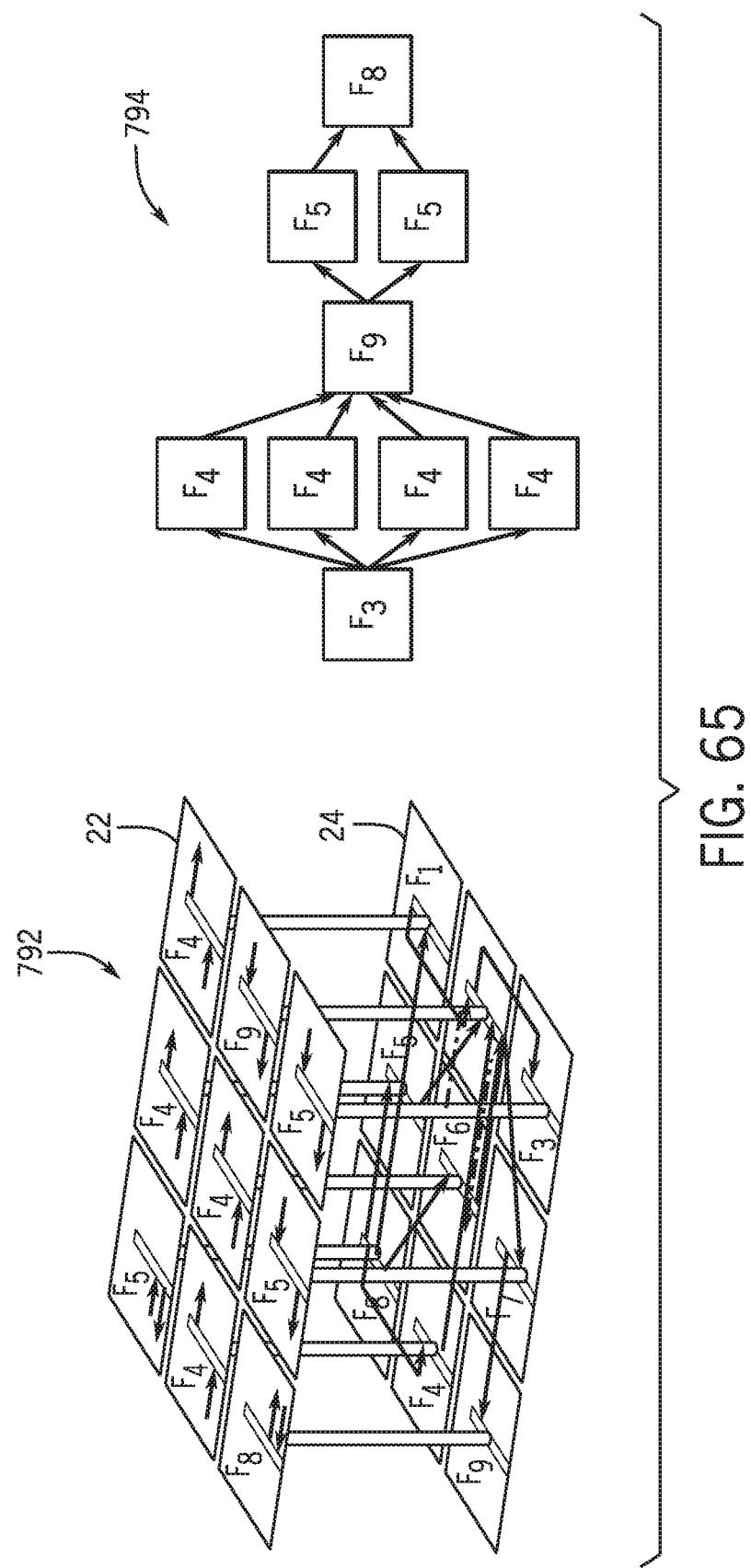
Figure 66:
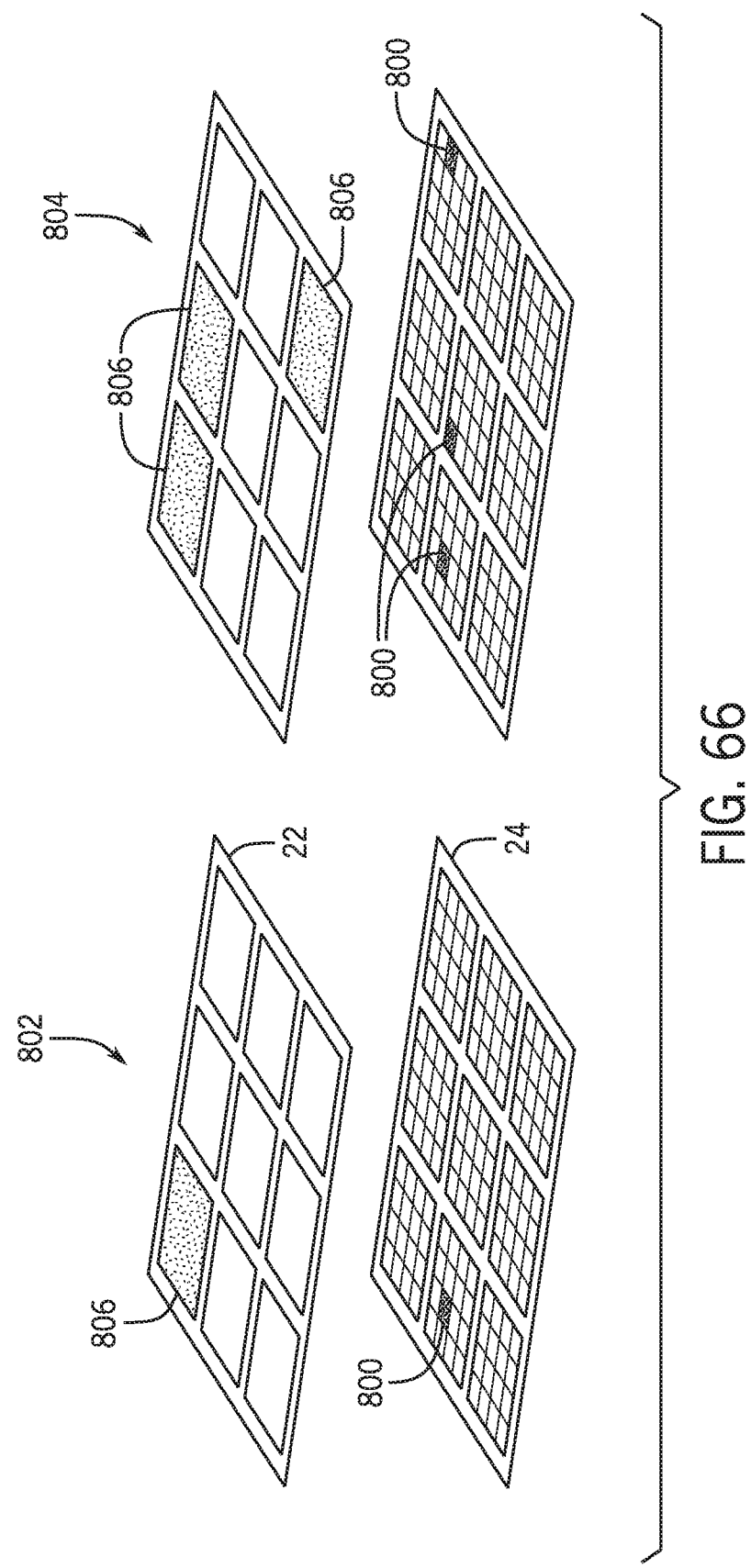
Figure 67:
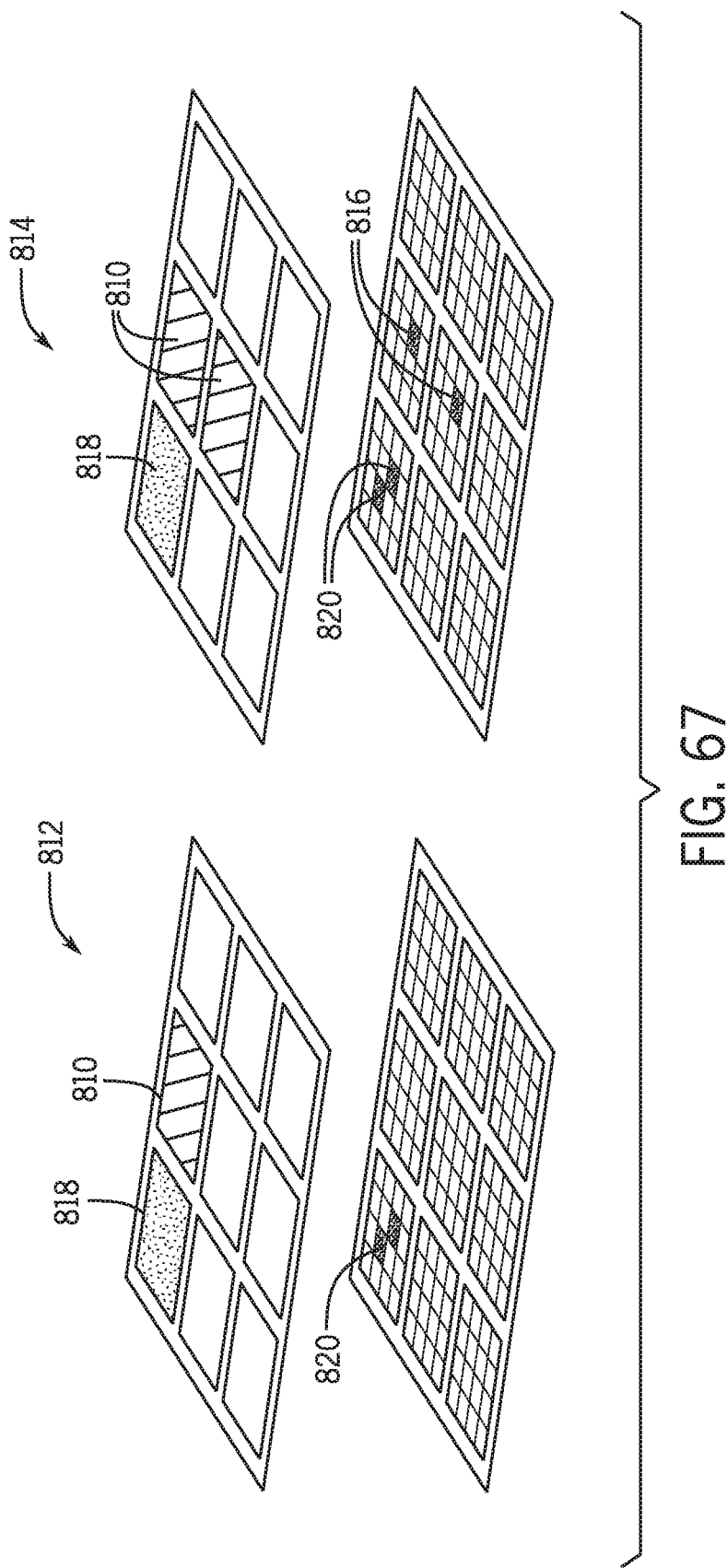
Figure 68:
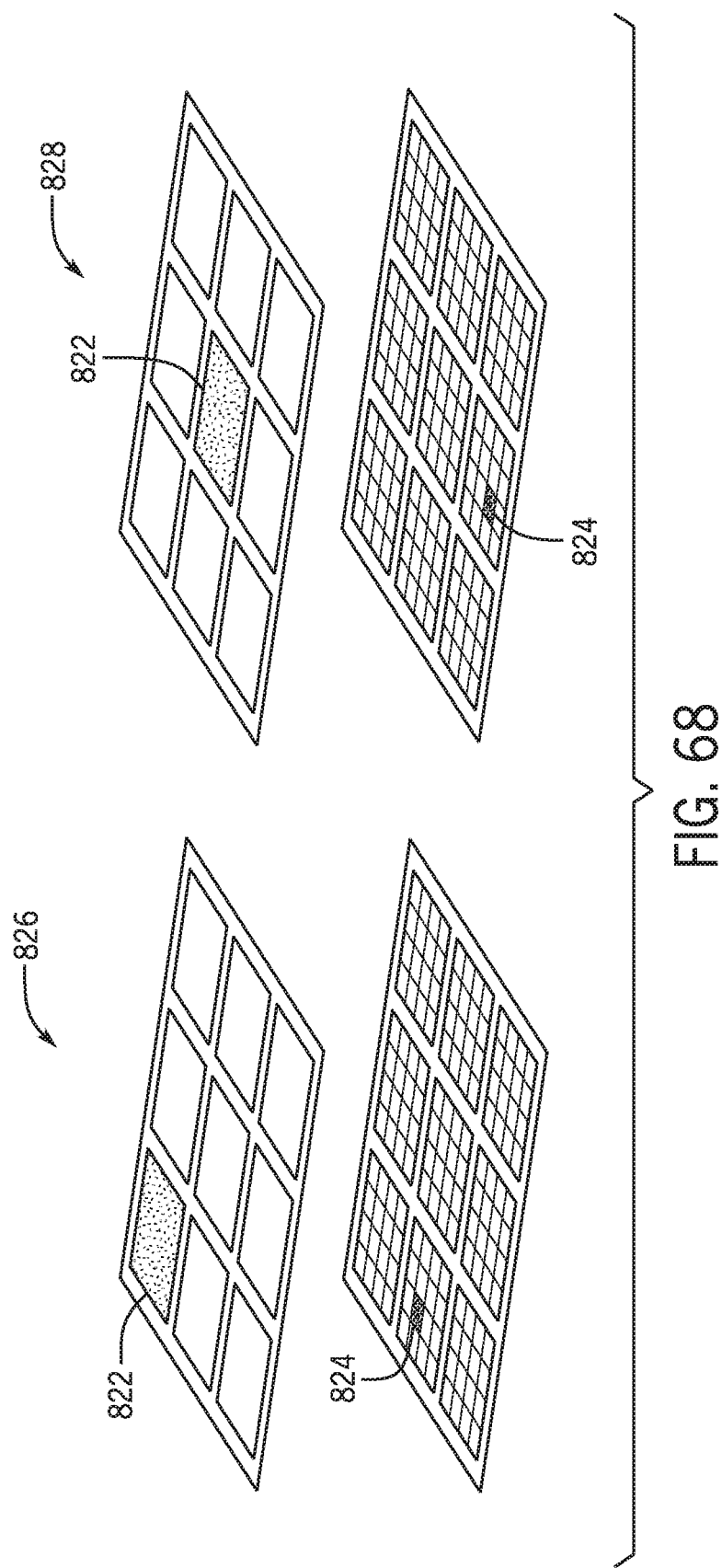
Figure 69:
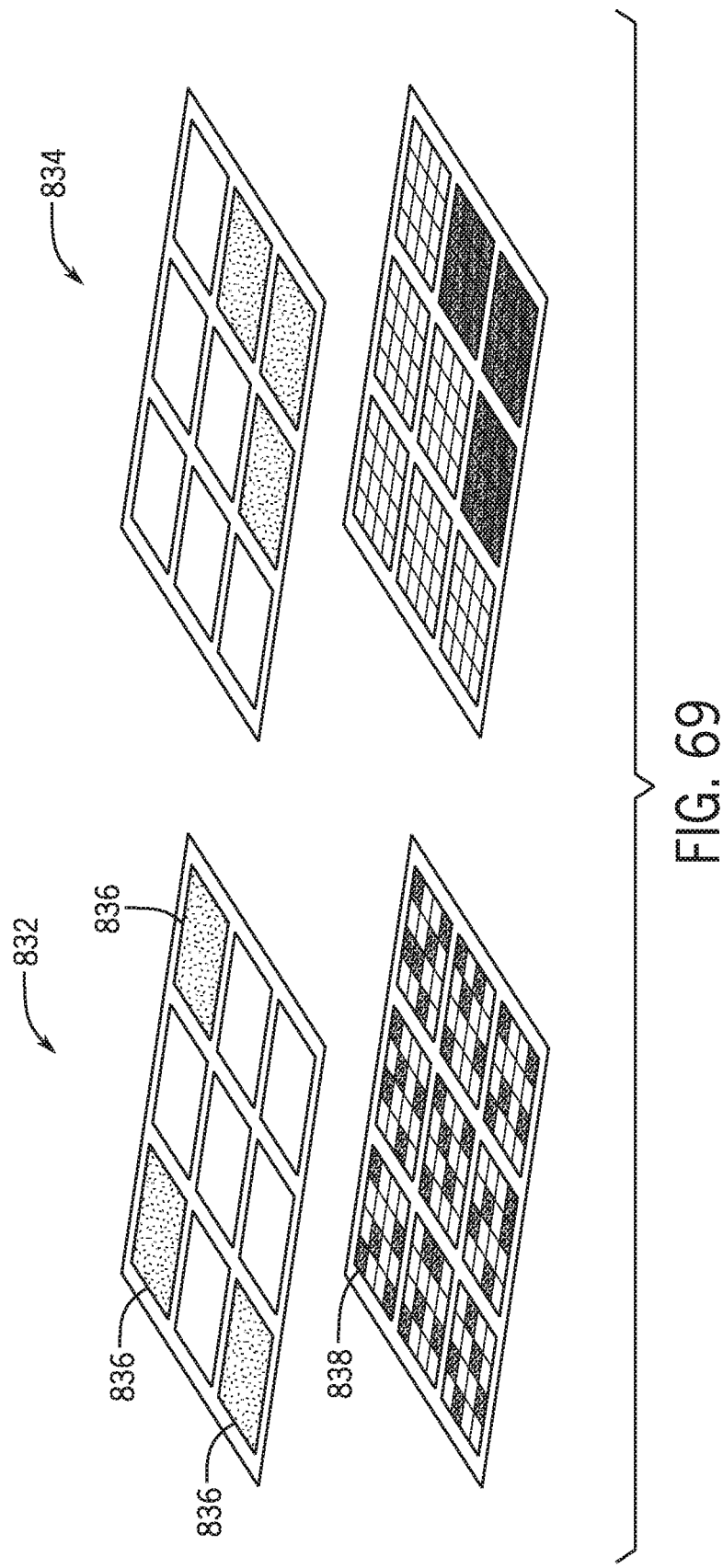
Figure 70:
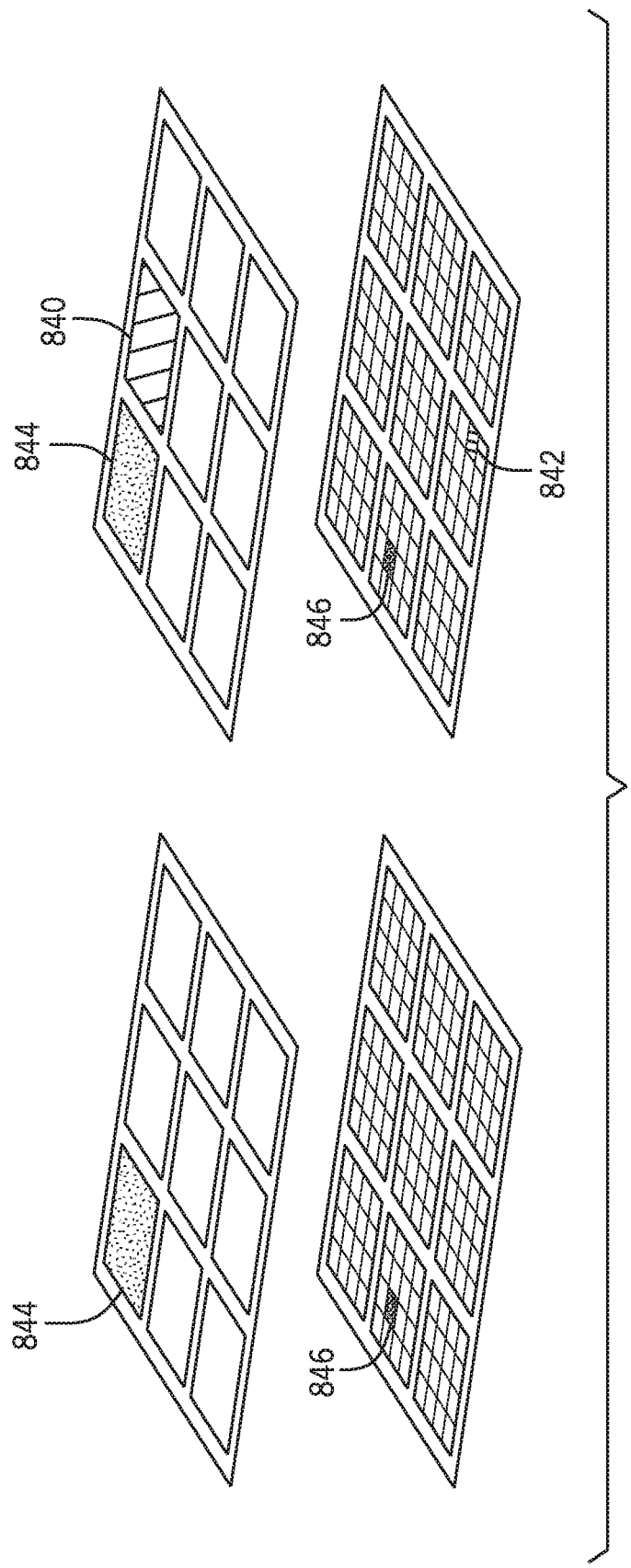
Figure 71:
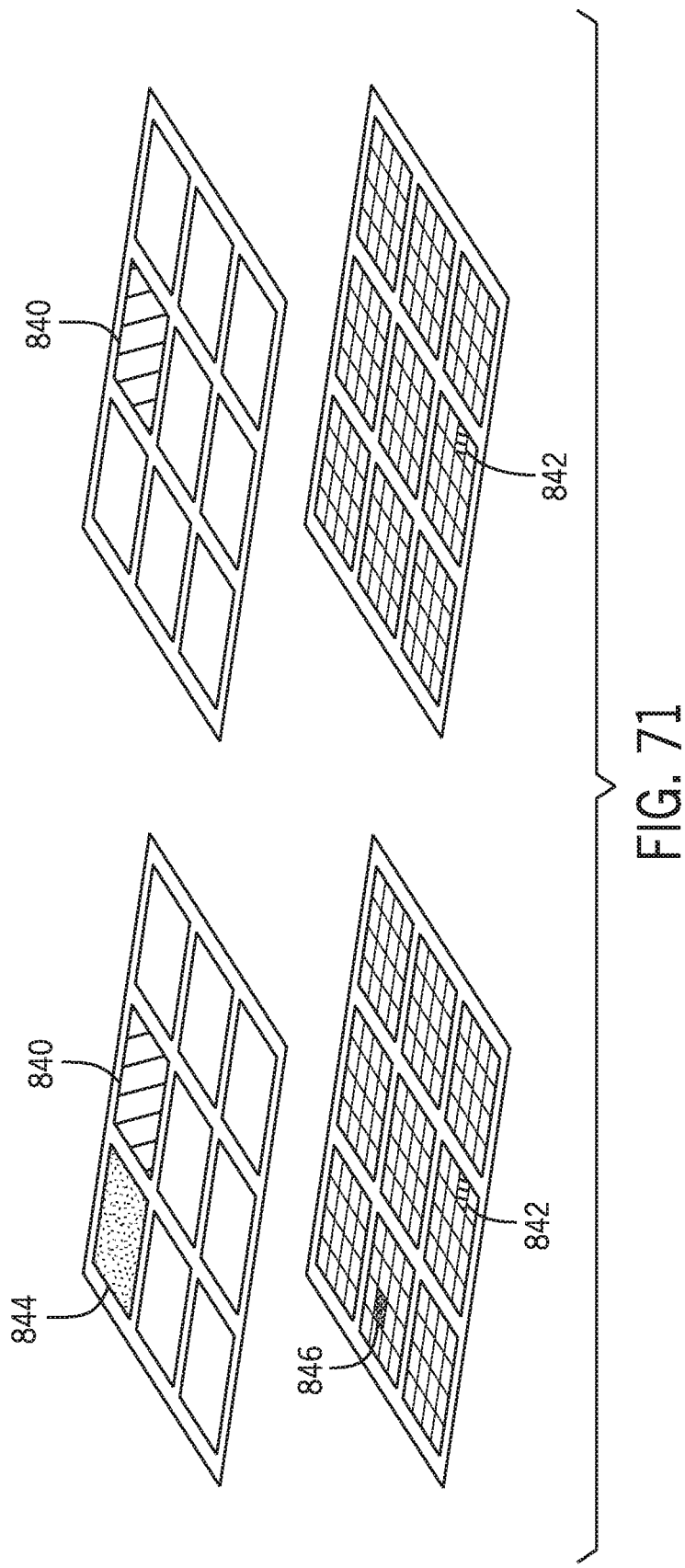
Figure 72:
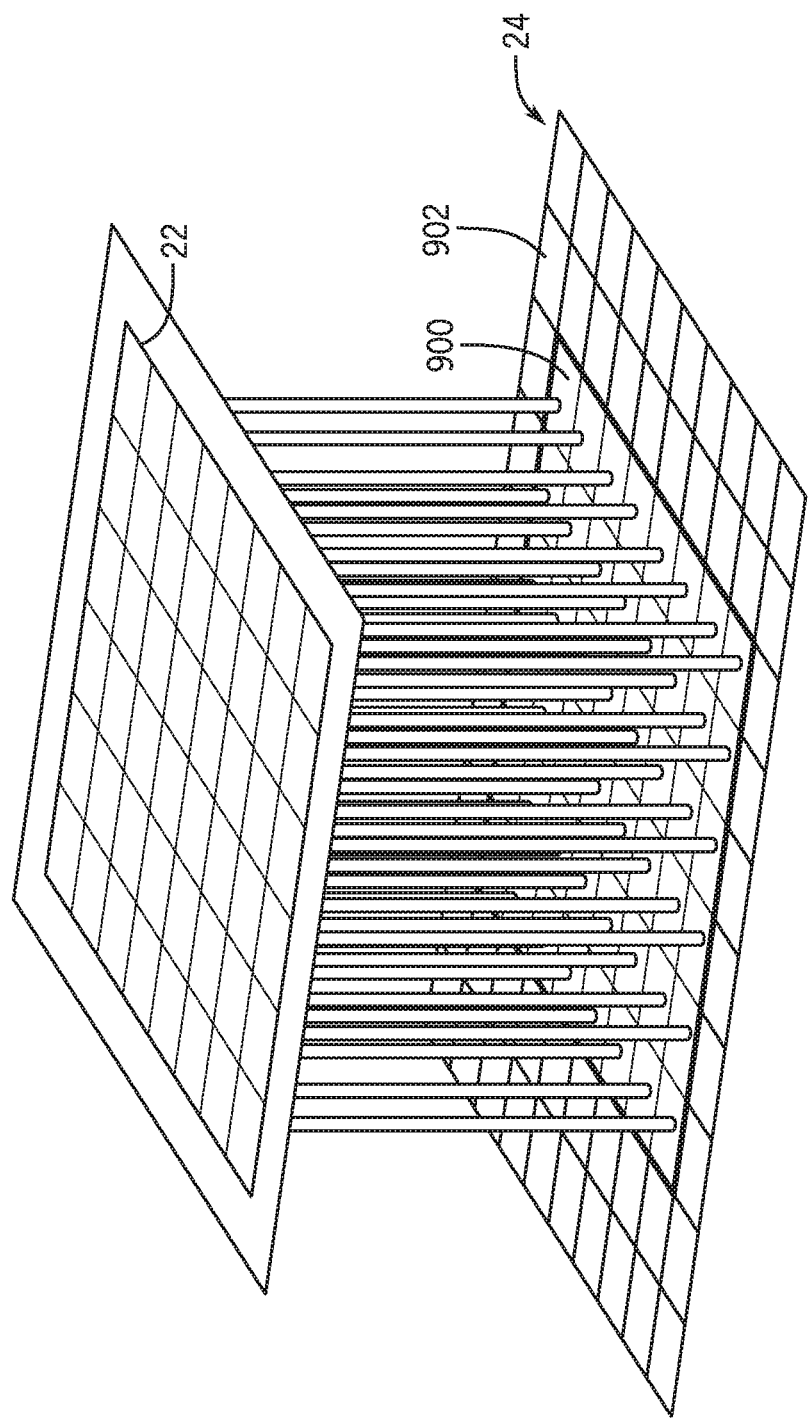

and comparing the coarse-grained aggregation with the fine-grained aggregation of FIG. 16 and the medium-grained aggregation of FIG. 17, in accordance with an embodiment;

FIG. 20 is a diagram illustrating bandwidth aggregation for fine-grained aggregation and medium-grained aggregation of memory, in accordance with an embodiment;

FIG. 21 is a diagram illustrating bandwidth aggregation for non-deterministic latency access of aggregated memory, in accordance with an embodiment;

FIG. 22 is a diagram illustrating shared memory access using base die circuitry for non-uniform memory access aggregation, in accordance with an embodiment;

FIG. 23 is a diagram of memory paging for aggregated base die memory using fabric resources or non-fabric resources, in accordance with an embodiment;

FIG. 24 is a diagram illustrating modification and/or transformation of data by the base using direct memory access (DMA), in accordance with an embodiment;

FIG. 25 is a diagram illustrating a partial reconfiguration (PR) of the programmable logic device using background loading, in accordance with an embodiment;

FIG. 26 is a diagram of a compute-near-memory architecture, in accordance with an embodiment;

FIG. 27 is a block diagram of a data processing system that may use the programmable logic device to rapidly respond to data processing requests, in accordance with an embodiment FIG. 28 is a diagram of a sector of the programmable logic device of FIG. 1, in accordance with an embodiment;

FIG. 29 is a diagram of multiple sectors of the programmable logic device of FIG. 1, in accordance with an embodiment;

FIG. 30 is a logical diagram showing the multiple sectors of FIG. 29 represented as a continuous three-dimensional architecture, in accordance with an embodiment;

FIG. 31 is a diagram illustrating mapping of user logic to FPGA microbump interfaces (FMIBs), in accordance with an embodiment;

FIG. 32 is a diagram illustrating the mapping FMIBs of FIG. 31 and corresponding memory arrays, in accordance with an embodiment;

FIG. 33 is a diagram illustrating the mapping of the FMIBs to the memory arrays of FIG. 32, in accordance with an embodiment;

FIG. 34 is a diagram of the mapping of FIG. 33 with the FMIBs including offsets for the mapped memory arrays, in accordance with an embodiment;

FIG. 35 is a diagram of the mapping of the mapped memory arrays of FIG. 34 to memory space in the fabric die, in accordance with an embodiment;

FIG. 36 is a diagram of address space in the fabric die and base die of FIG. 2, in accordance with an embodiment;

FIG. 37 is a diagram illustrating an address translation between physical and virtual addresses using an address translation unit, in accordance with an embodiment;

FIG. 38 is a diagram illustrating a depiction of the user logic in a determination placement of the user logic and FMIBs to map to a physical address space in the base die, in accordance with an embodiment;

FIG. 39 is a diagram illustrating a depiction of the user logic in a determination of placement of the user logic, the FMIBs, the memory arrays, and fabric memory to map to a physical address space in the base die, in accordance with an embodiment;

FIG. 40 is a diagram showing translation tables used to map memories in the fabric and base die, in accordance with an embodiment;

FIG. 41 is a block diagram of a process used to organize the programmable logic device using a static allocation of memory, in accordance with an embodiment;

FIG. 42 is a diagram of a partial reconfiguration (PR) of the programmable fabric of the programmable logic device of FIG. 2, in accordance with an embodiment;

FIG. 43 is a diagram of a sector-aligned PR of the programmable fabric of the programmable logic device of FIG. 2, in accordance with an embodiment;

FIG. 44 is a diagram of a sector-aligned PR of the programmable fabric of the programmable logic device of FIG. 2 using a network-on-chip (NOC) of the base die to communicate within the fabric, in accordance with an embodiment;

FIG. 45 is a diagram of NOC-based communications of FIG. 44 illustrating data movement in the base die, in accordance with an embodiment;

FIG. 46 is a diagram of sector-aligned PR personas communicating via the based die, in accordance with an embodiment;

FIG. 47 is a diagram of the sector-aligned PR personas of FIG. 46 with a background persona loaded into the base die, in accordance with an embodiment;

FIG. 48 is a diagram of the sector-aligned PR personas of FIG. 47 with the background persona loaded into the fabric die from the base die, in accordance with an embodiment;

FIG. 49 is a diagram depicting a static sequence of PR personas loaded into the fabric die, in accordance with an embodiment;

FIG. 50 is a block diagram of a process for loading personas into the fabric die using background loading of the personas into the base die before loading in the fabric die, in accordance with an embodiment;

FIG. 51 is a diagram of spatial memory paging using PR, in accordance with an embodiment;

FIG. 52 is a diagram of a DMA scatter operation, in accordance with an embodiment;

FIG. 53 is a diagram of a DMA gather operation, in accordance with an embodiment;

FIG. 54 is a diagram of parallel DMA operations, in accordance with an embodiment;

FIG. 55 is a diagram of compute accelerators coupled to memory in the base die of FIG. 2, in accordance with an embodiment;

FIG. 56 is a block diagram of a process using the compute accelerators of FIG. 55, in accordance with an embodiment;

FIG. 57 is a diagram of the compute accelerators of FIG. 55 performing the process of FIG. 56, in accordance with an embodiment;

FIG. 58 is a diagram of a dynamic allocation of memory in the base die of FIG. 2 during operation of the programmable logic device of FIG. 2, in accordance with an embodiment;

FIG. 59 is a diagram of a dynamic allocations of memory in the base die of FIG. 2 during operation of the programmable logic device of FIG. 2, in accordance with an embodiment;

FIG. 60 is a diagram of a dynamic allocation of a compute in the base die of FIG. 2 during operation of the programmable logic device of FIG. 2, in accordance with an embodiment;

FIG. 61 is a diagram of a dynamic allocations of a compute in the base die of FIG. 2 during operation of the programmable logic device of FIG. 2, in accordance with an embodiment;

FIG. 62 is a diagram and data flow for a spatial fabric using sector-aligned PR personas, in accordance with an embodiment;

FIG. 63 is a diagram and data flow for a spatial fabric using the sector-aligned PR personas of FIG. 62 along with additional PR personas loaded into the base die of FIG. 2, in accordance with an embodiment;

FIG. 64 is a diagram and data flow for a spatial fabric using the sector-aligned PR personas loaded into the base die mixed with user memory storage located in the base die, in accordance with an embodiment;

FIG. 65 is a diagram and data flow for a spatial fabric using sector-aligned PR personas, in accordance with an embodiment;

FIG. 66 is a diagram of a copy and paste of a compute in the fabric die, in accordance with an embodiment;

FIG. 67 is a diagram of a copy and paste of a memory in the base die, in accordance with an embodiment;

FIG. 68 is a diagram of a relocation of a memory of the base die and a compute of the fabric die using a move operation, in accordance with an embodiment;

FIG. 69 is a diagram of a relocation of memories of the base die and computes of the fabric die using parallel move operations, in accordance with an embodiment;

FIG. 70 is a diagram of a simultaneous allocation of a compute and memory, in accordance with an embodiment;

FIG. 71 is a diagram of a simultaneous de-allocation of a compute and memory, in accordance with an embodiment; and FIG. 72 is a diagram of memory usage memory of the base die of FIG. 2 that is not vertically below the fabric die of FIG. 2, in accordance with an embodiment.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Programmable logic devices are devices that may include customizable and reprogrammable circuitry that can perform digital operations and/or logic functions. To that end, programmable logic devices may be programmed by loading configuration data into configuration memory (e.g., configuration random access memory (CRAM)) that may be embedded in the programmable fabric. The configuration memory may store a logic design (e.g., state machines, truth tables, functions, etc.) that may control configurable logic circuitry to facilitate performance of the programmed tasks. The flexibility in the operations of programmable logic devices also allows reprogramming of the configuration memory (e.g., programming a portion of a circuit design). For example, a system using programmable logic devices may change context (e.g., change the type of operation performed) by loading new configuration data to the configuration memory. Due to the flexibility afforded by the customizable and reconfigurable design, programmable logic devices are increasingly used as accelerators for machine learning, video processing, voice recognition, image recognition, and many other highly specialized tasks, particularly those that would be too slow or inefficient in software running on a processor. As the complexity of the tasks increases, the dimensions of the configuration data may also increase and may benefit from a high-speed interface for loading configuration memory.

As discussed above, programmable circuitry in the programmable logic device (e.g., configuration memory, programmable logic elements, and embedded memory) may send and receive data (e.g., configuration data, user data, incoming data for processing by the programmable logic elements, data processed by the programmable logic data elements). In order to exchange data with external circuitry or other programmable circuitry in the programmable logic device, the device may include high-speed interfaces. A high-speed interface may be used to increase the speed of the programming and/or reprogramming operations, which may reduce the amount of idle time during which the reprogramming tasks is taking place. The high-speed interface may also be used to increase the speed of data transfer from the programmable logic elements, to facilitate data processing operations. Moreover, programmable logic devices may also have user memory that may be directly accessed by the interface. Direct access to the user memory may facilitate diagnostic operations, such as debugging, testing, or emulation of a system design. The direct access further may provide faster access to the user memory to increase the overall speed of diagnostic tasks.

In some embodiments, the programmable logic device may utilize one or more die, such as a programmable logic (or fabric) die having a fabric of programmable logic elements and a base die having fabric support circuitry, in a three-dimensional arrangement. In some systems, the programmable logic die may be sectorized, as detailed below. In such systems, the fabric support circuitry in the base die may include network on chip (NOC) circuitry to send or receive data (e.g., configuration data, user data) with systems external to the programmable logic device and/or between sectors in the programmable logic devices. The fabric support circuitry may also include sector-aligned memory. In some embodiments, the sector-aligned memory may operate as a temporary storage (e.g., cache) for the configuration data or user memory. By incorporating the NOC into the fabric support circuitry, the NOC may resolve periphery shoreline bandwidth issues of the fabric, while increasing the bandwidth of the fabric. In addition, the communication routes available via the NOC embedded in the fabric support circuitry may enable the fabric to implement design relocations or reconfigurations, provide alternate pathways around powered-down sectors of the fabric, and provide security isolation features. The NOC may be a source of configuration data or fabric data and may be integrated to access the multi-purpose high-speed interface. With the foregoing in mind, the embodiments described herein are related to the use of sector-aligned memory to increase the speed and the capacity of low-latency memory for programmable logic applications. Aggregation of bandwidth between the programmable die and the base die is also discussed.

In addition to the above-described features, the fabric support circuitry may include, among other things, a device controller (sometimes referred to as a secure device manager (SDM)), a sector controller (sometimes referred to as a local sector manager (LSM), region controller), a configuration network on chip (CNOC), data routing circuitry, local (e.g., sectorized, sector-aligned, region-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded INTEL® XEON® processor by Intel Corporation of Santa Clara, Calif.) or an interface to connect to a processor (e.g., an interface to an INTEL® XEON® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die.

By way of introduction, FIG. 1 illustrates a block diagram of a system 10 that may employ a programmable logic device 12 that can communicate via a NOC disposed on a separate die (e.g., base die), in accordance with embodiments presented herein. Using the system 10, a designer may implement a circuit design functionality on an integrated circuit, such as a reconfigurable programmable logic device 12, such as a field programmable gate array (FPGA).

The designer may implement a circuit design to be programmed onto the programmable logic device 12 using a design description 14. The design description 14 may include a register-transfer level (RTL) design abstraction with constraints. Additionally or alternatively, the design description 14 may include high-level programming languages that may be converted to the a lower-level design description. For instance, the design description 12 may be specified using, OpenCL, C, data parallel C++ (DPC++), and the like. The design descriptions 14 may be submitted to a compiler 16, such as a version of INTEL® QUARTUS® by Intel Corporation of Santa Clara, Calif., to generate a low-level circuit-design defined by a bitstream 18, sometimes known as a program object file and/or configuration program, which programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform machine learning functions, video processing functions, voice recognition functions, image recognition functions, networking functions, or other highly specialized task.

To carry out the systems and methods of this disclosure, the programmable logic device 12 may take any suitable form that includes the multi-purpose high-speed parallel interface, which increases the speed of exchange of fabric data and/or configuration data across different portions (e.g., sectors, multiple die) of the programmable logic device 12. The multi-purpose parallel interface may also allow reconfiguration of portions of the programmable logic device 12 while concurrently operating a circuit design by allowing concurrent exchange of fabric data and configuration data through distinct microbump channels. As such, in one embodiment, the programmable logic device 12 may have two separate integrated circuit die coupled via the multi-purpose parallel interface. The integrated circuit die may include controllers for the multi-purpose parallel interface, which may be hard coded circuitry, a soft IP block, and/or custom logic.

One example of the programmable logic device 12 is shown in FIG. 2, but any suitable programmable logic device may be used. In the example of FIG. 2, the programmable logic device 12 includes fabric die 22 and respective base die 24 that are connected to one another via microbumps 26. Although microbumps are discussed throughout, any bonding techniques that are suitable for coupling the fabric die 22 and the base die 24 together may be used. Furthermore, although the microbumps 26 are located in the FIG. 2 in a particular location (e.g., at the edge), the microbumps 26 may be located at any suitable location. The microbumps 26 may couple an interface in the fabric die 22 (e.g., a fabric or FPGA microbump interface (FMIB)) to an interface in the base die 24 (e.g., a base microbump interface (BMIB)), as detailed below. In the illustrated diagram of FIG. 2, the fabric die 22A and base die 24A are illustrated in a one-to-one relationship and in an arrangement in which a single base die 24B may attach to several fabric die 22B and 22C. Other arrangements, such as an arrangement in which several base die 24 may attach to a single fabric die 22, or several base die 24 may attach to several fabric die 22 (e.g., in an interleaved pattern along the x- and/or y-direction) may also be used. Peripheral circuitry 28 may be attached to, embedded within, and/or disposed on top of the base die 24. The base die 24 may attach to a package substrate 32 via bumps 34. The bumps 34 may include controlled collapse chip connection (C4) bumps. The base die 24 may include one or more through-silicon vias (TSVs) 35 that enable the fabric die 22 to couple to the bumps 34 via the microbumps 26. In the example of FIG. 2, two pairs of fabric die 22 and base die 24 are shown communicatively connected to one another via a silicon bridge 36 (e.g., an embedded multi-die interconnect bridge (EMIB) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

Figure 3:
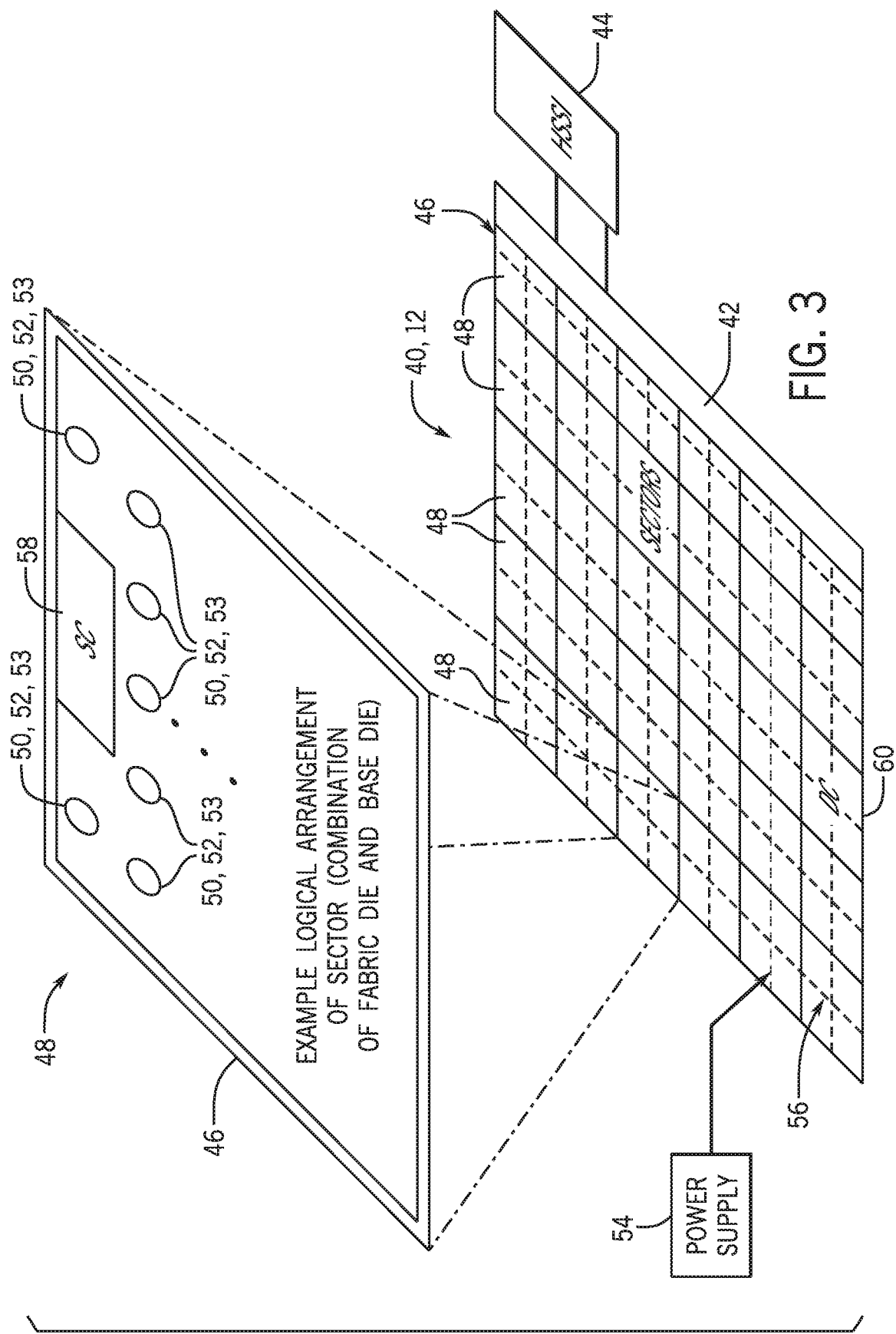
FIG. 3 is a block diagram of an example logical arrangement of the programmable logic device of FIG. 1, in accordance with an embodiment.

In combination, the fabric die 22 and base die 24 may operate as a programmable logic device such as a field programmable gate array (FPGA) device. For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when both the fabric die 22 and the base die 24 operate in combination. That is, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry 44 for driving signals off of the FPGA 40 and for receiving signals from other devices. The transceiver circuitry 44 may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion).

Each programmable logic sector 48 may include a number of programmable logic elements 50 (also referred herein as FPGA fabric) having operations defined by configuration memory 52 (e.g., configuration random access memory (CRAM)). The programmable logic elements 50 may include combinatorial or sequential logic circuitry. For example, the programmable logic elements 50 may include look-up tables, registers, multiplexers, routing wires, and so forth. A designer may program the programmable logic elements 50 to perform a variety of desired functions. The programmable logic sector 48 may also include user memory 53. User memory may be in the form of embedded random access memory (ERAM), and/or memory blocks, such as M20K. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while the illustrated system includes 29 programmable logic sectors 48 shown, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 or user memory 53 based on control signals from the device controller 60. To that end and as detailed below, the device controller 60 may employ a data register (DR) and/or an address register (AR) to access data from the configuration memory 52 or user memory 53 of the various programmable logic sectors 48.

In addition to these operations, the sector controller 58 and/or device controller 60 may be augmented with additional capabilities. As described herein, a high-speed parallel interface may be used to coordinate memory transactions between local in-fabric memory (e.g., local fabric memory or CRAM being used for data storage) and sector-aligned memory associated with that particular programmable logic sector 48. Moreover, the NOC may be used to facilitate memory transactions between multiple sectors, multiple die, and/or between the programmable logic device and external systems, as discussed herein. The NOC may further be employed for decrypting configuration data (bitstreams) 18, for locally sequencing reads and writes to implement error detection and correction on the configuration memory 52 or user memory 53, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM implementation may use more memory than would be used to store only one copy of each routine. This additional memory may allow each routine to have multiple variants depending on "modes," and the local controller may be placed into any of those modes. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

The sector controller 58 may include circuitry to manage the high-speed parallel interface (e.g., DR Intercept interface (DRIP)). The high-speed parallel interface may allow fast loading of DR circuitry, which may be used for configuration operations (e.g., CRAM operations), user memory operations (e.g., ERAM operations), and/or test (e.g., scan chains operations). For example, a high-speed interface controller (e.g., DRIP Controller), located in a fabric die, and a base die DRIP Controller, located in a base die, may be used to coordinate operations in the microbump interface, and may be part of the sector controller 58. The DRIP controllers and the NOC circuitry may also coordinate operations to perform multi-sector high-speed data exchange between the base die 24 and a respective fabric die 22. Each sector controller 58 thus may communicate with the device controller 60, which may coordinate the operations of the sector controllers 58 and convey commands initiated from outside the FPGA 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable logic elements 50 may include one or more logic elements (wires, gates, registers, etc.). For example, during programming, configuration data is loaded into the configuration memory 52 using transceiver circuitry 44 and input/output circuitry 42. In one example, the configuration memory 52 may be implemented as configuration random-accessmemory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to configure the gates of metal-oxide-semiconductor (MOS) transistors that control the states of the programmable logic elements 50 or programmable components of the interconnection resources 46.

Figure 4:
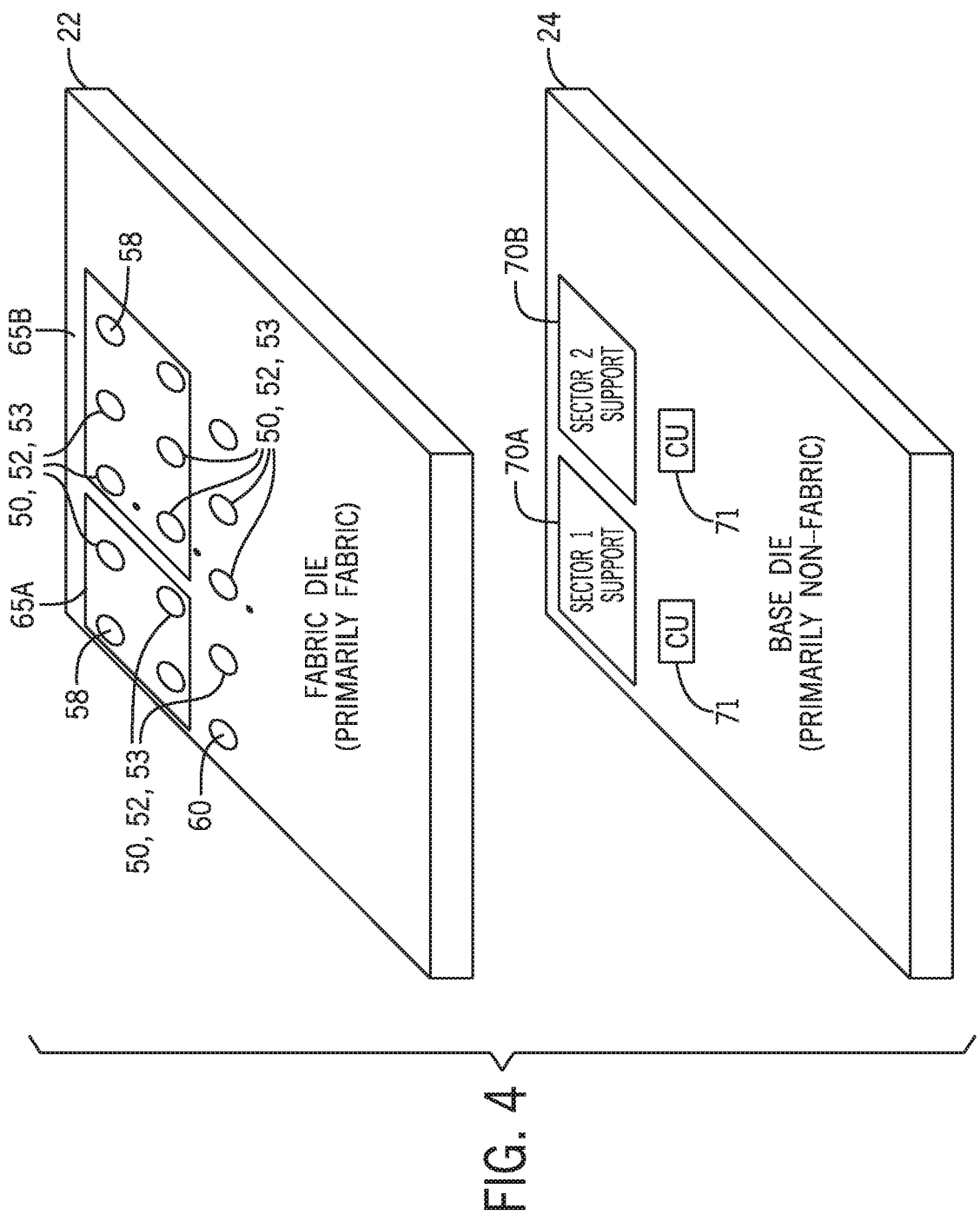
FIG. 4 is a block diagram showing a fabric die of the programmable logic device that contains programmable logic fabric with embedded memory and a base die of the programmable logic device that contains non-fabric circuitry that support operations of the fabric die, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50, configuration memory 52, and user memory 53, and may be arranged in sectors such as sectors 65A and 65B. In some cases, this may also entail certain fabric control circuitry such as the sector controller (SC) 58 or device controller (DC) 60. The base die 24 may include supporting circuitry to operate the programmable logic elements 50, configuration memory 52, and user memory 53. As an example, the programmable logic elements 50 may exchange fabric data with the supporting circuitry in the base die 24 and configuration memory may exchange configuration data with the supporting circuitry in the base die 24. As shown here, the base die 24 includes support circuitry 70A, which may support fabric sector 65A, and support circuitry 70B, which may support fabric sector 65B. The base die 24 may also include support circuitry for other sectors of the fabric die 22.

Figure 5:
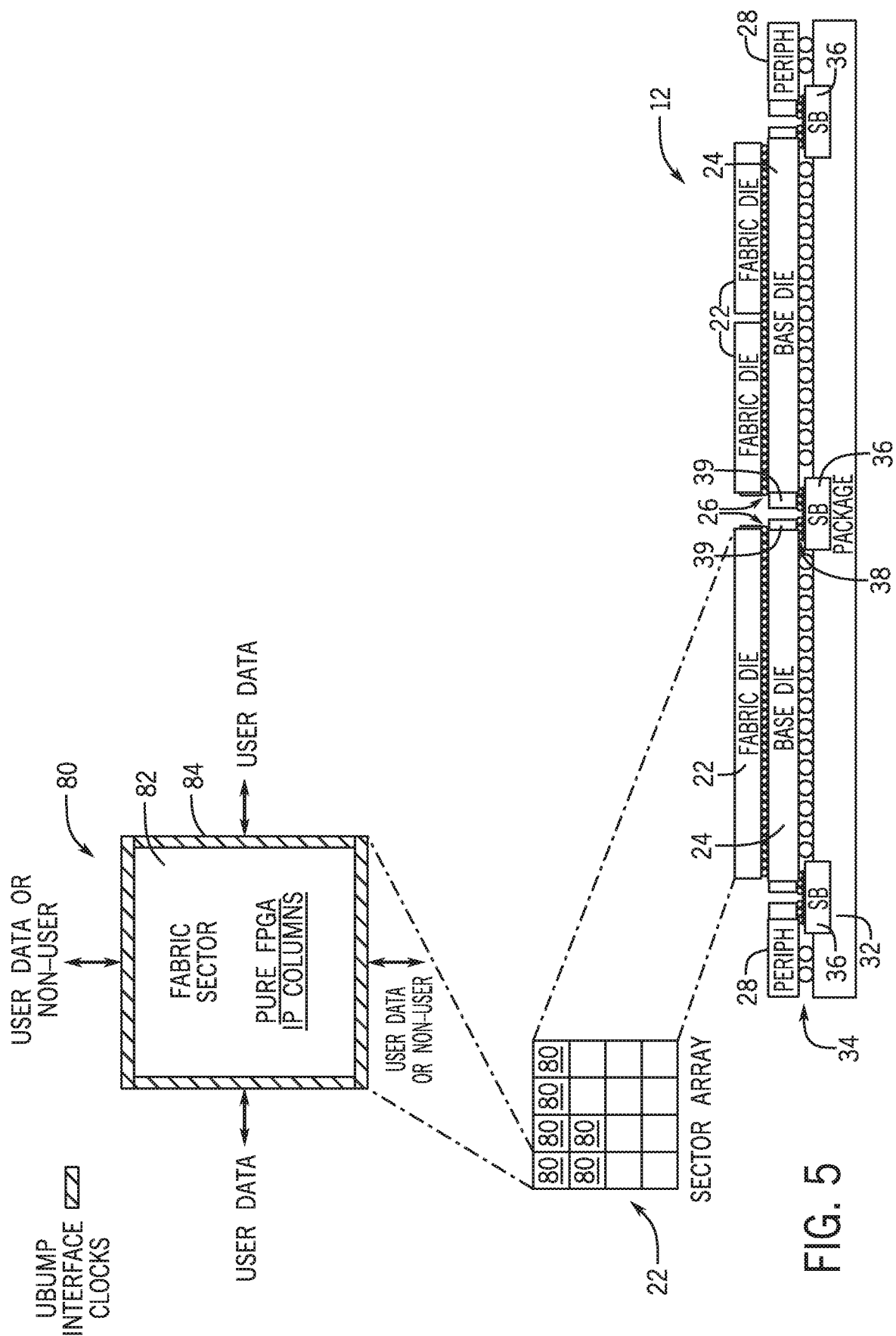
FIG. 5 is a block diagram of a topology of the fabric die having circuitry for a multi-purpose parallel interface, in accordance with an embodiment.
Figure 6:
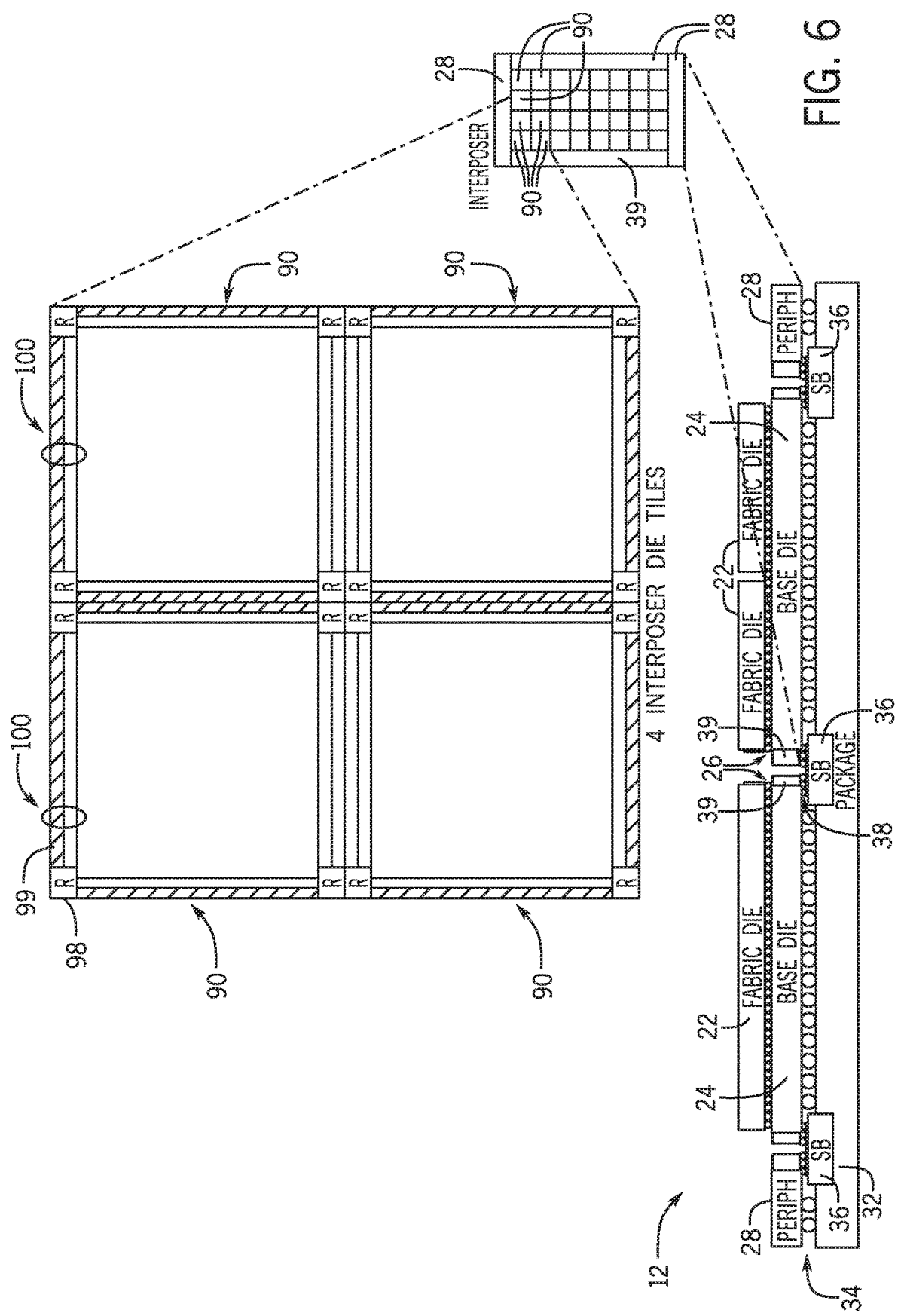
FIG. 6 is a block diagram of a topology of the base die having an embedded network-on-chip (NOC) and of circuitry for a multi-purpose parallel interface, in accordance with an embodiment.

As discussed above, the multi-purpose interface may benefit from the presence of NOC circuitry in the base die (e.g., base die 24). The block diagrams in FIGS. 5, 6, 7, and 8 illustrate examples of physical arrangements of the fabric die 22 and the base die 24 that may implement a NOC system. For example, a physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable logic elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a microbump interface to connect to the base die 24.

FIG. 6 provides an example complementary arrangement of the base die 24. The base die 24 may represent an active interposer with several sectors 90 surrounded by peripheral circuitry 28 and the silicon bridge interface 39. Although not shown in FIG. 6, each sector 90 may include a variety of fabric support circuitry, which may described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network on chip (NOC) 100. In the embodiment depicted in FIG. 6, the NOC 100 may be integrated between each sector 90 of the base die 24. As such, the NOC 100 may enable each of the sectors 90 disposed on the base die 24 to be accessible to each other. Indeed, the NOC 100 may provide communication paths between each sector 90 via routers 98 or the like. In certain embodiments, the routers 98 may route user data between sectors 90 of the base die 24, to sectors 48 of the fabric die 22, and the like. Since the base die 24 is separate from the fabric die 22, the NOC 100 may be continuously powered on, even when various sectors 48 of the fabric die 22 are powered down. In this way, the NOC 100 of the base die 24 may provide an available route to different sectors 48 of the fabric die 22 regardless of the positions of powered down sectors 48.

In some embodiments, the NOC 100 may include features such as Quality of Service management, Security Management, Debug and Performance measurement and Address virtualization services, and the like. In addition, the NOC 100 may support caching features and interconnect protocols allowing the memory components of the programmable logic device 12 to be part of a coherent memory system supported by a caching agent.

By vertically aligning the fabric die 22 and the base die 24, the NOC 100 disposed on the base die 24 may physically span across the same surface area of the fabric die 22. In certain embodiments, microbumps may be positioned at various locations between the base die 24 and the fabric die 22 to enable the NOC 100 to communicate data between sectors 90 of the base die and sectors 48 of the fabric die 22. In the example embodiment of the NOC 100 depicted in FIG. 6, the NOC 100 may be positioned around each sector 90, which may be aligned with a corresponding sector 48 of the fabric die 22. As such, the NOC 100 may provide additional horizontal and vertical routing wires or pathways to facilitate communication between sectors 48 of the fabric die 22, between sectors 90 of the base die 24, or between sectors 48 of the fabric die 22 and sectors 90 of the base die 24. The additional horizontal and vertical lines provided by the NOC 100 may reduce the amount of quantization performed by the programmable logic device 12.

Figure 7:
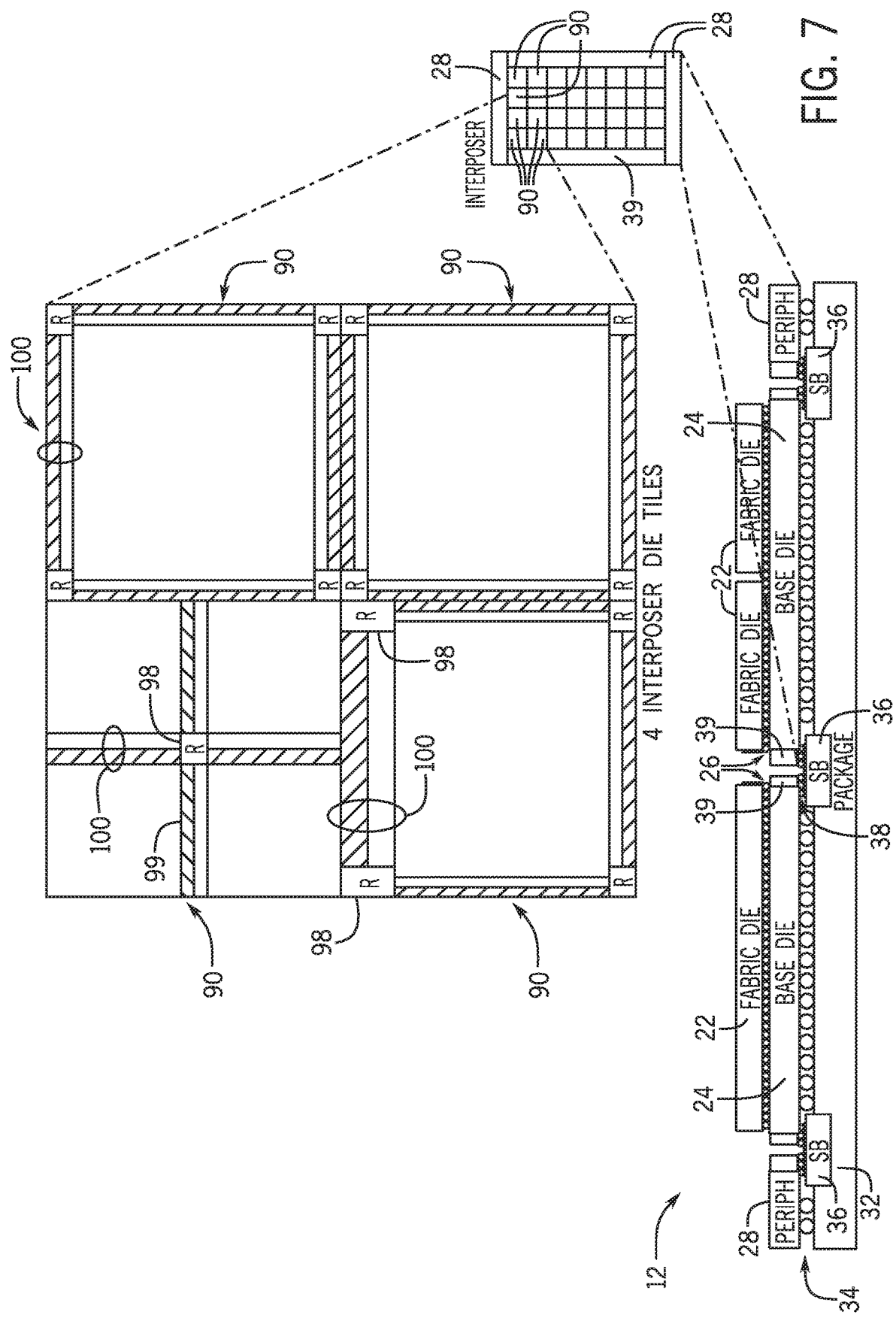
FIG. 7 is a block diagram of a topology of the base die having circuitry for a multi-purpose parallel interface and a different configuration of the embedded NOC, in accordance with an embodiment.

Although data or configuration pathways 99 of the NOC 100 are illustrated in FIG. 6 as being routed around the sectors 90 of the base die 24, it should be noted that data or configuration pathways 99 of the NOC 100 may be routed across the base die 24 in any suitable manner. By way of example, FIG. 7 illustrates the NOC 100 implemented with data or configuration pathways 99 disposed across the center of the sector 90. As such, the router 98 may also be positioned in the center of the sector 90.

In addition, in some embodiments, the data or configuration pathways 99 of the NOC 100 may be wider in certain sectors 90 as compared to other sectors 90. In any case, it should be understood that the data or configuration pathways 99 may be incorporated into the base die 24, such that they serve desired functions or operations that may be specific to the operations performed by the programmable logic device 12. That is, if the programmable logic device 12 includes functions that involve regularly transferring data across the fabric die 22, it may be beneficial to use more of the base die 24 space to include data or configuration pathways 99 that take up more space on the base die 24 to provide increased bandwidth.

With the foregoing in mind, the NOC 100 may include the data or configuration pathways 99 that allow for efficient multi-dimensional (e.g., three-dimensional, two-dimensional) integration of the NOC 100 on the programmable logic device 12. Indeed, the NOC 100 may enable the fabric die 22 to connect to the peripheral circuitry 28 and other parts of the fabric without communicating via the fabric die 22 or the programmable logic sectors 48 of the fabric die 22. That is, by employing the NOC 100 in the base die 24, the programmable logic device 12 may increase the available bandwidth for communication across the programmable logic sectors 48 because the NOC 100 provides additional pathways to different parts of the programmable logic device 12.

In addition, the NOC 100 resolves shoreline issues, supports fast reconfiguration, and enables relocate-ability of functions in the programmable logic sectors 48 based on the increased bandwidth and accessibility to different portions of the fabric die 22 via the base die 24. In some embodiments, the portions may include or be equal to the sectors 48. However, in certain embodiments, the portions may include embedded processors, such as an INTEL® XEON® processor or a reduced-instruction processor. Furthermore, the relocate-ability of the functions may be at least partially attributable to the regularity of the sectors 48. In other words, at least some portion of the sectors may be similarly arranged that enables movement of functions between sectors 48 readily since the two sectors for the function are similar due to a limited number of types of sectors 48.

Figure 9:
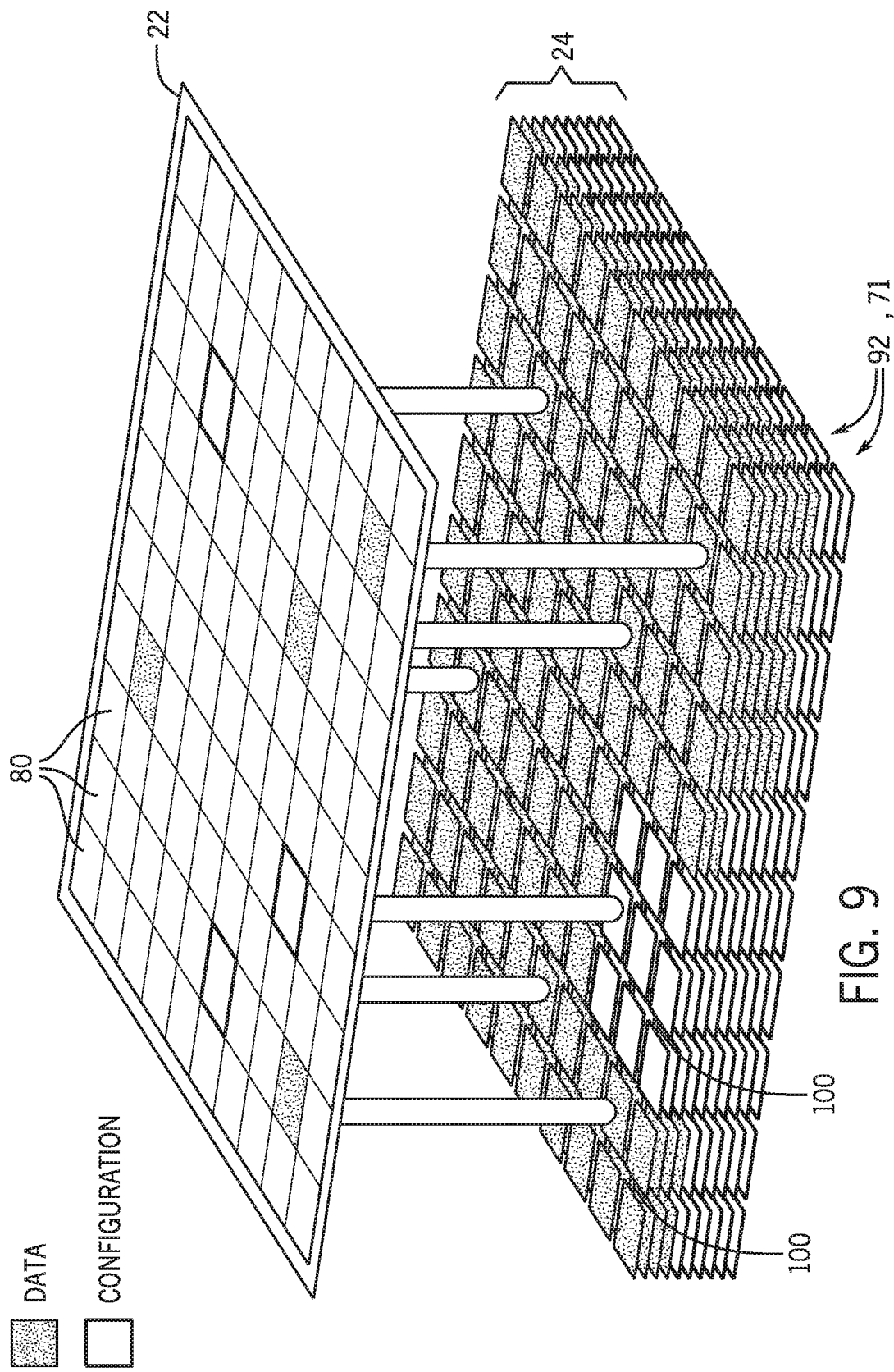
FIG. 9 is a block diagram of sector-aligned memory having embedded NOC circuitry integrated with a sector-aligned memory and configurable to exchange data with the programmable logic die via the multi-purpose parallel interface, in accordance with an embodiment.

As shown in FIG. 9, the NOC 100 may be integrated with the sector-aligned memory 92 of the base die 24, such that it spans across the entire base die 24. As such, the NOC 100 may access different fabric sectors 80 through various routes in the base die 24. In addition, the additional routes enable the NOC 100 to serve as functional bypass around powered down sectors 80 without affecting the performance of the programmable logic device 12 by avoiding blockages across the programmable logic sectors 48 of the programmable logic device 12. That is, in some situations, certain sectors 80 of the fabric die 22 may be powered down, thereby preventing communication across the powered down sectors 80. In this case, the NOC 100 may provide alternate communication pathways around the powered down sectors 80 to maintain communicative connectedness across the sectors 80 of the fabric die 22 regardless of whether certain sectors 80 are powered down.

The design relocate-ability of the programmable logic sectors 48 is also enhanced by the NOC 100 because the NOC 100 may access different sectors 80 of the fabric die 22. That is, the increased communication flexibility provided by the NOC 100 being disposed in the base die 24 enables the programmable logic sectors 48 to be repositioned in various sectors 80 of the fabric die 22, while maintaining communication capabilities between the relocated programmable logic sectors 48.

Although FIGS. 6 and 7 illustrate two embodiments with different configurations for the NOC 100, it should be noted that the base die 24 may be configured to include a data or configuration pathways 99 in a variety of shapes, forms, positions, and the like. For example, the data or configuration pathways 99 of different sectors 90 may overlap each other, the entire sector 90 may incorporate the data or configuration pathway 99, or the like. In addition, microbumps may be used to facilitate communication between the NOC 100 and various sectors 80 of the fabric die 22 and the like.

Figure 8:
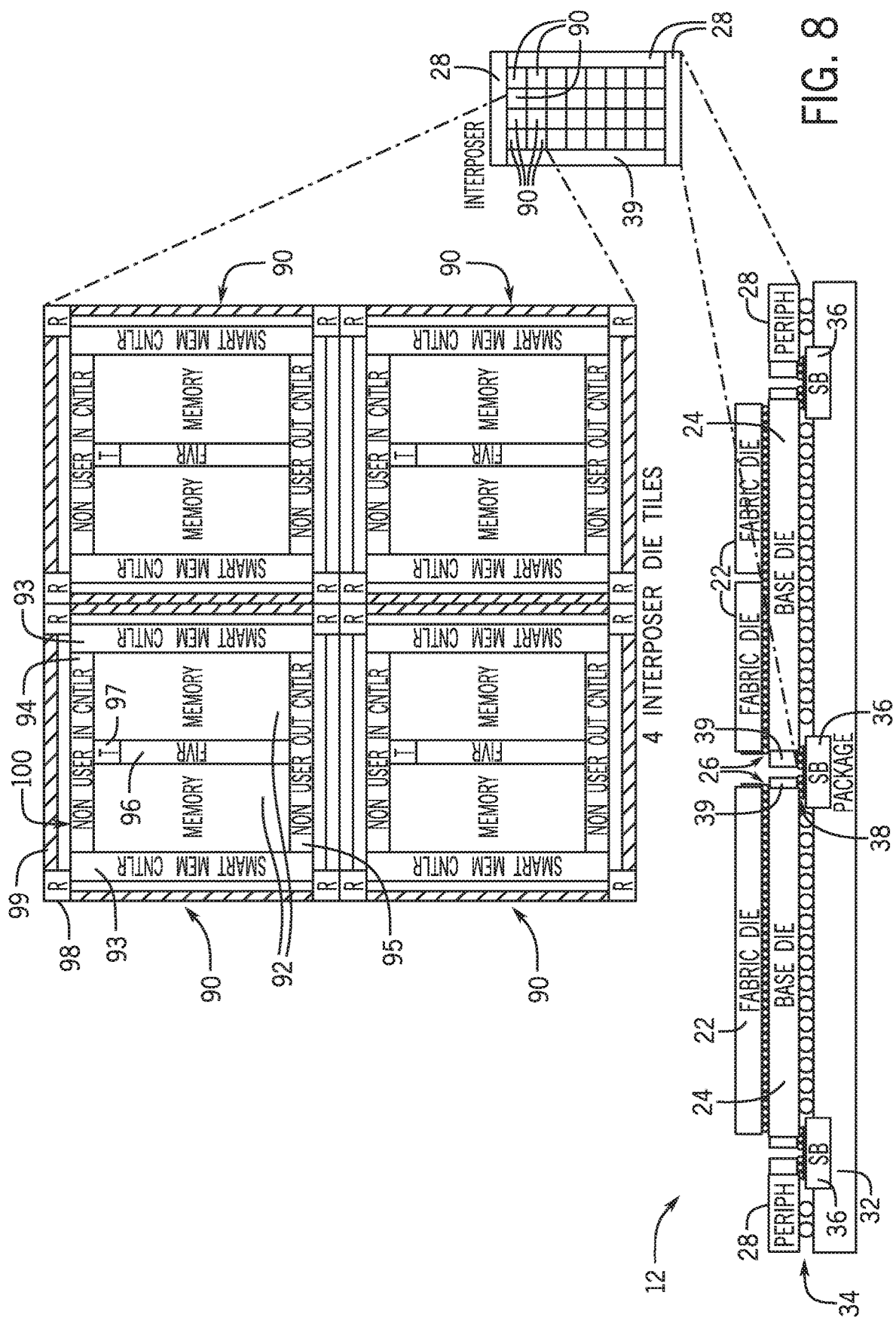
FIG. 8 is a block diagram of a topology of the base die having circuitry for a multi-purpose parallel interface and an embedded NOC integrated with a sector-aligned memory, in accordance with an embodiment.

In addition to facilitating communication of data between sectors 90, sectors 80, and the like, the presence of the NOC 100 in the base die 24 may also enable the programmable logic device 12 to incorporate additional circuit features by leveraging the NOC 100 of the base die 24 to improve the communication across the fabric die 22. By way of example, FIG. 8 provides another embodiment of an arrangement of the base die 24. Similar to the base die 24 described above, the base die 24 of FIG. 8 may represent an active interposer with several sectors 90 surrounded by peripheral circuitry 28 and the silicon bridge interface 39. As shown in FIG. 8, each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more sensors 97 (e.g., thermal, voltage, and the like), data and configuration routers 98, and/or data or configuration pathways 99.

Although the following description of the additional circuit features enabled by the NOC 100 embedded in the base die 24 focuses on the ability to transfer data to and from the sector-aligned memory 92, it should be noted that the additional circuit features are not limited to technologies involving the sector-aligned memory 92. Indeed, the NOC 100 embedded in the base die 24 may enable a variety of circuit operations to be performed more efficiently and effectively via the programmable logic device 12. However, for the purposes of discussion, certain operations that involve the sector-aligned memory 92 and the NOC 100 will be described to illustrate some of the functions enabled by incorporating the NOC 100 into the base die 24.

Referring back to FIG. 8, the memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller (SC) 58 for a corresponding fabric sector 80 (as shown in FIG. 5).

The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may correspond well enough to the fabric die 22 to allow for temperature-based operations (e.g., turn off power to the corresponding fabric sector 80 to prevent a permanent-denial-of-service (PDOS) condition).

In certain embodiments, the data or configuration pathways 99 that make up the NOC 100 may provide communication paths between each sector 90 via routers 98 mentioned above. As shown in FIG. 9, by vertically aligning the fabric die 22 and the base die 24 and incorporating the NOC 100 in the base die 24, memory located in the base die 24 may be accessible in parallel to fabric sectors 80 of the fabric die 22. FIG. 9 shows an example in which sector-aligned memory 92 may be contained in the base die 24. The sector-aligned memory 92 may be directly accessible to respective fabric sectors 80 of the fabric die 22 and may contain user data (generated by or accessible by a circuit design programmed into the programmable logic fabric of the base die 24) or configuration data that may be used to program the programmable logic fabric of the respective fabric die 22. In this disclosure, "directly accessible" refers to a connection between a particular fabric sector 80 and a region of the sector-aligned memory 92 that is associated with the particular fabric sector 80. In some embodiments, each respective region of the sector-aligned memory 92 associated with a particular fabric sector 80 may be directly accessible to that particular fabric sector 80, thereby providing each fabric sector 80 with direct access to respective regions of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 9, the fabric sectors 80 may access specific regions of sector-aligned memory 92. The sector-aligned memory 92 is shown in FIG. 9 as vertically stacked memory. This may allow a large amount of memory to be located within the base die 24. However, the sector-aligned memory 92 may occupy a single plane of the base die 24 in some embodiments.

It should be noted that the fabric sectors 80 may initiate a transfer of data directly between memory locations of the sector-aligned memory 92 of the base die 24 using the NOC 100, between different fabric sectors 80 of the fabric die 22, between fabric sectors 80 and memory locations of the sector-aligned memory 92, and the like. In certain embodiments, the sector controller (SC) 58 may initiate the transfer of data between sectors 80 of the fabric die 22, between memory locations of the sector-aligned memory 92, between sectors 80 of the fabric die 22 and memory locations of the sector-aligned memory 92, and the like. That is, the sector controller (SC) 58 may coordinate the operation of the NOC 100 to facilitate the transfer of the data between the source and destination targets, as specified by the section controller (SC) 58. In some embodiments, the section controller (SC) 58 may act as a master to initiate the respective transfer and the transfer would then be performed using the NOC 100 after the section controller (SC) 58 initiates the data transfer process.

Figure 10:
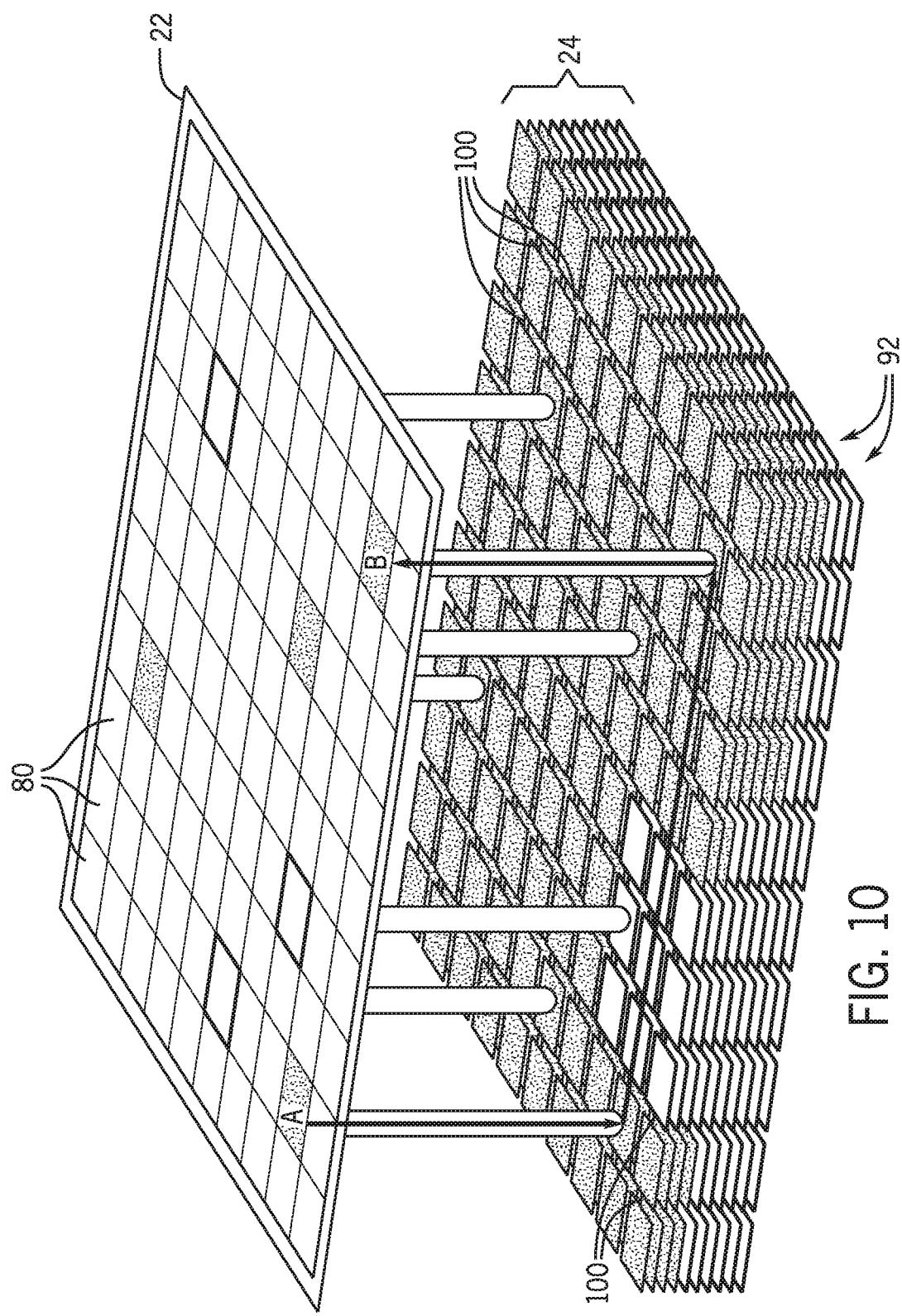
FIG. 10 is a an example of data transfer between sectors of the programmable logic fabric using the system of FIG. 9, in accordance with an embodiment.

By way of example, FIG. 10 includes a block diagram illustrating the transfer of data between sectors 80 of the programmable logic fabric via the NOC 100 of the base die 24. Referring to FIG. 10, in one embodiment, the sector controller (SC) 58 may initiate a transfer of data from sector "A" to sector "B" of the fabric die 22 using the NOC 100 of the base die 24. That is, the sector controller (SC) 58 may transfer data to a region of the sector-aligned memory 92 aligned with sector "A" of the fabric die 22, use the NOC 100 to transfer the data to a second region of the sector-aligned memory 92 aligned with sector "B" of the fabric die 22, and transfer the data from the second region of the sector-aligned memory 92 to sector "B" of the fabric die 22. Although the route of the data transfer illustrated in FIG. 10 corresponds to straight paths, it should be noted that the data transferred to different sectors 80 of the fabric die 22 or regions of the sector-aligned memory 92 may use a variety of directions and routes.

Figure 11:
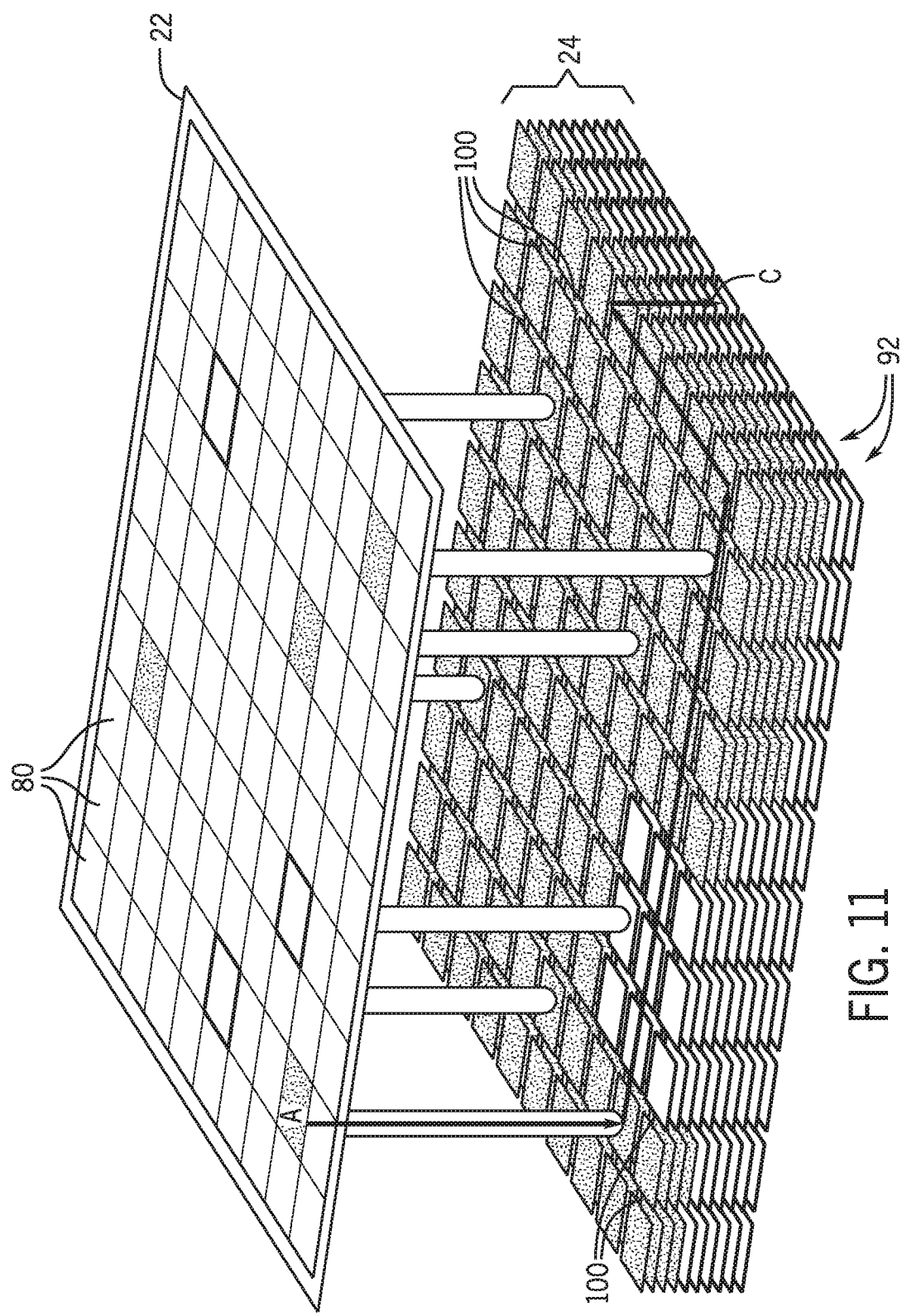
FIG. 11 is an example of data transfer from a sector of the programmable logic fabric to a memory of the sector-aligned memory using the system of FIG. 9, in accordance with an embodiment.

In another example, FIG. 11 includes a block diagram illustrating the transfer of data from a sector 80 of the programmable logic fabric to a region of the sector-aligned memory 92 via the NOC 100 of the base die 24. Referring to FIG. 11, in one embodiment, the sector controller (SC) 58 may initiate a transfer of data from sector "A" of the fabric die 22 to region "C" of the sector-aligned memory 92 using the NOC 100 of the base die 24. That is, the sector controller (SC) 58 may transfer data to a first region of the sector-aligned memory 92 aligned with sector "A" of the fabric die 22 and use the NOC 100 to transfer the data to region "C" of the sector-aligned memory 92 via different regions of the sector-aligned memory 92 or the like. Like FIG. 10, although the route of the data transfer illustrated in FIG. 11 corresponds to straight paths, it should be noted that the data transferred to different regions of the sector-aligned memory 92 may use a variety of directions and routes. It should be noted that other suitable circuits may also be employed to transfer the data in accordance with the embodiments presented herein.

As shown in FIGS. 10 and 11, the sector controller (SC) 58 may initiate a transfer of data directly between memory locations within the base die 24 using the NOC 100. In this case, the sector controller (SC) 58 may act as the master to initiate the transfer, but then the transfers would be performed directly in the sector-aligned memory 92 and the NOC 100 of the base die 24 after the sector controller (SC) 58 initiates the transfer. It should also be mentioned that, in some embodiments, that the sector controller (SC) 58 and similar components of the fabric die 22 may also initiate the components (e.g., memory control circuitry 93, non-user input control circuitry 94, non-user output control circuitry 95) of the base die 24 to perform transfers between the sector-aligned memory 92, the peripheral circuitry 28, and other components attached to the base die. As a result, data transfers may occur in the base die 24 without involvement of components in the fabric die 22.

In certain embodiments, the NOC 100 may also enable the programmable logic device 12 to provide security isolation for one or more of the programmable logic sectors 48. That is, the NOC 100 may be employed to communicate certain sensitive or secure data to a portion of programmable logic sectors 48 that may be designated as a security portion of the programmable logic device 12. Third party programmers may be unable to access the security portion of the programmable logic device 12 without access to the NOC 100. Instead, the NOC 100 may be limited to communication by certain programmers with a level of security credentials.

Since resources of the programmable logic device 12 may be pooled or assigned in different patterns for different applications/designs executed on the programmable logic device 12, the arrangement of such resources (e.g., programmable elements in the fabric die 22 and memory in the base die 24) may be configurable. Indeed, the bandwidth, mapping, and transportation of data within programmable logic device 12 may be programmable for the fabric die 22 or the base die 24.

Figure 12:
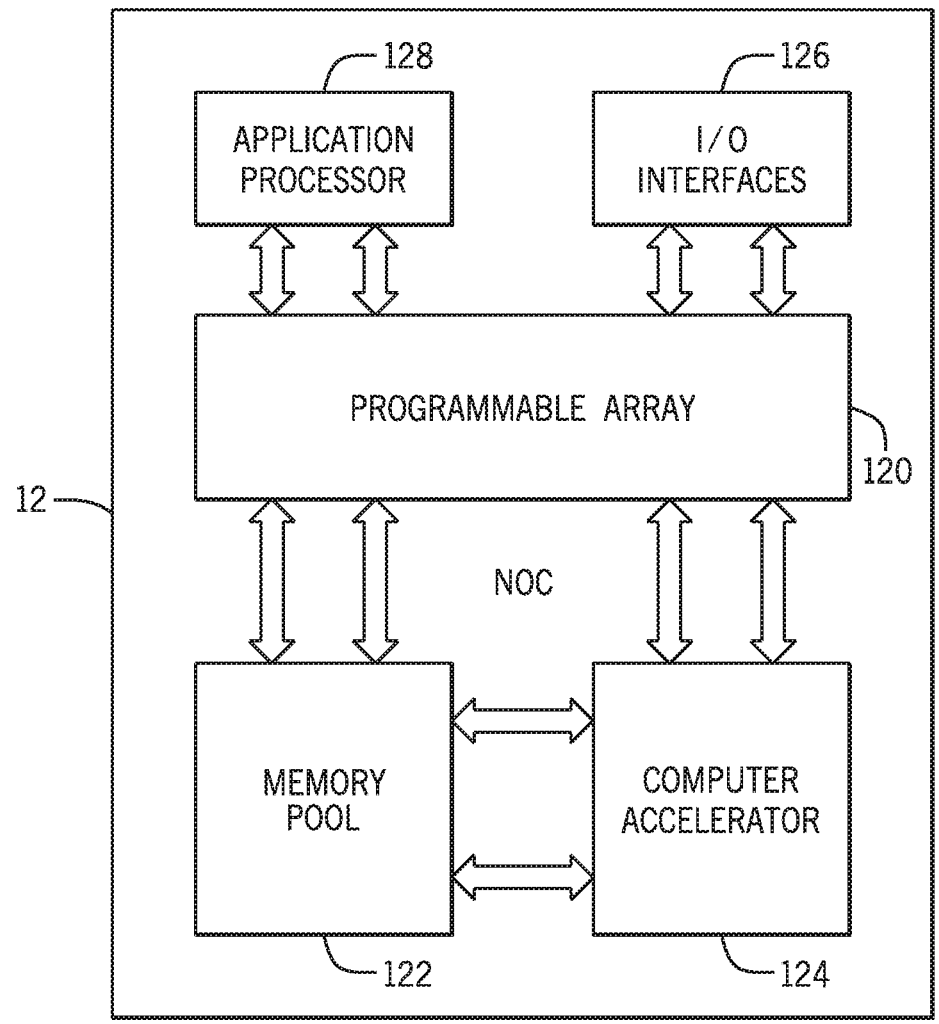
FIG. 12 is a logical diagram of an example of a data processing system, in accordance with an embodiment.

FIG. 12 illustrates a programmable logic device 12 that includes a programmable array 120 as part of its configurable resources. The programmable logic device 12 may include a reconfigurable on-chip memory pool 122 as another part of its configurable resources. The programmable logic device 12 also includes a compute accelerator 124 (e.g., dot-product engines) that may perform computations in-memory and/or near-memory to obtain improved performance and power efficiency. Using local computes and the reconfigurable on-chip memory pool 122, the programmable logic device 12 may include memory with a density greater than memory density attained otherwise. For example, the memory density of the programmable logic device 12 with the reconfigurable on-chip memory pool may be five times greater than the density using dedicated memory blocks (e.g., M20K memory blocks) inside the programmable array 120. Furthermore, the reconfigurable on-chip memory pool 122 may be accessed with a bandwidth higher than high-bandwidth memory (HBM) with a lower energy per bit (e.g., less than 5 times the energy per bit). Due to the in-memory and/or near-memory compute using the compute accelerators 124 and the memory pools 122, the programmable logic device 12 may perform more tera operations per second (TOPS) with an increased efficiency.

The programmable logic device 12 may include an I/O interface 126 and an application processor 128. The I/O interface 126 may provide channels to inject data into and/or extract data from the programmable array 120. For example, the I/O interface 126 may include I/O interfaces provided as part of the support circuitry in the base die 24. The application processor 128 may include a controller to control operation of the programmable array 120. For example, the application processor 128 may include the SCs 58 and/or the DC 60.

FIG. 13 provides a model for a 3D stacked programmable fabric device 130 that includes available memory in the fabric die 22, the available memory in the base die 24, and the bandwidth 132 between the fabric die 22 and the base die 24. For instance, a portion (e.g., sector 48 or entire) of the fabric die 22 may include a number (e.g., 1680) of logic array blocks (LABs), a number (e.g., 205) of memory blocks (e.g., M20Ks), and a number (e.g., 168) of digital signal processing (DSP) blocks while the base die may provide an amount (e.g., 20 Mb) of memory. Some components (e.g., fabric) of the fabric die 22 or some components (e.g., memory) of the base die 24 may be configurable to various different aggregations, such as having a number (e.g., 3) different levels (e.g., fine, medium, and large) of aggregation of memory in the base die 22. Each level may have its own associated properties, such as a capacity of memory in the base die 22 and bandwidth or latency between the fabric die 22 and the base die 24. As illustrated, the programmable fabric device 130 includes fine-grained interfaces 133 and medium/shared-grained interfaces 134 that provide access between the base die 24 and the fabric die 22 via corresponding portions of the bandwidth 132. For instance, the fine-grained interfaces 133 may access only a part 136 (e.g., ⅛$^{th}$) of a portion of the memory of the base die 22. Specifically, the fine-grained interfaces 133 are used in a fine grained aggregation 138 since the fine-grained interfaces 133 may not use a memory management unit (MMU) or an address translation unit (ATU). As illustrated in FIG. 14, in a medium-grained aggregation 140, the fabric die 22 may utilize the medium/shared-grained interfaces 134 in a deterministic manner (e.g., without using the MMU/ATU), but the whole memory of the portion of the memory of base die 24 may be accessed using the medium-grained aggregation 140 from the fabric die 22. As illustrated in FIG. 15, in a shared aggregation 150, the medium/shared-grained interfaces 134 are used with the MMU/ATU to enable the portion of fabric die 22 to access any memory in the base die 24 including any portions of memory not vertically below the fabric die 22.

The fine-grained and medium-grained aggregations of memory blocks may be used to obtain adjustable latency in a programmable logic device system 140. In fine-grained and medium-grained aggregation, the latency may be deterministic and the memory of the base die 24 may behave as a M20K. Fine-grained and medium-grained aggregations of memory blocks may be deterministic by providing direct access bandwidths 132 between respective portions (e.g., sectors 48 or portions of sectors) of the fabric die 22 and corresponding portions of the base die 24. As may be appreciated, the latency of the fine-grained aggregation may be a low level (e.g., 1-15 ns) while the latency of the medium-grained aggregation of memory blocks may be higher than the low level (e.g., 16-32 ns). The shared aggregation 150 may have variable latency that virtualized access that allows shared access to a large portion (e.g., the entire) of the memory of the base die 24.

FIG. 16 illustrates an aggregation 160 using fine-grained deterministic access capacity aggregation. As illustrated, a programmable fabric may include memory modules 162 (e.g., M20K) that may be used in the fabric die 22. The aggregation 160 shows the relationship between the memory modules 162 that may be used in the fabric die 22 and the consolidated aggregated memory that may be placed in the base die 24 in fine-grained memory aggregation. The aggregation 160 illustrates an aggregation from a single portion 164 (e.g., a sector, a part of a sector, parts of multiple sectors, etc.) of fabric of the fabric die 22 into a corresponding portion 166. The portion 166 may be a sub-portion of a portion 168 (e.g., support circuitry 70). Aggregating the memory modules 162 from the fabric die 22 to the base die 24 may provide consolidation of memory and may improve the deterministic latency even though bandwidth may be reduced.

FIG. 17 illustrates a fine-grained aggregation 170 with deterministic access capacity aggregation of the memory modules 162 of multiple portions 164 of the fabric die 22 into corresponding a portion 168 having the portions 166 contained therein. Some portions 164 may include entire sectors 48 and/or portions of sectors. The aggregation 170 may employ fabric resources 172 in the fabric die 22 to coordinate memory access. For instance, the aggregation 170 may employ a memory soft wrapper in the fabric of the fabric die 22.

Figure 18:
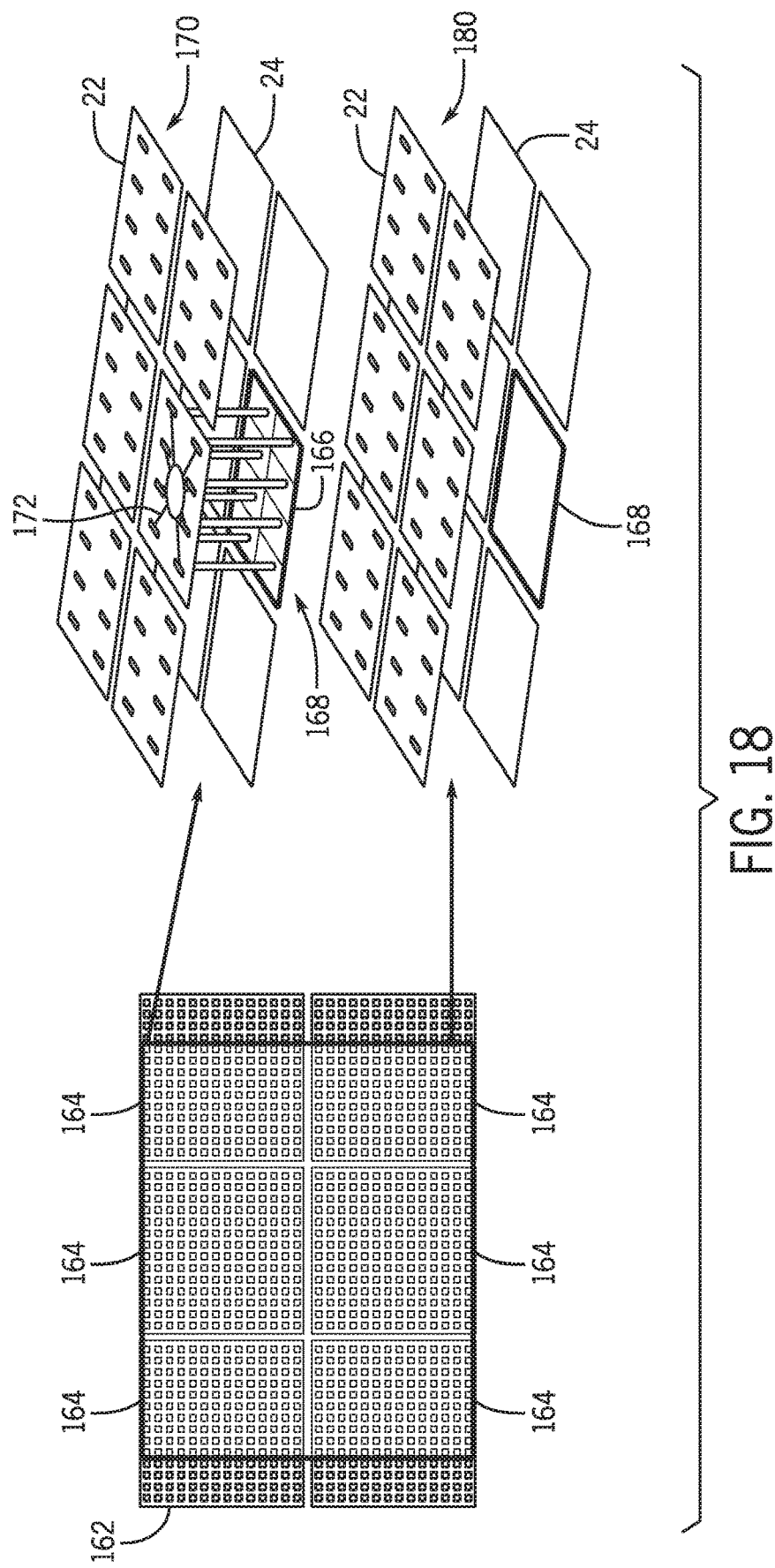
FIG. 18 is diagram illustrating medium-grained aggregation of memory for large capacity storage, in accordance with an embodiment.

FIG. 18 illustrates a relationship between a fine-grained aggregation 170 and a medium-grained aggregation 180 aggregating memory of the memory modules 162 that may be used in fabric die 22 with the consolidated aggregated memory that may be placed in the base die. The aggregation 180 aggregates memory from the portions 164 to the portion 168. The medium-grained memory aggregation may avoid the use of fabric resources 172 to coordinate memory access since the medium-grained aggregation 180 supports multiple access points to the same physical address space (e.g., the portion 168). In some embodiments, the latency of accesses may decrease over implementing the memory in the memory modules 162 even when bandwidth may be reduced. As may be appreciated, in both the fine-grained aggregation 170 and the medium-grained aggregation 180, the latency is deterministic and may employ a soft wrapper in fabric.

Figure 19:
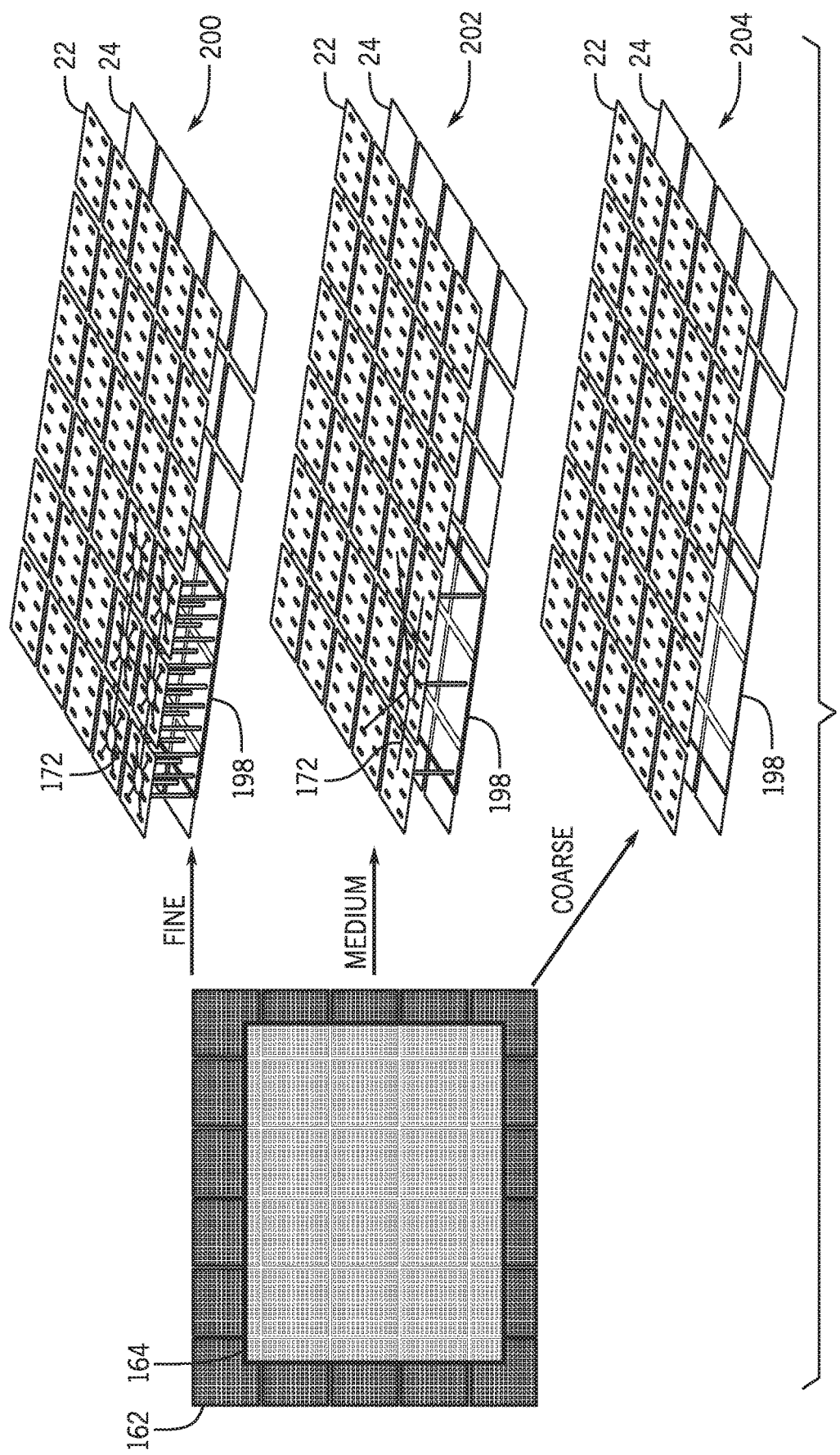
FIG. 19 is a diagram illustrating coarse-grained aggregations of memory with non-uniform memory access (NUMA)

FIG. 19 illustrates a non-uniform memory access (NUMA) aggregations of the memory of the memory modules 162 of thirty portions 164 to use a portion 198 of the base die 24. The portion 198 may include a part of a support circuitry 70, an entire support circuitry 70, parts of multiple support circuitries 70, or any combination thereof. A comparison of a fine-grained memory aggregation 200 and a medium-grained memory aggregation 202 is provided for a coarse NUMA aggregation 204. The fine-grained memory aggregation 200 may employ extensive use of fabric resources 172 and may provide a deterministic latency that is low relative to on-die memory with a lower bandwidth. The medium-grained memory aggregation 202 may employ reduced use of fabric resources 172 and may provide a deterministic latency that is low relative to on-die memory with a lower bandwidth than the fine-grained memory aggregation 200. In the coarse NUMA aggregation 204, no fabric aggregation is employed and, thus, the use of fabric resources 172 is substantially decreased. The bandwidth may be reduced below that of the medium-grained memory aggregation 202. In some embodiments of the coarse NUMA aggregation 205, the base die 24 may perform address translation to access memory when responding to memory access requests.

FIG. 20 illustrates how bandwidth aggregation may be used in fine-grained memory aggregation use models and medium-grained memory aggregation use models. In fine-grained memory aggregation 210, instead of accessing a single memory bank 212 in the base die 24 via a single access port 214, the memory bank 212 may be replicated to other memory banks 212 to enable the use of additional access ports 214 to perform bandwidth aggregation. The fine-grained memory aggregation 210 may increase the bandwidth but may lead to a reduction in the total memory capacity. In read-and-write memory, the fabric may coordinate reads and writes across the memory banks 212 using the fabric resources 172 to prevent inconsistent data across the replicated memory banks 212. In a medium-grained memory aggregation 216, the fabric die 22 and the base die 24 may aggregate access ports 214 to generate a high-bandwidth communication link between the fabric die 22 and the base die 24. The multi-port access may be managed by the fabric die 22. To aggregate the memory, the fabric may employs a memory soft wrapper in the fabric.

In the deterministic aggregations of FIG. 20, the deterministic access use models may have limited memory capacities. Furthermore, memory access may be performed directly from the fabric without translation (e.g., to distributed address space), whereas in coarse-grained aggregations (e.g., NUMA), one or more memory banks 212 may be shared and accessed via address translation of an memory management unit (MMU) in the base die 24.

FIG. 21 illustrates a bandwidth aggregation 220 in coarse-grained memory aggregation use cases. Bandwidth aggregation may be obtained by increasing the number of access ports between the base die 24 and the fabric die 22. In such situations, multiple accessors (e.g., logic blocks in the programmable logic) that share the memory may use the fabric resources 172 to manage access to the base die 24 via multiple access ports 214. The base die 24 may have an MMU 222 having an address translation unit (ATU) 223 to assist address translation and access management.

FIG. 22 illustrates NUMA shared memory accesses to shared-memory in a coarse-grained aggregation use model. In the illustrated example, accessors 230, 232, and 234 may share a common memory 236 using the illustrated mapping of various logical address ranges 238. The base die 24 (e.g., via the MMU 222) may provide translation to physical addresses 240 from logical addresses 242. For example, the base die 24 may translate respective logical addresses 242A, 242B, and 242C to respective physical addresses 240A, 240B, and 240C. Furthermore, the base die 24 (e.g. via the MMU 222) may provide access protection (e.g., authorization, locking) for the common memory 236. The base die 24 may share responsibilities related to memory consistency and/or coherency with the fabric die 22 (e.g., via the fabric).

As may be appreciated, the memory of the base die 24 may have higher capacity than the in-die memory (e.g., M20K, memory logic array block (MLAB), adaptive logic modules (ALM)). Furthermore, the memory of the base die 24 may have a higher bandwidth than shore-line/peripheral memory (e.g., HBM, dual-data rate (DDR)). However, the memory of the base die 24 may have a lower bandwidth than in-die memory. Therefore, in situations in which high-bandwidth access may be useful or is to be used at a rate higher than available via the base die 24, the programmable logic device 12 may perform memory paging from the base die 24 to the in-die memory on the fabric die 22. More generally, the programmable logic device 12 may employ paging of the memory between in-die and base-die memory regions to manage bandwidth of data exchanges.

FIG. 23 illustrates paging of memory between the in-die memory and the base-die memory (e.g., buffering resources such as M20K, MLAB, and ALM-FF modules). In some situations, a design to be implemented in the fabric may benefit from a bandwidth at a level available an in-die memory (e.g., memory modules 162) but not the base die 24. However, the available in-die memory resources may not be sufficient. In such situations, the memory of the base die 24 may be used to provide additional capacity, and programmable logic device 12 may utilize paging to place work sets in the in-die memory. Paging may be performed with or without fabric involvement.

The paging model employs the fabric die 22 and the base die 24 as alternative readers/writers of the in-die memory. Such alternative writing and reading may utilize significant fabric resources 172. To reduce consumption of fabric resources 172, a paging model may employ hardened pathways to write to in-die memory without fabric involvement. To enable the base die 24 to read/write from the in-die memory, in-die memory module (e.g., memory module 162) being paged may be paused for some period (e.g., <1 ms) to perform the paging.

As previously noted, memory in the base die 24 may be copied, broadcast, gathered, scattered, and/or transformed in the base die 24. For example, this movement of data may be made using direct memory accesses (DMA) in the base die 24 without moving the data through fabric die 22. FIG. 24 illustrates example DMA movements 250, 252, 254, and 256 by the base die 24 to move and/or transform data. The movement 250 illustrates copy and/or broadcasting data from a first portion 258A (e.g., memory bank 212, support circuitry 70, etc.) of memory of the base die 24 to other portions 258B, 258C, and 258D. Although the fabric of the fabric die 22 may master and/or initiate the DMA, the data moved may not be passed through the access port 214 and leaving fabric resources 172 unencumbered by the DMA.

The movement 252 includes scattering of data from one portion 258A with parts of the data from the portion 258A being scattered to respective portions 258B, 258C, and 258D. Similarly, the movement 254 includes gathering the data to the portion 258A from multiple portions 258A, 258B, 258C, and 258D. Similar to the copy/broadcast of data, the movements 252 and 254 may be performed without fabric involvement or usage of the access port 214 in passing the data between portions 258. The movement 256 includes transforming data in the base die 24 by performing one or more operations on the data in the portion 258A without moving the data to the fabric die 22 for processing.

Fast partial reconfiguration may be used on the fabric of the programmable logic device 12 to reconfigure a portion of the fabric dynamically while the remaining fabric design continues to function. FIG. 25 illustrates a partial reconfiguration that may be facilitate transformation of the fabric using configurations stored in the base die 24. The PR may be performed employing background loading and/or swapping of configuration data in the fabric from the base die 24. Accordingly, during background load 259 configuration data for portions 260 (e.g., sectors 48) of the fabric die 22 may be loaded into the corresponding locations in the base die 24 (e.g., support circuitry 70). For example, configuration data for the portion 260A may be stored in the portion 262A, configuration data for the portion 260B may be stored in the portion 262B, configuration data for the portion 260C may be stored in the portion 262C, and configuration data for the portion 260D may be stored in the portion 262D even if configurations are already loaded in into and/or being used in the portions 260A, 260B, 260C, and 260D. When one of the portions (e.g., portion 260A) is to be reconfigured, a partial reconfiguration 264 may be employed. In the partial reconfiguration 264, the configuration of the portion 260A is loaded into the fabric of the portion 260A from the portion 262A in a relatively short period (e.g., <1 ms) over the access port 214 compared to loading from shoreline memory. Since the portions 260 are aligned with the portions 262, multiple reconfigurations may be loaded in parallel using multiple access ports 214. For example, a parallel loading 266 loads respective configurations into the portions 260A, 260B, 260C, and 260D of the fabric die 22 from respective portions 262A, 262B, 262C, and 262D of the base die 24 in a relatively short period (e.g., <1 ms total) relative to sequential loading from the base die 24 and/or loading from shoreline memory. In other words, the foregoing background loading of configurations into base die 24 and swapping configurations increases the usefulness and speed of performing partial configurations. Additionally or alternatively, the portions 260A, 260B, 260C, and/or 260D may pull configurations from any of the portions 262A, 262B, 262C, and 262D.

As previously noted in FIG. 12, the base die may include a compute-near-memory (CnM) architecture with compute accelerators 124 (e.g., dot-product engines) located near memory (e.g., memory pool 122). FIG. 26 illustrates a CnM architecture that may be used to increase speed of computation. In the illustrated embodiment, the compute accelerators 124 include dot-product engines (DPEs). However, the compute accelerators 124 may include any suitable computation circuitry that may be used to implement, for example, finite impulse response (FIR) filters, fast Fourier transform (FFT) algorithms, and the like. The computations may use multiple precisions (e.g., integer, floating point, Gbit, 16 bit), different Endianness, and/or may allow data reutilization. The CnM architecture may increase the number of available programmable logic device 12 resources by adding extra compute power (e.g., DPEs) and memory (e.g., RAMs). In some embodiments, the compute accelerators 124 may be organized as fixed regions. A user and/or administrator may allocate one or more portions 274 (e.g., partition) of the fabric die 22 to user design(s). Each of the user designs, includes at least a portion 274 (e.g., sector) of the fabric die 22. Each user design is also allocated at support circuitry 276 (e.g., support circuitry 70) in the base die 24. For instance, each support circuitry 276 may be allocated based on allocation of a corresponding portion 274 of the fabric. Resources accessed by the fabric may be distributed via microbumps as previously discussed. The fabric may broadcast control to the support circuitry 276. As illustrated, the support circuitry 276 may include DPEs 278 arranged in rows between rows of memory blocks 280. Additionally or alternatively, the memory blocks 280 and the DPEs 278 may be interleaved in any other suitable configuration. Furthermore, at least some of the DPEs 278 may be replaced and/or supplemented with other compute accelerators 124 configured to perform computations near the memory pool 122 (e.g., the memory blocks 280).

Using the base die 24 to perform CnM may enable the base die 24 to perform a portion of operations for the programmable logic device 12. The base die 24 may perform tensor operations (e.g., matrix-vector and matrix-matrix multiplications). For example, if the compute accelerators 124 include the DPEs 278, the base die 24 may provide INT8 precision for each DPE 278 that includes a 40-bit accumulator.

The programmable logic device 12 may be a data processing system or may be a component of a data processing system. For example, the programmable logic device 12 may be a component of a data processing system 500, shown in FIG. 27. The data processing system 500 includes a host processor 502, memory and/or storage circuitry 504, and a network interface 506. The data processing system 500 may include more or fewer components (e.g., electronic display, user interface structures, application specific integrated circuits (ASICs)). The host processor 502 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 500 (e.g., to perform machine learning, video processing, voice recognition, image recognition, data compression, database search ranking, bioinformatics, network security pattern identification, spatial navigation, or the like). The memory and/or storage circuitry 504 may include random access memory (RAM), read-only memory (ROM), one or more hard drives, flash memory, or the like. The memory and/or storage circuitry 504 may be considered external memory to the programmable logic device 12 and may hold data to be processed by the data processing system 500. In some cases, the memory and/or storage circuitry 504 may also store configuration programs (e.g., bitstream) for programming the programmable logic device 12. The network interface 506 may enable the data processing system 500 to communicate with other electronic devices. The data processing system 500 may include several different packages or may be contained within a single package on a single package substrate.

In one example, the data processing system 500 may be part of a data center that processes a variety of different requests. For instance, the data processing system 500 may receive a data processing request via the network interface 506 to perform machine learning, video processing, voice recognition, image recognition, data compression, database search ranking, bioinformatics, network security pattern identification, spatial navigation, or some other specialized task. The host processor 502 may cause the programmable logic fabric of the programmable logic device 12 to be programmed with a particular accelerator related to requested task. For instance, the host processor 502 may instruct that configuration data (bitstream) stored on the memory/storage circuitry 504 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 500 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

Placement of computation and memory in spatial architectures where compute and memory have three-dimensional spatial locality may be performed statically. Additionally or alternatively, the programmable logic device 12 may dynamically allocate, relocate, and de-allocate compute and memory on such spatial architectures. These techniques enable the static mapping and dynamic management of systems using such architectures. Moreover, using flexible allocation schemes enables the programmable logic device 12 to find and support optimal co-placement of compute with memory in a static setting in a known sequence of static settings and in a dynamic setting when the allocation of compute and memory is not known a priori. Such usage of static and/or dynamic placement in a three-dimensional spatial locality provides the ability to extend compilation to support the simultaneous synthesis, placement, and routing of spatial computation with a spatially distributed memory to enable users to leverage an architecture with a much richer memory sub-system. The support for dynamic management of the computation and memory allows users/administrators to build dynamic runtime systems for spatial architectures for the programmable logic device 12.

Static Compilation to a Multi-Dimensional Device

An embodiment of the programmable logic device 12 is provided in FIG. 28. As illustrated, a portion (e.g., a sector) of the fabric die 22 and the base die 24 are connected via the access ports 214 in a stacked-die architecture. The fabric die 22 contains a spatial compute fabric which contains one or more memories (e.g., M20Ks). The fabric die 22 has a local sector manager (LSM) 518 that controls the configuration of the fabric. In some embodiments, the LSM 518 coordinates the communication between the fabric die 22 and the base die 24. The fabric die 22 has a fabric multi-die interface bus (FMIB) 520 that is used to communicate with a base multi-die interface bus (BMIB) 522 in the base die 24 via the access ports 214. The base die 24 has a controller 524 that coordinates the communication between the fabric die 22 and the base die 24. As previously discussed, the base die 24 contains memory (e.g., memory block 526). In some embodiments, the base die 24 also contains compute units 528 (e.g., DPE or the like). Physically, the fabric and various memory sectors in the 3D columnar construction may have different sizes and/or use different technologies. Furthermore, even though the discussion related to two die in the programmable logic device 12, the programmable logic device 12 may contain more than two die.

FIG. 29 illustrates the programmable logic device 12 having four portions (e.g., sectors). In some embodiments, the spatial fabric portions are stitched using configurable wires 532 (also referred to as fabric resources) to allow spatial fabric portions to communicate with each other. In some embodiments, the base portions are stitched together using an interconnect 534, such as the NOC 100. The interconnect 534 allows each FMIB 520 and BMIB 530 to access any of the base memory blocks 526. In some embodiments, the portions of the fabric die 22 and/or the base die 24 may have additional components or fewer components.

Although the fabric may be divided into portions (e.g., sectors), the fabric may be viewed as a continuous 3D architecture as illustrated in FIG. 30. The compilation of the programmable logic device 12 may include optimizing spatial alignment of the compute/memory to minimize latency and maximize bandwidth. In some embodiments, access to the compute/memory in another die uses deterministic latency. In some embodiments, to realize this deterministic latency requirement, the memory may be located within a defined proximity of the accessor. In some embodiments, access to the memory in another die does not use deterministic latency (e.g., the NUMA model). In such embodiments, the accessor and accessed memory have no proximity limitations to be functional, but the compiler 16 may choose to optimize the placement of the accessors and accessed memories to minimize latency and/or maximize bandwidth.

In some embodiments, a user (and/or administrator) interacts with the spatial fabric as illustrated in FIG. 31. User logic 560, 562, and 564 specifies one or more designs for the fabric die 22 and/or the base die 24. For example, these designs may be specified in the same manner as would be done in a 2D or 2.5D programmable logic devices. In some embodiments, the user logic 560, 562, and/or 564 may be described in a hardware description language (HDL). In some embodiments, the user logic 560, 562, and/or 564 may be described in a high-level language. To communicate with the spatial memory/compute in another plane, the user logic 560, 562, and/or 564 is coupled to an appropriate interface and/or bus. For example, the fabric in the fabric die 22 may be coupled to the memory blocks 526 or the compute units 528 via the FMIBs 520. In some embodiments, the interface provides a direct memory interface (e.g. SRAM/M20K interface). In some embodiments, the interfaces use a well-defined protocol such as an AVALON® Memory-Mapped (AVMM) interface or advanced extensible interface (AXI).

As illustrated in FIG. 32, the user (and/or administrator) may specify memory arrays 570 to be mapped in the base die 24. In some embodiments, these memory arrays 570 are explicitly tagged to be mapped to the base die 24. Additionally or alternatively, the compiler 16 may infer the memory arrays 570 to be in the base die 24. Furthermore, the compiler 16 may also infer the FMIBs 520.

In some embodiments, the user (and/or administrator) creates read/write associations 572 between the FMIBs 520 and the memory arrays 570 as shown in FIG. 34. In some embodiments, the read/write associations 572 are defined as read only, write only, and read/write. In some embodiments, the read/write associations and FMIBs 520 are inferred by the compiler 16. For access that are to be deterministic, the user (and/or administrator) specifies an attribute (e.g. direct access 574) to inform the compiler 16 that the respective FMIB 520 and respective memory array 570 are to be located within a defined proximity. In the absence of a specific definition, other connections without this attribute may be assumed to have non-deterministic access times (i.e. NUMA). In some embodiments, deterministic accessors are mapped to specific FMIBs on the spatial fabric of the fabric die 22. The FMIB 520 may be shared between deterministic and non-deterministic accessors with the deterministic accessors mapped to this same FMIBs as non-deterministic accessors. In such embodiments, the accessors themselves are configured to enable deterministic access.

After the FMIBs 520 and the respective memory arrays 570 are associated and/or inferred, the FMIBs 520 interfaces are elaborated to support the defined access. In the illustrated embodiments of FIG. 34, each FMIB 520 contains one or more offsets 576, 578, 580, and 580 for the memory arrays 570 that the respective FMIB 520 is defined to access. For example, a first FMIB 520 may include an offset 576 for a first memory array 570 that the first FMIB 520 is defined to access. Similarly, a second FMIB 520 may include the offset 576 along with offsets 578 and 580 for respective second and third memory arrays 570 that the second FMIB 520 is defined to access. Furthermore, a third FMIB 520 may contain the offsets 578 and 580 along with an offset 582 for a fourth memory array 570 that the third FMIB 520 is defined to access. These offsets 576, 578, 580, and 582 allow the user to define addressing to the memory of the base die 24 using logical addresses. In some embodiments, the FMIBs 520 provide hardwired circuitry to support the offsets using hardware. Additionally or alternatively, programmable circuitry is used to support the offsets using software. These offsets are used to support multiple array accesses from a single FMIB 520. In certain embodiments, the FMIBs 520 do not perform the logical-to-physical address translation of the base memory address space. In such embodiments, that address translation is done using the MMU 222, as discussed below.

As previously discussed, the programmable logic device 12 may perform memory paging between the fabric die 22 and the base die 24. To this point and as illustrated in FIG. 35, memory paging relationships 584 may be defined between base memory arrays 570 and groups of spatial fabric memories 586 (e.g. M20Ks). In some embodiments, the relationships 584 are defined as read-only, write-only, or read/write. In some embodiments, the spatial fabric memories 586 are defined as a dynamic partial reconfiguration region. As previously discussed, this partial reconfiguration allows the paging to happen while the rest of the spatial fabric continues to execute design-implemented operations.

As illustrated in FIG. 36, an address space 588 is defined for memories 590 in the base die 24 and is defined for memories 594 (e.g. M20Ks) in the spatial fabric. As illustrated, the definitions in the physical address space 488 may be flat and any FMIB 520 can access any memory (e.g., memories 590 and/or 594) in the physical address space 488. In some embodiments, the physical address space 488 may not be flat, and an address translation unit as part of a memory management unit (MMU) of the base die 24 translates logical addresses from the FMIB 520 into physical addresses in the base die 24.

In some embodiments, the address translation unit (ATU) 223 has restrictions on the logical-to-physical address translation. In FIG. 37, an address translation is shown in the restricted space. In this example, the upper number (e.g., four) bits 600 may define a portion (e.g., sector 48). For example, the bits "0100" identify a portion 602 (e.g., sector 48 or support circuitry 70) of memory. A next number (e.g., six) bits 603 define a sub-portion of the identified portion as the high address space of the memory in that portion. For example, the bits "011001" identifies a block 604 and a sub-block 606 of memory in the portion 602. Specifically, the block 604 is identified by the bits "01" and the bits "1001" identify the sub-block 606 within the block 604. Remaining bits 608 may be used to define specific memory locations within the sub-block 606. In some embodiments, the bits (e.g., ten most significant bits) corresponding to the portions, the block, and the sub-block may be translated while the remaining (e.g., lower ten bits) are not translated. Other translation schemes that use different number and/or allocation of bits for address translation may be employed to find a balance between the size of the ATU 223 and the richness of translation. The limits of the ATU 223 provide restrictions to the compiler 16 when finding the placement of the defined compute and memory.

In some embodiments, the compiler 16 takes user input descriptions of the design and the definition of the architecture, physical address space 488, and ATU 223 restrictions to determine the placement of the user logic 560, 562, and 564 and the respective FMIBs 520 as shown in FIG. 38. FIG. 38 illustrates a depiction of the user logic 560, 562, and 564 mapped into the physical address space 488. Memory accesses that are labeled direct access in the designs are to be aligned within a defined proximity of the memory they access, such as the FMIB 520 and the array 570A. In some embodiments, memory access that are not defined as direct access are placed to minimize access latency and maximize bandwidth.

In some embodiments, the compiler 16 takes the user input description of the design and the definition of the architecture, physical address space 488, and the ATU 223 restrictions to determine the placement of the user logic 560, 562, and 564, the respective FMIBs 520, base memory arrays 570, and spatial fabric memory 586 as shown in FIG. 39. Memory accesses that are labeled direct access in the designs are to be aligned within a defined proximity of the memory they access, such as the FMIB 520 and the array 570A. In some embodiments, memory accesses that are not defined as direct access are placed to minimize access latency and maximize bandwidth. In some embodiments, the MMU 222 may use the ATU 223 to translate the logical address space defined in the user's design to the physical address space 488 of the memory in the fabric die 22 or base die 24. In some embodiments, the MMU 222 may provide security to disable unauthorized access to memory. In some embodiments, the MMU 222 disables unauthorized access at the accessor. In some embodiments, the MMU 222 provides locking capabilities to isolate the read and/or write access of multiple accessors to a subset of addresses to enable memory consistency.

In some embodiments, after the FMIBs 520, the spatial fabric memory 586, and the base memory arrays 570 are placed within the restrictions of the ATU 223, the compiler 16 configures the MMU 222 as shown in FIG. 40. Specifically, the MMU 222 (and the ATU 223) may store a table 620 used to translate virtual addresses to physical addresses for the memory arrays 570 in the base die 24. Similarly, the MMU 222 (and the ATU 223) may store a table 622 used to translate virtual addresses to physical addresses for the memories 594 in the fabric die 22. In some embodiments, the ATU 223 is configured in coordination with the offsets of the FMIBs 520 for multiple array accessing. The MMU 222 (and the ATU 223) may store mappings 624 for bulk movements of data to and from the base die 24 to the memories 594 of the fabric die 22.

FIG. 41 is a flow diagram of a process 625 that may be deployed by the compiler 16 when organizing the programmable logic device 12. The compiler 16 maps implementations of designs (e.g., user logic 560, 562, and/or 564) to one or more FMIBs 520 (block 626). As previously noted, this mapping may be associated in the designs and/or inferred by placement of the designs. The compiler 16 then maps the FMIB(s) 520 to one or more memory arrays 570 of the base die 24 (block 627). The mapping may include a mapping from the FMIB(s) 520 to a corresponding BMIB 522. The mapping may include a forced direct access between an FMIB 520 and a corresponding memory array 570 when the latency and/or bandwidth between the designs and the array 570 is deterministic. The mapping may also include offsets in the FMIB 520 that provides a virtual starting address for the memory arrays 570. The compiler 16 may also map the one or more memory arrays 570 to memory in the fabric die 22 for bulk transfer and/or memory paging (block 628). As previously noted, the mapping between the memory array(s) 570 and the in-die memory may be based at least in part on associations set by a user and/or administrator. Store mapping in the ATU 223 and/or the MMU 222.

Sector-Aligned Dynamic Partial Reconfiguration

The programmable logic device 12 may be used to perform a partial reconfiguration (PR) of the fabric where a portion of the fabric is reconfigured while one or more other portions of the fabric remain in use during the PR. The alignment of sectors or portions as of the fabric die 22 or base die 24 combined with sector alignment of PR enables an increase in the PR performance. The static compilation previously discussed focused on logic and memory placement of a single design. However, the concepts discussed related to the memory in the base die 24 may be extended beyond user data. For example, compilation may be used to store multiple partial reconfiguration personas. The separation of the memory for data and personas is part of the static compilation. A partial reconfiguration 630 is illustrated in FIG. 42. The partial reconfiguration 630 has PR regions 632 and are defined as part of a static compilation. The PR regions 632 and 634 have few restrictions on their size or shape and allow static routes 636 to go through the PR regions 632 and 634. The PR regions 632 and 634 may include inter-sector routes 638 that enable communication through the sectors 48 within a respective PR region 632 or 634. Each PR region 632 and 634 is capable of supporting any number of PR personas that have been compiled and/or relocated to the respective PR region 632 or 634 and use a subset of an input and output interface of the PR region 632 and 634.

The partial reconfiguration may be restricted to be aligned to the sectors 48 of the fabric. Sector-aligned dynamic PR, as shown in FIG. 43, is a sector-restricted form of PR that forces the PR regions 632 and 634 to be defined on boundaries of the sectors 48. This sector-restricted method allows entire sectors 48 to be reconfigured by using a configuration write instead of the read-modify-write process of traditional PR. Inter-sector routes 638 between sectors 48 contained in the same PR region 632 or 634 may cross boundaries of sectors 48. Static routes 636, on the other hand, may not cross through PR regions 632 or 634 as permitted in traditional PR. These routing restrictions of sector-aligned PR restrict the PR regions 632 and 634 to accommodate the static routes 636 outside of the PR regions 632 and 634.

As illustrated in FIG. 44, to reduce the restrictions imposed by sector-aligned PR, a network-on-chip (NOC) 640 may be employed in the programmable logic device 12. In some embodiments, the NOC 640 is created with soft logic. In such embodiments, the soft logic NOC is part of the fabric resources in the PR regions 632 and 634 with the programmable logic device 12 tolerating portions of the NOC 640 disappearing during a PR operation. In some embodiments, the NOC 640 is created with hard logic (e.g. the NOC 100). In some embodiments, sector-aligned PR uses the NOC 640 to support the static routes 636. Furthermore, regardless of implementation type, the use of the NOC 640 enables adjacent sectors 48 to be used for different regions without leaving sector-sized gaps between sector-aligned PR regions 632 and 634 to support the static routes 636.

In some embodiments, the NOC 640 is implemented as the NOC 100 in the base die 24 as shown in FIG. 45. In some embodiments, the NOC 100 of the base die 24 provides fabric-to-fabric communication as the spatial fabric NOC 640 did in FIG. 44. In some embodiments, the NOC 100 provides communication to the memory of the base die 24 and communication is done through memory reads and writes of the base die 24 via the access ports 214.

In some embodiments, sequencing of PR personas using sector-aligned PR is coordinated as a series of static compilations that adhere to the original base compilation of the PR regions. These static compilations of personas may be later swapped in a sequence. In FIG. 46, two sector-aligned PR regions with PR personas F1 and F3 are shown. F1 and F3 are shown to communicate through the base die 24 via the access ports 214. If the next persona is statically known, it may be background loaded to the base die 24, as previously discussed, to take advantage of the speed of sector-aligned PR in a three-dimensional setting. FIG. 47 illustrates a persona F2 with its own static routes 636 and inter-sector routes 638 loaded into memory of the base die 24 in the background while F1 and F3 in the fabric continue to execute until the loading is performed using the access ports 214 and corresponding FMIBs 520. FIG. 48 illustrates the persona F2 loaded into the fabric die 22.

FIG. 49 is a static sequence 650 of PR personas. In some embodiments, the next persona(s) are background loaded. The background loading allows the configuration data to be loaded into the memory of the base die 24 in preparation of sector-aligned PR operation between the fabric die 22 and the base die 24 to reconfigure the spatial fabric. In a first part 651 of the static sequence 650, a first persona is executing in the fabric die 22 while a second persona is loaded into the base die 24 via the access ports 214 and respective FMIBs 520. During a second part 652 of the static sequence 650, the second personal is loaded from the base die 24 to the fabric die 22. In a third part 653, a third persona is loaded into the base die 24 while the second persona is executing in the fabric die 22. In some embodiments, the third persona and the first persona may be the same configuration. In a fourth part 654, the third persona is loaded into the fabric die 22 from the base die 24 via the access ports 214 and respective FMIBs 520.

FIG. 50 is a flow diagram of a process 655. One or more personas are loaded into the fabric die (block 656). The personas may be sector-aligned and may include one or more sectors 48 inside each region corresponding to a persona. One or more background loaded personas are loaded into the base die (block 657). At a later time, the one or more background loaded personas are loaded from the base die 24 into the fabric die 22 (block 658).

Execution of Dynamic Actions

The programmable logic device 12 may be used to perform dynamic actions. The execution of the dynamic actions may not leave the compute or memory allocations unchanged, re-allocations, or de-allocation. The ability to execute these dynamic actions may be part of the static compilation process.

Sector fabric memory paging has been previously discussed as part of the static compilation process. In some embodiments, a spatial fabric memory paging may use partial reconfiguration and through the FMIB 520 (and access port 214) as shown in FIG. 51. In some embodiments, the spatial fabric invokes a PR operation isolated to the memory in the fabric die 22 and interfacing logic which directs the system to move data to/from the memory in the fabric die 22 from/to the memory in the base die 24. In some embodiments, the MMU 222 protects the system from unauthorized spatial fabric memory paging. During spatial fabric memory paging, the page may be aborted if the memory being paged is corrupted and/or precautions may be taken (e.g., restrictions on writes) during the spatial fabric memory paging. In some embodiments, the associations between the memories involved in paging is communicated, and memory corruption is avoided using soft logic. In some embodiments, the memory corruption is avoided using hard logic in the MMU 222.

The static placement of the memory in the base die 24 may be decided by the compiler 16. In some embodiments, direct memory access (DMA) operations are performed on the memory in the base die 24. The DMA operations may include DMA scatter operations, DMA gather operations, parallel DMA transfer operations, and the like. Furthermore, the DMA operations may be involved in near-to-memory compute operations, and/or other operations that involve memory accesses. In some embodiments, the spatial fabric communicates a DMA descriptor to a DMA engine 660 located in the base die 24. For instance, a DMA engine 660 may be included in one or more of the support circuitries 70 of the base die 24. The base die 24 then executes the DMA operation to completion.

An embodiment of a DMA scatter operation 661 is shown in FIG. 52. In some embodiments, given the description of the FMIB 520 and memory associations for the base die 24, some read and write operations may be restricted during the DMA operation to prevent write corruptions. A specific restriction given the example DMA scatter operation is also shown in FIG. 52. To avoid corruption of the memory of the base die 24 during the DMA operation, restricted memory operations 664 may be blocked while allowed memory operations 666 are allowed. In some embodiments, these restrictions are communicated via the soft logic in the spatial fabric. In some embodiments, the DMA engines 660 use the MMUs 222 in the base die 24 to disallow the potentially corrupting reads and writes from the restricted memory operations 664.

FIG. 53 shows a gather operation 670 where data is gathered from various locations in the base die 24. Similar to the scatter operation 661, some memory access operations may be susceptible to causing memory corruption during the gather operation 670. Accordingly during the gather operation 670, the restricted memory operations 664 that may be susceptible to having corrupted reads or writes may be blocked while the allowed memory operations 666 without such susceptibilities may be allowed. In some embodiments, the memory has no restrictions on how it is scattered or gathered. In some embodiments, the DMA operations are restricted based on user inputs.

In some embodiments, parallel DMA operations 672, 674, and 676 are issued as shown in FIG. 54. The restricted memory operations 664 and a single allowed memory operation 666 are displayed for operations during the parallel DMA operations 672, 674, and 676.

As previously noted, compute accelerators 124 may also be included in the base die 24. In some embodiments, the compute accelerators 124 are tightly coupled with the memory. In some embodiments, the compute accelerators 124 are loosely coupled with the memory. In some embodiments, the spatial compute fabric is coupled with different base die 24 instances to enable selection of application-specific acceleration. In some embodiments, as shown in FIG. 55, a tightly coupled compute-near-memory instance of the base die 24 is illustrated. In the illustrated embodiment, portions 680 (e.g., support circuitry 70) include multiple banks of memories 682 coupled with arithmetic circuitries 684 (e.g., adder, multiplier, etc.) of the compute accelerators 124. In some embodiments, the spatial compute fabric provides hooks to dynamically control the compute accelerators in the base die 24 via the controller 524. For example, the controller 524 may be used to load weights into memories 686 or 688 to be used in arithmetic operations performed by the respective arithmetic circuitries 684 on the data of respective banks of memories 682. The memories 686 and/or 688 may include registers used to store weights for use in the arithmetic operations. In some embodiments, the user creates the instances to control the compute accelerators 124, and the compiler 16 maps the controls to appropriate FMIBs 520. In some embodiments, the compute-near-memory performs an application-specific computation (e.g. dot-product). In some embodiments, the compute-near-memory enables tight interactions with the memory to enable efficient memory operations such as transposing, shuffling, and the like to the memories. In some embodiments, the compute-near-memory provides simple arithmetic logic unit (ALU) operations (e.g. increment/decrement) that operate on the memories. In some embodiments, these other forms of computations are controlled by the spatial fabric through the FMIBs 520. As previously discussed, the DMA 660 may access/store data in the banks of memories 682. In some embodiments, a DMA compute 690 that may be used to perform computations on the data being passed using the DMA 660.

FIG. 56 is a block diagram of a process 700 using the compute accelerators 124. The controller 524 loads one or more weight(s) into one or more memories 686 or 688 (block 702). The DMA 660 receives and scatters data to the banks of memories 682 (block 704). The compute accelerators 124 then perform corresponding arithmetic calculations on data in the respective banks of memories 682 (block 706). The DMA 660 then gathers the data from the respective compute accelerators 124 (block 708). The gathered data is then transmitted to an appropriate location (block 710). For example, the gathered data may be transmitted to the fabric via the BMIB 522, transmitted to the NOC 100, scattered by the DMA 660 through the portion 680, used alongside with a new input vector input to the one or more compute accelerators 124, and/or the like.

FIG. 57 illustrates steps of the process 700 inside the portion 680 of the base die 24. As illustrated in the portion 680A, the controller 524 loads a first weight 712 into the memory 686 of a first compute accelerator 124. Loading the first weight 712 into the memory 686 may include loading the first weight 712 to the controller 524 via the BMIB 522. In the portion 680B, the controller 524 loads a second weight 714 into the memory 688 of the first compute accelerator 124 where the controller 524 receives the second weight 714 via the BMIB 522. In the portion 680C, the controller 524 loads a third weight 716 into the memory 686 of another compute accelerator 124 after the controller 524 has received the third weight 716 from the BMIB 522.

In the portion 680D, the DMA 660 scatters/broadcasts data 718 to respective banks of memories 682. The DMA 660 may receive the data 718 from the controller 524 that receives the data 718 from the BMIB 522 and/or the NOC 100. Once the data has been distributed to the compute accelerators 124, each compute accelerator 124 loaded with appropriate data, the compute accelerators 124 perform computations as illustrated in the portion 680E. As illustrated in the portion 680F, the DMA 660 gathers the results 720 from the compute accelerators 124. The DMA 660 may then transmit the results 720 to an FMIB 520 via a respective BMIB 522 (illustrated in portion 680G) and/or to the NOC 100 (illustrated in portion 680H).

Dynamic Allocation, Re-Allocation, and De-Allocation of Compute and Memory

In some embodiments, a compute and related memory may be initially statically allocated, but then the memory may be dynamically allocated, re-allocated, and/or de-allocated. During a movement (re-allocation) 749 of memory 750, as illustrated in FIG. 58, the re-allocation of the memory in the memory pool 122 is handled by the DMA 660 and the MMU 222 engines where the DMA 660 moves the memory 750 and the MMU 222 updates the logical to physical address mappings. In some embodiments, the spatial fabric initiates the DMA 660 operations and updates the MMUs 222. By performing the re-allocation of the memory 750, the memory 750 may be moved closer to a corresponding compute 752.

FIG. 59 shows an allocation, re-allocation, and de-allocation of memory in programmable logic device 12. In a diagram 754A, an FMIB 520A dynamically requests memory beyond statically allocated resources 760. In a diagram 754B, the programmable logic device 12 then dynamically allocates memory 762. In some embodiments, the dynamic allocation of the memory 762 is handled by a runtime system that monitors the available memory and manages the allocation, re-allocation, and de-allocation of the memory 762. In some embodiments, the dynamic runtime system is implemented as soft logic in the spatial fabric and/or as hard logic in the spatial fabric (e.g. hard processor system (HPS)). In some embodiments, the dynamic runtime system is implemented on a third die that communicates with the 3D spatial device to provide these runtime services. In some embodiments, the runtime system re-allocates the memory and/or de-allocates the memory. As illustrated in diagram 754C, in a re-allocation, the system may re-allocate the memory 762 to memory 764 as long as used and free memories in the memory pool 122 are tracked. Once the allocated memory 764 has been used and is no longer to be used by the FMIB 520A, the FMIB 520A may de-allocate the memory 764 to free memory 766 as illustrated in diagram 754D.

In some embodiments, the compute 752 and the memory 750 are initially statically allocated, but the compute 752 (rather than the memory 750) is later dynamically allocated, re-allocated, and de-allocated. In some embodiments, moves (re-allocates) 770 of the compute 752 are performed as illustrated in FIG. 60. In some embodiments, the move (re-allocation) 770 of compute is performed using the NOC 100 of the base die 24 (or other memory interconnects). This move 770 of the compute 752 results in the memory 750 being close to the compute 752 to within a threshold distance to improve efficiency of the programmable logic device 12.

FIG. 61 illustrates diagrams 771 of movements of the compute 752. In diagram 771A, an FMIB 520B requests a memory 772. The system dynamically re-allocates the compute 752 to the memory 772 in the diagram 751B.

In some embodiments, the dynamic allocation is handled by the runtime system that monitors the available compute resources and manages the allocation, re-allocation, and de-allocation of the computer resources. In some embodiments, the dynamic runtime system is implemented as soft logic and/or hard logic in the spatial fabric (e.g. HPS). In some embodiments, the dynamic runtime system is implemented on a third die that communicates with the 3D spatial device to provide these runtime services. In some embodiments, the runtime system re-allocates the compute 752 and/or de-allocates the compute 752.

During the diagram 771B, the FMIB 520B is to use a memory 774. The system dynamically re-allocates the compute to the memory 774. Once the operations for the FMIB 520 are completed, the compute 752 may be de-allocated, as illustrated in diagram 771D.

FIG. 62 illustrates a diagram 780 and data flow 782 for a spatial fabric using sector-aligned PR personas F5, F6, F7, and F8 and the memory of the base die 24 for communication between the personas. As also shown, in some embodiments, the communication between the personas is done using FMIBs 520 communicating through the base die 24 using its memory. In some embodiments, the communication is done directly between multiple FMIBs 520 in the fabric die 22 and/or via the NOC 100 of the base die 24.

FIG. 63 illustrates a diagram 784 and data flow 786 for a spatial fabric using the sector-aligned PR personas F5, F6, F7, and F8 with PR personas F1, F3, F4, F5, F6, F7, F8, and F9 stored in the memory of the base die 24. FIG. 64 illustrates a diagram 788 and data flow 790 for a spatial fabric using the sector-aligned PR personas F5, F6, F7, and F8 with PR personas F1, F3, F4, F5, F6, F7, F8, and F9 stored in the memory of the base die 24. Furthermore, in the illustrated diagram 788, the PR persona storage is mixed with user memory storage and interconnects in the base die 24.

As previously noted, the PR personas may be loaded into the fabric to change personas over time. Indeed, multiple copies of the same personas may be loaded into the fabric. FIG. 65 illustrates a diagram 792 and a data flow 794 for a fabric die 22 loaded with a different composition. Specifically, in the illustrated embodiment, four copies of the F4 persona and two copies of the F5 persona are loaded into the fabric die 22. In other words, the spatial fabric allows relocation of the personas to allow one copy of the persona to be copied to multiple locations in the spatial fabric, and computation is dynamically unrolled to match the design for the fabric.

As previously noted, in some embodiments, the spatial fabric allows the relocation of sector-aligned computes. In some embodiments, each sector 48 provides the same interfaces to the base die 24, and the sector-aligned compute personas may align to a region containing multiple sectors. In some embodiments with relocation, the sector-aligned personas may be compiled a single time. Further, the programmable logic fabric 12 may have a large number of possible compositions using the 9 personas. For example, a 3×3 sector spatial fabric with 9 sector-aligned personas may have a number of combinations with repetition equal to 24,310 different compositions. In some embodiments, after the one static compilation, dynamic composition as described previously composes the 9 personas as the system demands. As previously discussed, these personas may be stored in the base die 24. The personas may be precompiled before runtime of the programmable logic device. Additionally or alternatively, a runtime system, as previously discussed, may dynamically compose the personas.

In some situations and as previously noted, the programmable logic device 12 may copy compute and/or memory. As illustrated in FIG. 66, a copy of base memory 800 in a first period 802 is made to create additional copies of the base memory 800 in a second period 804 is performed using the DMA 660 in the base die 24. In some embodiments, a copy of a compute 806 is performed by copying a corresponding persona from a resident copy in the base die 24 to be deployed in the second period 804. In some embodiments, the copy is done without the corresponding persona being stored in the base die 24 by copying the compute 806 directly. Furthermore, relative positions of the copied compute 806 and it respective base memory 800 are maintained through copying. For example, each copy of the compute 806 may be located in a sector 48 adjacent to a sector directly above the respective base memory 800.

Specifically, a compute may be copied to unroll the computation while copying the memory to the base die 24. FIG. 67 illustrates such a copy of a compute 810 from a first period 812 to have multiple copies in a second period 814. Memories 816 are copied to the base die 24 without changing a compute 818 and corresponding memories 820. The copy and unroll of the compute 810 along with copying the memories 816 enable parallelization of the computation 810.

As previously discussed, both computes and memory may be relocated using moving. In addition to performing the moving separately, the computes and memory may be moved in parallel. For instance, FIG. 68 shows a move of a compute 822 and related memory 824 at a first time 826. The move of the 822 and the related memory 824 are relocated at a later time 828. Furthermore, as illustrated, the compute 822 and the related memory 824 may be kept in same relative positions to each other before and after the move. Additionally or alternatively, the relative positions between the compute 822 and the related memory 824 may change during the moving and relocating.

Over time compute and/or memory may become scattered due to the dynamic allocation, re-allocation, and de-allocation in the system resulting in a fragmentation of the spatial computes and/or base memories. As illustrated in FIG. 69, a fragmented fabric 832 may undergo a de-fragmentation to form a de-fragmented fabric 834. As illustrated, the de-fragmentation aligns computes 836 with the respective memories 838 to improve performance, power, and availability of computes 836 and memories 838 for more tasks. In some embodiments, the compute 836 is defragmented independently of the memory 838, the memory 838 is de-fragmented independently of the compute 836, and/or the compute 836 and the memory 838 are de-fragmented simultaneously.

Memory and related computes may be allocated, re-allocated, and/or de-allocated one at-a-time in either order. Additionally or alternatively, the memory and related computes may be allocated, re-allocated, and/or de-allocated simultaneously. For example, FIG. 70 illustrates a simultaneous allocation of a compute 840 and a memory 842 after a compute 844 and a respective memory 846 has previously been allocated. FIG. 71 illustrates a simultaneous de-allocation of the compute 844 and the respective memory 846.

Although much of the foregoing discusses and/or illustrates the fabric of the fabric die 22 vertically above the memory of the base die 24 that is used by the fabric die 22, memory in the memory die 24 that is not vertically below the fabric die 22 may also be used by the fabric. For instance, as illustrated in FIG. 72, vertical memory 900 in the base die 24 below the fabric die 22 may be used by the fabric die 22 using deterministic (e.g., fine or medium aggregations) or via shared usage. Additional memory 902 not vertically below the fabric die 22. This additional memory 902 may be accessed via the NOC of the base die 24.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

APPENDIX

1. A programmable logic device, including:
a fabric die including a programmable fabric; and
a base die that vertically overlaps the fabric die, wherein the base die includes base memory, the programmable fabric and the base memory each include respective portions that have columnar alignment, and a capacity of the base memory and a bandwidth between the fabric die and the base die is selectively allocated to different granularity memory organizations.

2. The programmable logic device of statement 1, wherein the portion of the programmable fabric includes a sector of the programmable fabric, and the portion of the base die includes support circuitry for the sector.

3. The programmable logic device of statement 1, wherein the allocated bandwidth between the base die and the fabric die may provide a latency deterministic direct access between portions of the fabric die and the base die, wherein the latency deterministic direct access includes a logical address space of the programmable fabric being the same as a physical address space of the base memory.

4. The programmable logic device of statement 3, wherein the latency deterministic direct access includes access to different subsets of the portion of the base memory of the base die where at least some of the base memory is inaccessible.

5. The programmable logic device of statement 3, wherein the latency deterministic direct access includes access to different subsets of the portion of the base memory of the base die where the entire base memory of the base die is accessible.

6. The programmable logic device of statement 5, wherein accessing different subsets of the portion of the base memory or accessing the same subsets from different portions of the programmable fabric have different latencies.

7. The programmable logic device of statement 1, wherein allocated bandwidth provides latency non-deterministic access to multiple portions of the base memory.

8. The programmable logic device of statement 7, wherein the non-deterministic access supports virtualized access where logical addresses from the programmable fabric are translated into physical addresses in the base memory.

9. The programmable logic device of statement 1, including a plurality of access ports between the fabric die and the base die, wherein the plurality of access ports include:
   a plurality of widths; or
   a plurality of communication protocols.

10. The programmable logic device of statement 1, including a plurality of access ports between the fabric die and the base die, wherein the plurality of access ports provide exclusive access to the base memory.

11. The programmable logic device of statement 1, wherein transfer of data between the base memory and in-die memory in the fabric die are transferred through inter-die connections without using fabric resources between portions of the programmable fabric.

12. The programmable logic device of statement 11, wherein the inter-die connections include a network on chip of the base die.

13. A method, including:
   allocating a plurality of computes to respective portions of a programmable fabric of a fabric die of a programmable logic device;
   allocating corresponding memory to respective portions of base memory of a base die of the programmable logic device; and
   moving memory in the base memory without involvement of the programmable fabric.

14. The method of statement 13, wherein the portions of the programmable fabric include sectors of the programmable fabric, and the portions of the base memory include support circuitries for the sectors having one or more memory blocks.

15. The method of statement 13, including using the programmable fabric to aggregate capacity of the base memory.

16. The method of statement 15, wherein aggregating capacity includes accessing the portion of the base memory through a single port or accessing multiple portions of the base memory using multiple ports within a portion of the programmable fabric.

17. The method of statement 13, wherein moving the memory in base memory includes using direct memory access operations (DMA) without involvement of the fabric die.

18. The method of statement 17, wherein the DMA operations include copying data to different portions of the base memory, broadcasting copy data to different portions of the base memory, a gather of data from the base memory, a scatter of data to the base memory, or a movement of data with transformation computations using the DMA.

19. A method, including:
   allocating, in a static allocation before run time of a programmable logic device, a compute to a respective portion of a programmable fabric of a fabric die of the programmable logic device;
   assigning, in the static allocation before run time, one or more portions of base memory of a base die of the programmable logic device to the compute via a multi-ported connection between the fabric die and the base die;
   moving memory in the base memory without involvement of the programmable fabric; and
   using a memory management unit of the base die to provide consistency or coherency of the multi-ported connection between the fabric die and the base die.

20. The method of statement 19, including aggregating capacity within the one or more portions of the base memory using the programmable fabric via one or more ports from a respective portion of the programmable fabric.

21. A method, including:
   mapping an implementation of a design in a programmable fabric on a fabric die to a fabric microbump interface of the fabric die;
   mapping the fabric microbump interface to one or more memory arrays in a base die; and
   associating the one or more memory arrays to in-die memory on the fabric die.

22. The method of statement 21, including using the in-die memory to perform memory paging between the one or more memory arrays and the in-die memory.

23. The method of statement 21, including receiving the association received from a user or administrator, received from hardware, or received from software.

24. The method of statement 21, including using the in-die memory to perform a bulk transfer between the one or more memory arrays and the in-die memory.

25. The method of statement 21, wherein mapping the fabric microbump interface to the one or more memory arrays in the base die includes mapping the fabric microbump interface to a respective base microbump interface of the base die.

26. The method of statement 21, wherein the fabric microbump interface includes an offset that provides a virtual starting address for the one or more memory arrays.

27. The method of statement 21, wherein mapping the implementation includes assigning location of the implementation using a compiler.

28. The method of statement 27, wherein the location of the implementation is assigned based on an associated location in the design.

29. The method of statement 27, wherein the location of the implementation is assigned based on an inference from the designs and one or more other designs in the programmable fabric.

30. The method of statement 21, wherein mapping the fabric microbump interface includes mapping a direct access between the fabric microbump interface and the one or more memory arrays based at least in part on a forced direct access between the fabric microbump interface and the one or more memory arrays based on a specified latency in the design.

31. The method of statement 21, including storing the mapping of the fabric microbump interface to the one or more memory arrays in a memory management unit of the base die.

32. The method of statement 31, including translating, in the memory management unit, an address from the fabric microbump interface to the one or more memory arrays.

33. The method of statement 31, wherein storing the mapping in the memory management unit includes storing the mapping in an address translation unit of the memory management unit.

34. The method of statement 33, including translating, in the address translation unit, an address from the fabric microbump interface to the one or more memory arrays.

35. Tangible, non-transitory, and computer-readable media having instructions stored thereon, that when executed by a processor, are configured to cause the processor to:
compile a configuration of a programmable logic device having a fabric die and a base die by:
mapping a plurality of implementations of designs in a programmable fabric on the fabric die to a plurality of fabric microbump interfaces of the fabric die;
mapping the plurality of fabric microbump interfaces to one or more memory arrays in the base die;
mapping the one or more memory arrays to in-die memory on the fabric die; and
storing the configuration in the programmable logic device.

36. The tangible, non-transitory, and computer-readable media of statement 35, wherein the instructions are configured to cause the processor to store offsets in the plurality of fabric microbump interfaces to provide virtual starting addresses for the one or more memory arrays.

37. The tangible, non-transitory, and computer-readable media of statement 36, wherein the offsets support mapping a single fabric microbump interface to multiple of the one or more memory arrays.

38. The tangible, non-transitory, and computer-readable media of statement 35, wherein the instructions are configured to cause the processor to store the mappings of the plurality of fabric microbump interfaces to the one or more memory arrays in a memory management interface of the base die.

39. An electronic device, including:
a fabric die having a programmable fabric;
a base die, including:
plurality of compute accelerators that perform arithmetic operations;
memory;
a direct memory access that:
scatters data to a subset of the memory; and
gathers computed data from the subset of the memory after the arithmetic operations are performed on the data; and
a controller that:
loads weights into the memory to control how the arithmetic operations are computed; and
transmit the gathered computed data.

40. The electronic device of statement 39, wherein the memory is interspersed with the plurality of compute accelerators.

41. The electronic device of statement 39, wherein the base die includes a direct memory access compute, wherein gathering the computed data includes performing computations on the gathered data using the direct memory access compute.

42. The electronic device of statement 39, wherein transmitting the gathered data includes transmitting the data from a base microbump interface of the base die via the controller.

43. A programmable fabric device, including:
a fabric die having a programmable fabric including:
a plurality of partial reconfiguration regions each corresponding to a design for the programmable fabric, wherein the partial reconfiguration regions of the plurality of partial reconfiguration regions are aligned to sectors of the programmable fabric;
a plurality of external sectors outside of the plurality of partial reconfiguration regions; and
fabric resources that couple the external sectors to adjacent sectors of the plurality of the partial reconfiguration regions; and
a base die coupled to the external sectors and that provides interconnection between the external sectors.

44. The programmable fabric device of statement 43, wherein the external sectors enable communications between regions using external paths outside of the plurality of partial reconfiguration regions.

45. The programmable fabric device of statement 44, wherein communications between partial reconfiguration regions of the plurality of partial reconfiguration regions uses at least one of the plurality of external sectors.

46. The programmable fabric device of statement 43, wherein communications between partial reconfiguration regions of the plurality of partial reconfiguration regions uses a network on chip of the base die.

47. The programmable fabric device of statement 43, wherein background partial reconfiguration personas for the plurality of partial reconfiguration region are stored in the base die.

48. The programmable fabric device of statement 43, wherein the plurality of partial reconfiguration regions are reconfigured using a configuration write.

49. The programmable fabric device of statement 43, wherein the programmable fabric includes static routes within a partial reconfiguration region of the plurality of partial reconfiguration regions.

50. The programmable fabric device of statement 43, wherein communications between the plurality of partial reconfiguration regions uses a soft logic network on chip in the fabric die or a hardened network-on-chip in the fabric die.

51. The programmable fabric device of statement 50, wherein the soft logic network on chip is tolerant of disappearing sections during a partial reconfiguration of the programmable fabric.

52. The programmable fabric of statement 43, wherein communications between the plurality of partial reconfiguration regions utilizes connections between a fabric microbump interface of the fabric die and a base microbump interface of the base die.

53. A method, including:
loading a plurality of partial reconfiguration personas into a programmable fabric of a fabric die of programmable logic device, wherein the plurality of partial reconfiguration personas are aligned to sectors of the programmable fabric;
loading a background partial reconfiguration persona into a base die of the programmable logic device while performing operations using the plurality of partial reconfiguration personas; and
loading the background partial reconfiguration persona into the programmable fabric from the base die.

54. The method of statement 53, wherein loading the background partial reconfiguration persona includes loading the background partial reconfiguration persona into the programmable fabric using a base microbump interface of the base die.

55. The method of statement 54, wherein loading the background partial reconfiguration persona includes loading the background from base microbump interface of the base die via a fabric microbump interface of the fabric die.

56. The method of statement 53, wherein communications between a plurality of partial reconfiguration regions loaded with the plurality of partial reconfiguration personas includes pathways around the loaded plurality of partial reconfiguration regions.

57. The method of statement 56, wherein the pathways include connections through the base die.

58. The method of statement 57, wherein the connections through the base die include a network on chip of the base die.

59. A programmable fabric device, including:
a programmable fabric die having a programmable fabric of programmable elements that is sequentially configured using a sequence of partial reconfiguration personas that control how the programmable elements are programmed for one or more portions of the programmable fabric; and
a base die having one or more memory blocks that store a first subset of the partial reconfiguration personas for loading into the fabric die at a future time while a second subset of the partial reconfiguration personas are used to perform an operation in the programmable fabric.

60. The programmable fabric device of statement 59, wherein the sequence includes a static sequence of the partial reconfiguration personas.

61. The programmable fabric device of statement 59, wherein the partial reconfiguration personas are alighted to sectors of the programmable fabric.

62. The programmable fabric device of statement 59, wherein the sequence of the partial reconfiguration personas includes at least one of the partial reconfiguration personas occurring more than once in the sequence.

63. A method, including:
allocating a compute to a portion of a programmable fabric of a fabric die of a programmable logic device;
allocating a first portion of memory in a base die to the compute; and
moving the allocation of the first portion of the memory to a second portion of the memory of the base die, wherein the second portion is closer to the compute in the fabric die than the first portion.

64. The method of statement 63, wherein the portion of the programmable fabric of the fabric die includes a sector of the programmable fabric.

65. The method of statement 63, wherein the second portion of the memory includes support circuitry in the base die.

66. The method of statement 65, wherein the second portion of the support circuitry in the base die located directly beneath the relevant compute portion of the programmable fabric.

67. The method of statement 63, including receiving a request from software, firmware, a fabric microbump interface, or soft logic for memory beyond statically allocated resources.

68. The method of statement 67, including, in response to receiving the request, allocating a third portion of the memory in the base die to the fabric microbump interface.

69. The method of statement 68, wherein a runtime system of the programmable logic device receives the request and allocates the third portion of the memory.

70. The method of statement 69, wherein the runtime system is located on a third die of the programmable logic device.

71. The method of statement 63, including tracking used and free memories in a memory pool of the base die.

72. The method of statement 71, including determining that a third portion of the memory is no longer being used by a corresponding fabric microbump interface.

73. The method of statement 72, including, response to the determination that the third portion of the memory is no longer being used, de-allocate the memory to free memory for other computes.

74. A programmable logic device, including:
a fabric die having a programmable fabric, wherein a compute is allocated to a first portion of the programmable fabric that performs operations in the programmable fabric using programmable elements of the programmable fabric;
a base die located below the fabric die and having base memory with a portion of the base memory allocated to the compute; and
a third die executing a run-time system management that moves the allocation of the compute from the first portion to a second portion of the programmable fabric based at least in part on the second portion of the programmable fabric being closer to the portion of the base memory than the first portion of the programmable fabric.

75. The programmable logic device of statement 74, wherein the first portion of the programmable fabric includes a first sector, and the second portion of the programmable fabric includes a second sector.

76. The programmable logic device of statement 74, wherein the third die receiving a request from a fabric microbump interface for memory beyond statically allocated resources.

77. The programmable logic device of statement 76, wherein the third die, in response to receiving the request, allocates a second portion of the memory in the base die to the fabric microbump interface.

78. The programmable logic device of statement 77, wherein the third die tracks used and free portions of the memory in the base die.

79. The programmable logic device of statement 78, wherein the third die:
determines that a third portion of the memory is no longer being used by a corresponding fabric microbump interface; and
de-allocates a compute associated with the fabric microbump interface.

80. A method, including:
allocating a compute to a first portion of a programmable fabric of a fabric die of a programmable logic device;
allocating a base memory of a base die of the programmable logic device to the compute;
copying the compute to a second portion of the programmable fabric; and
copying the base memory to a copy base memory of the base die that is closer to the second portion of the programmable fabric.

81. The method of statement 80, wherein copying the compute to maintain a relative position between the base memory and the compute for the copy base memory and the second portion after the copy.

82. The method of statement 80, wherein copying the compute to the second portion includes copying a corresponding persona from a resident copy in the base die.

What is claimed is:
1. A programmable fabric device, comprising:
a fabric die having a programmable fabric comprising:
a plurality of partial reconfiguration regions each corresponding to a design for the programmable fabric, wherein the partial reconfiguration regions of the plurality of partial reconfiguration regions are aligned to sectors of the programmable fabric;
a plurality of external sectors outside of the plurality of partial reconfiguration regions; and
fabric resources that couple the external sectors to adjacent sectors of the plurality of the partial reconfiguration regions; and
a base die coupled to the external sectors and that provides interconnection between the external sectors.

2. The programmable fabric device of claim 1, wherein the external sectors enable communications between regions using external paths outside of the plurality of partial reconfiguration regions.

3. The programmable fabric device of claim 2, wherein communications between partial reconfiguration regions of the plurality of partial reconfiguration regions uses at least one of the plurality of external sectors.

4. The programmable fabric device of claim 1, wherein communications between partial reconfiguration regions of the plurality of partial reconfiguration regions uses a network on chip of the base die.

5. The programmable fabric device of claim 1, wherein background partial reconfiguration is for the plurality of partial reconfiguration region are stored in the base die.

6. The programmable fabric device of claim 1, wherein the plurality of partial reconfiguration regions are reconfigured using a configuration write.

7. The programmable fabric device of claim 1, wherein the programmable fabric comprises static routes within a partial reconfiguration region of the plurality of partial reconfiguration regions.

8. The programmable fabric device of claim 1, wherein communications between the plurality of partial reconfiguration regions uses a soft logic network on chip in the fabric die or a hardened network-on-chip in the fabric die.

9. The programmable fabric device of claim 8, wherein the soft logic network on chip is tolerant of disappearing sections during a partial reconfiguration of the programmable fabric.

10. The programmable fabric of claim 1, wherein communications between the plurality of partial reconfiguration regions utilizes connections between a fabric microbump interface of the fabric die and a base microbump interface of the base die.

11. A method, comprising:
loading a plurality of partial reconfiguration personas into a programmable fabric of a fabric die of programmable logic device, wherein the plurality of partial reconfiguration personas are aligned to sectors of the programmable fabric;
loading a background partial reconfiguration persona into a base die of the programmable logic device while performing operations using the plurality of partial reconfiguration personas; and
loading the background partial reconfiguration persona into the programmable fabric from the base die.

12. The method of claim 11, wherein loading the background partial reconfiguration persona comprises loading the background partial reconfiguration persona into the programmable fabric using a base microbump interface of the base die.

13. The method of claim 12, wherein loading the background partial reconfiguration persona comprises loading the background from base microbump interface of the base die via a fabric microbump interface of the fabric die.

14. The method of claim 11, wherein communications between a plurality of partial reconfiguration regions loaded with the plurality of partial reconfiguration personas comprises pathways around the loaded plurality of partial reconfiguration regions.

15. The method of claim 14, wherein the pathways comprise connections through the base die.

16. The method of claim 15, wherein the connections through the base die comprise a network on chip of the base die.

17. A programmable fabric device, comprising:
a programmable fabric die having a programmable fabric of programmable elements that is sequentially configured using a sequence of partial reconfiguration personas that control how the programmable elements are programmed for one or more portions of the programmable fabric, wherein the fabric die comprises:
a plurality of partial reconfiguration regions each corresponding one or more partial reconfiguration personas;
a plurality of external sectors outside of the plurality of partial reconfiguration regions; and
fabric resources that couple the plurality external sectors to the plurality of partial reconfiguration regions; and
a base die having one or more memory blocks that store a first subset of the partial reconfiguration personas for loading into the fabric die at a future time while a second subset of the partial reconfiguration personas are used to perform an operation in the programmable fabric, wherein the base die is coupled to and provides interconnection to the plurality of external sectors.

18. The programmable fabric device of claim 17, wherein the sequence comprises a static sequence of the partial reconfiguration personas.

19. The programmable fabric device of claim 17, wherein the partial reconfiguration personas are aligned to sectors of the programmable fabric.

20. The programmable fabric device of claim 17, wherein the sequence of the partial reconfiguration personas comprises at least one of the partial reconfiguration personas occurring more than once in the sequence.

* * * * *